United States Patent
Salazar Cerreno et al.

(10) Patent No.: US 11,796,580 B2
(45) Date of Patent: Oct. 24, 2023

(54) APPARATUS AND METHOD(S) FOR WET RADOME CHARACTERIZATION AND RADAR CALIBRATION

(71) Applicant: The Board of Regents of the University of Oklahoma, Norman, OK (US)

(72) Inventors: Jorge Luis Salazar Cerreno, Norman, OK (US); Alessio Mancini, Norman, OK (US); Boon Leng Cheong, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 987 days.

(21) Appl. No.: 16/606,973

(22) PCT Filed: Apr. 23, 2018

(86) PCT No.: PCT/US2018/028905
§ 371 (c)(1),
(2) Date: Oct. 21, 2019

(87) PCT Pub. No.: WO2018/195542
PCT Pub. Date: Oct. 25, 2018

(65) Prior Publication Data
US 2020/0049751 A1    Feb. 13, 2020

Related U.S. Application Data

(60) Provisional application No. 62/488,301, filed on Apr. 21, 2017.

(51) Int. Cl.
*G01R 29/10*    (2006.01)
*G01S 7/40*    (2006.01)
(Continued)

(52) U.S. Cl.
CPC ......... *G01R 29/10* (2013.01); *G01R 29/0878* (2013.01); *G01S 7/40* (2013.01);
(Continued)

(58) Field of Classification Search
CPC .......... G01S 7/40; G01S 7/4008; H01Q 1/421
(Continued)

(56) References Cited

U.S. PATENT DOCUMENTS 4,161,731 A    7/1979  Barr
6,088,001 A    7/2000  Burger et al.
(Continued)

FOREIGN PATENT DOCUMENTS

WO    WO 2016/174659    11/2016

OTHER PUBLICATIONS

Chan Kevin K M et al, "Material Characterization of Arbitrarily Shaped Dielectrics Based on Reflected Pulse Characteristics", IEEE Transactions on Microwave Theory and Techniques, Plenum, USA, vol. 63, No. 5, May 1, 2015 (May 1, 2015), pp. 1700-1709.
(Continued)

*Primary Examiner* — Bo Fan
(74) *Attorney, Agent, or Firm* — DUNLAP CODDING, P.C.

(57) ABSTRACT

A probe is described. The probe includes a probe antenna, a transmitter, a receiver and circuitry including hardware. The probe antenna is constructed of a dielectric material connected to a waveguide, the probe antenna has a far field region. The transmitter is coupled to the probe antenna. The receiver is coupled to the probe antenna. The hardware is configured to communicate with the transmitter to enable the transmitter to direct a pulse of electromagnetic energy to the probe antenna and to receive a reflection signal from the receiver, the hardware is configured to determine a material
(Continued)

property of a material within the far-field region of the probe antenna by analyzing the reflection signal.

16 Claims, 47 Drawing Sheets

(51) Int. Cl.
    *H01Q 1/42*    (2006.01)
    *G01R 29/08*    (2006.01)

(52) U.S. Cl.
    CPC ........... *G01S 7/4008* (2013.01); *H01Q 1/421* (2013.01); *H01Q 1/422* (2013.01)

(58) Field of Classification Search
    USPC .................... 342/54, 173, 174, 175; 343/762
    See application file for complete search history.

(56) References Cited

U.S. PATENT DOCUMENTS

| | | | |
|---|---|---|---|
| 6,686,872 B2 | 2/2004 | Vacanti | |
| 7,342,532 B1 | 3/2008 | Matsuoka | |
| 7,858,910 B2* | 12/2010 | Williams | ................ G01S 17/90 342/134 |
| 2003/0063014 A1 | 4/2003 | Stolarczyk | |
| 2004/0150550 A1 | 8/2004 | Shouno et al. | |
| 2005/0017894 A1* | 1/2005 | Fullerton | ............. H04B 14/026 342/175 |
| 2007/0007966 A1 | 1/2007 | Meyer | |
| 2007/0040727 A1 | 2/2007 | Matsuoka | |
| 2007/0247352 A1 | 10/2007 | Michael et al. | |
| 2009/0277630 A1 | 11/2009 | McDaniel et al. | |
| 2012/0249357 A1* | 10/2012 | Stratis | ...................... H01Q 1/42 342/54 |
| 2012/0249358 A1* | 10/2012 | Stratis | .................... H01Q 1/281 342/174 |
| 2014/0057576 A1* | 2/2014 | Monte | .................... H01Q 1/125 343/762 |
| 2016/0223669 A1 | 8/2016 | Assefzadeh et al. | |
| 2017/0018851 A1* | 1/2017 | Henry | ................... H01Q 19/08 |

OTHER PUBLICATIONS

European Patent Office, European Extended Search Report regarding EP App. No. 18788391.3 dated Jan. 11, 2021.
International Search Report and Written Opinion PCT/US2018/028905 dated Jul. 6, 2018, 15 pages.

* cited by examiner

APPARATUS AND METHOD(S) FOR WET RADOME CHARACTERIZATION AND RADAR CALIBRATION

CROSS REFERENCE TO RELATED APPLICATIONS/INCORPORATION BY REFERENCE STATEMENT

The present patent application claims priority under 37 CFR § 119(e) to United States Provisional patent application U.S. Ser. No. 62/488,301, filed on Apr. 21, 2017, the entire contents of which are hereby expressly incorporated herein by reference.

STATEMENT REGARDING FEDERALLY FUNDED RESEARCH AND DEVELOPMENT

Not Applicable.

FIELD OF THE INVENTIVE CONCEPT(S)

In one non-limiting embodiment, the present disclosure relates to novel instrumentation to characterize the effect of wet radomes in radar systems. Full characterization of radome(s) performance under a variety of conditions including, without limitation, conditions related to cleanliness, dirtiness, wetness, frequency, and temperature variations of the radome(s) is contemplated herein, as is apparatus and methodologies for wet radome(s) characterization. In one non-limiting embodiment, the present disclosure describes the use of low-profile instrumentation that can be easily integrated into existing or new radar systems. In one non-limiting embodiment, a low profile dielectric antenna(e) connected to a reflectometer(s) employs time domain gating (TDG) analysis to analyze and characterize one or more material properties of the radome. The time domain gating analysis is used to minimize the impact of undesirable reflections associated with the radome(s).

In one non-limiting embodiment, an indirect estimation of the transmission coefficient on the radome's(s') surface(s) is calculated via utilization of reflection measurements at the air-radome(s) interface. In one aspect, TDG analysis is used as an extremely useful tool to improve collected data purity by mitigating and/or eliminating data indicative of unwanted reflections produced from the environment surrounding the radome(s).

BACKGROUND

In the past, researchers have attempted to address induced errors in polarimetric parameters of a radar system resulting from wet radomes. For example, the selection of a super-hydrophobic material to coat the external radome skin has been shown to minimize the impact of a continuous water film over the surface of the radome. While this solution significantly improves radar performance when operating at high rain rates, it is demonstrated that agents such as pollution and time degradation decrease the radome performance, especially in the presence of water. (B. Blevis, "Losses Due to Rain on Radomes and Antenna Reflecting Surfaces," IEEE Trans. Antennas Propag., Vol. 13, pp. 175-176, 1965; and C. E. Hendrix, J. E. McNally, and R. A. Monzingo, "Depolarization and Attenuation Effects of Radomes at 20 Ghz," *IEEE Trans. Antennas Propag.*, Vol. 37, pp. 320-328, 1989). Blevis took into account the effect introduced by water on the radome by performing studies in which water was considered as a film. However, it is not accurate to consider water as a film since it is non-uniform and is distributed in droplets or rivulets.

Other studies have considered the impacts on the radome of artificial rain. (Hendrix et al., supra; M. Kurri and A. Huuskonen, "Measurements of Transmission Loss of a Radome at Different Rain Intensities," *J. Atmos. Oceanic Technol.*, Vol. 25, pp. 1590-1599, 2008; M. Frech, B. Lange, T. Mammen, J. Seltmann, C. Morehead, and J. Rowan, "Influence of a Radome on Antenna Performance," *J. Atmos. Oceanic Technol.*, Vol. 30, pp. 313-324, 2013; and S. J. Frasier, F. Kabeche, J. F. I. Ventura, H. Al-Sakka, P. Tabary, J. Beck, and O. Bousquet, "In-Place Estimation of Wet Radome Attenuation at X Band," *J. Atmos. Oceanic Technol.*, Vol. 30, pp. 917-928, 2013). Previously, Salazar developed an analytical model based on the drop size distribution (DSD) of rainfall to estimate the electrical performance of the wet radome for a dual-polarized phased-array antenna, which was subsequently validated through numerical simulation and experimental data comparisons from the Weather Surveillance Radar-1988 (WSR-88D) and the Collaborative Adaptive Sensing of the Atmosphere (CASA) radar. (J. L. Salazar-Cerreno, V. Chandrasekar, J. M. Trabal, P. Siquera, R. Medina, E. Knapp, and D. J. McLaughlin, "A Drop Size Distribution (DSD)-Based Model for Evaluating the Performance of Wet Radome for Dual-Polarized Radars," *J. Atmos. Oceanic Technol.*, Vol. 31, pp. 2409-2430, 2014). In addition, previous studies have been performed related to the scattering properties of a radome based on its skin surface material, including investigations related to super hydrophobic surfaces, area and inclination of the dome, and rainfall rate. (J. D'iaz, J. L. Salazar, A. Mancini, and J. G. Colom, "Radome Design and Experimental Characterization of Scattering and Propagation Properties for Atmospheric Radar Applications." Amer. Meteor. Soc., 2014, pp. 819-823). D'iaz's study provided additional validation of the drop size distribution model proposed in Salazar-Cerreno, supra.

Previously, Bechini has presented a method for evaluating the attenuation under wet conditions for radars operating at X-band. (R. Bechini, V. Chandrasekar, R. Cremonini, and S. Lim, "Radome Attenuation at X-Band Radar Operations," in *Proc. Sixth European Conf on Radar in Meteorology and Hydrology*. Sibiu, Romania: ERAD 2010, 2010, p. 15.1). The correction based on the disdrometer data is complex because Bechini's study is predicated on the erroneous assumption that water is a film, which does not account for rivulet effects or wind presence on the exposed side of the radome that could produce different attenuation levels on different areas of the radome.

A technique based on a differential reflectivity (ZDR) measurement has been developed to perform real-time adjustments on a wet radome. (E. Gorgucci, R. Bechini, L. Baldini, R. Cremonini, and V. Chandrasekar, "The Influence of Antenna Radome on Weather Radar Calibration and its Real-Time Assessment," *J. Atmos. Oceanic Technol.*, vol. 30, pp. 676-689, 2012). Gorgucci's ZDR calibrations employ two different techniques—sun and weather target calibrations. Results obtained by Gorgucci's two different methods showed only a 0.06 dB difference for the ZDR bias, confirming the validity of his calibration techniques. It has also been shown that radome attenuation has a significant impact on measurements. (M. Schneebeli, J. Sakuragi, T. Biscaro, C. F. Angelis, I. C. da Costa, C. Morales, L. Baldini, and L. A. T. Machado, "Polarimetric X-Band Weather Radar Measurements in the Tropics: Radome and Rain Attenuation Correction," *Atmos. Meas. Tech.*, vol. 5, pp. 2183-2199, 2012). Schneebeli employed a self-consistent algorithm to estimate the reflectivity offset introduced by the presence of the radome. Using the extended Kalman filter (EKF) algorithm and a standard rain attenuation correction scheme (ZPHI), Schneebeli corrected the X-band radar measurements for both attenuation and differential attenuation. In particular, it was found that the ZPHI algorithm showed the smallest bias and standard deviation, while the EKF technique was better for the correction of differential reflectivity. In their respective studies, however, Gorgucci and Schneebeli both assume a perfect radome, without taking into account imperfections in radome fabrication which can influence water distribution over the surface.

A common technique to characterize radomes is to measure the free-space transmission coefficient. Using this method, however, results in a number of disadvantages, including, without limitation, perfect probe alignment is difficult to achieve, tests are limited to conformal radomes, the setup is bulky and limits its application to laboratory tests only, and, if the sample is too small with respect the antenna beam, the two probes interact.

With the introduction of dual-polarization systems in operational radar networks, a target accuracy for ZDR of 0.1 dB and 1 dB for Zh is required. (Wang, Y., and V. Chandrasekar, "Polarization Isolation Requirements for Linear Dual-Polarization Weather Radar in Simultaneous Transmission Mode of Operation," IEEE Transactions on Geoscience and Remote Sensing, 44, pp. 2019-2028, 2006). To achieve this goal, all sources of bias must be taken into account. One of these sources is the radome. In the past, several researchers have addressed induced errors in polarimetric parameters of a radar system due to wet radomes. (Wang et al., supra; and Frech, M., "The Effect of a Wet Radome on Dualpol Data Quality," 34th Conf. on Radar Meteorology, Williamsburg, Va., Amer. Meteor. Soc., P13.15). The present disclosure highlight some of the important considerations that must be accounted for in order to minimize the impact of wet radomes on the performance of radar systems. For example, the selection of a super-hydrophobic material for the external radome skin minimizes the impact of a continuous water film over the surface. This solution significantly improves radar performance when operating at high rain rates. However, as previously mentioned, it has been demonstrated that agents such as pollution and time degradation decrease the radome performance, especially in the presence of water. (Blevis, supra; Anderson, I., "Measurements of 20-Ghz Transmission Through a Radome in Rain," IEEE Trans. Antennas Propag., 23, pp. 619-622, 1975; Hendrix et al., supra; Chang, K.-C., "System Performance in Rain in a Radome-Enclosed Environment," IEEE Military Communications Conference: MILCOM '85, 1, pp. 293-299, 1985; and Fenn, A. J., "Measurements of Wet Radome Transmission Loss and Depolarization Effects in Simulated Rain at 20 Ghz, pp. 474-477, 1997).

Thompson and Illingworth previously presented a technique to measure the total attenuation from the radome. (Thompson, R., and A. Illingworth, "Correcting Attenuation in Operational Radars from Both Heavy Rain and the Radome Using the Observed Microwave Emission," 7th European Conference on Radar in Meteorology and Hydrology, Toulouse, France, Meteo France, p. 8A.5). They showed that old radomes can produce 2-3 dB of attenuation when the rain rate is 2-3 mm/hr. In addition, Diaz et al. previously performed a study on the scattering properties of the radome based on its skin surface material, wherein investigations related to super hydrophobic surfaces, area, inclination, and rainfall rate were conducted. (Diaz, J., J. L. Salazar, A. Mancini, and J. G. Colom, "Radome Design and Experimental Characterization of Scattering and Propagation Properties for Atmospheric Radar Applications," Amer. Meteor. Soc., pp. 819-823). Diaz's study provided additional validation of the drop size distribution model proposed by Salazar-Cerreno et al. (Salazar-Cerreno et al., supra). Manz previously performed a study evaluating effects resulting from the distribution of joints in the radome. (Manz, A., L. Handwerker, M. Lo¨ffler-Mang, R. Hannesen, and H. Gysi, "Radome Influence on Weather Radar Systems Principles and Calibration Issues," 29th Int. Conf. on Radar Meteorology, Montreal, Quebec, Canada, Amer. Meteor. Soc., pp. 918-921). Manz's work suggests the installation of a device to test the transmitted signal and measure the changes in radome attenuation as a possible solution for wet radome calibration.

Another method has previously been implemented by Frasier who employed two radars to achieve absolute calibration. (Frasier, S. J., F. Kabeche, J. F. I. Ventura, H. Al-Sakka, P. Tabary, J. Beck, and O. Bousquet, "In-Place Estimation of Wet Radome Attenuation at X Band," J. Atmos. Oceanic Technol., 30, pp. 917-928, 2013). A possible limitation of using two radars is that the different scan patterns produce a temporal mismatch which results in additional scattering. In addition, it is not always easy to obtain the use of two radars to look at the same volume target.

Mancini et al. previously developed an analytical model to evaluate the level of absorption through a slab of water of different thicknesses in which numerical simulations performed in Ansys HFSS confirmed the validity of the analytical model and showed that absorption is not negligible. (Mancini, A., J. L. Salazar, R. M. Lebro'n, and B. L. Cheong, "A Novel Measurement Instrument for Operational Assessment of Attenuation of Radome Including its Outer Surface: Part I—the Concept," J. Atmos. Oceanic Technol., 2, p. 2, 2017).

SUMMARY

Accordingly, there is a need for a practical solution for improving radar data accuracy, such as dual polarization radar. Such solution comprises characterizing, in real time, the effects of the radome caused by imperfections in the fabrication process, by external agents such as rain, snow, ice, pollution, or dirt, or by deterioration of the radome over time, as well as apparatus and methodologies related to such characterization. It is to such apparatus and methodologies that the present disclosure is directed.

In certain embodiments, an apparatus is disclosed. The apparatus is provided with a radome, a probe positioned within the radome and a moving guide connected to at least a portion of the probe for moving the probe within the radome. The radome has an inner surface defining a space sized and adapted to receive a radar antenna. The probe is positioned within the space defined by the inner surface of the radome. The probe is provided with a probe antenna, a transmitter coupled to the probe antenna, a receiver coupled to the probe antenna, and a processor. The probe antenna is constructed of a dielectric material connected to a waveguide. The probe antenna has a far field region. The processor is configured to enable the transmitter to direct a pulse of electromagnetic energy to the probe antenna at first instants of time whereby the dielectric material of the probe antenna emits at least a portion of the pulse of electromagnetic energy in the far-field region of the probe antenna, and to enable the receiver to receive a reflection signal from the probe antenna at second instants of time following the first instants of time using time domain gating in which the receiver is only enabled to receive the signal from the probe antenna during the second instants of time. The processor is configured to determine a material property of the radome within the far-field region of the probe antenna by analyzing the reflection signal. The moving guide is connected to the probe antenna and is configured to guide the probe antenna through a path within the space defined by the radome such that the probe antenna is spaced a distance from the radome and the radome is within the far field region of the probe antenna as the moving guide guides the probe antenna through the path.

In some embodiments, the moving guide further comprises a pedestal and a radar antenna movably supported by the pedestal, the radar antenna of the moving guide being connected to the probe antenna. The radar antenna may include an antenna feed, and the antenna feed may be connected to and support the probe antenna. The antenna feed may include an electromagnetic shadow region, and the probe antenna may be located within the electromagnetic shadow region of the antenna feed. In other embodiments, the moving guide may include one or more motors or a robotic arm to guide the probe antenna to maintain the radome within the far-field region of the probe antenna. In some embodiments, the moving guide is configured to maintain the probe antenna substantially equidistant from the radome as the moving guide moves the probe antenna through the path. For example, when the moving guide includes the pedastal and radar antenna, the radome may be concentrically disposed with respect to the pedastal such that the probe antenna remains substantially equidistant from the radome as the probe antenna is moved through a circular path.

Various material properties of the radome can be determined by analyzing the reflection signals. For instance, the transmittance of a radar signal through the radome can be determined by analyzing the reflection signals.

In one embodiment, the transmitter, the receiver and the processor are components of a reflectometer.

As further described and/or claimed herein, the apparatus disclosed and/or claimed herein rely on a reflection coefficient measurement rather than a transmission coefficient measurement. In addition, by applying time domain gating (TDG) analysis, the effects of unwanted reflections coming from the surrounding environment are reduced. In one non-limiting embodiment, the present disclosure describes the use of a reflectometer to measure reflections generated at the air-radome interface; a TDG algorithm(s) (implemented, for instance, by way of example only, in the reflectometer); and a dielectric rod antenna employed as a probe antenna. The present disclosure makes it possible to perform real-time corrections for radome attenuation and the radome(s) may be mapped with high-resolution measurements, taking into account the effects introduced by raindrops accumulated on the surface, as well as the scatterer points that are due to imperfections, including those caused by structural joints in the radome.

In one non-limiting embodiment, the present disclosure provides for apparatus and methodologies to characterize a radome under wet conditions. In one non-limiting embodiment, the present disclosure provides apparatus and methodologies for evaluating the effects to a radome caused either by precipitation or due to imperfections introduced by the fabrication process. Accordingly, via utilization of the present disclosure, it is possible to characterize wet radome effects, thereby improving radar data accuracy. The present disclosure utilizes, in one non-limiting embodiment, a reflection coefficient measurement. By applying time domain gating (TDG) analysis, the effects of unwanted reflections coming from the surrounding environment are reduced. The present disclosure makes it is possible to perform real-time correction for radome attenuation due to wet conditions. During wet conditions, the radome may be mapped with high-resolution measurements as described above.

BRIEF DESCRIPTION OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing. The embodiments depicted in the drawings are not intended to be limiting in regard to the present disclosure.

FIGS. 25A-25C show results for one side of the radome while FIGS. 25D-25F show results for the other side of the radome.

FIGS. 26A-26C show results for one side of the radome while FIGS. 26D-26F show results for the other side of the radome.

FIGS. 27A-27C show results for one side of the radome while FIGS. 27D-27F show results for the other side of the radome.

FIGS. 28A-28C show results for one side of the radome while FIGS. 28D-28F show results for the other side of the radome.

FIGS. 31A-31C show results for the B-side of the radome while FIGS. 31D-31F show results for the A-side of the radome.

FIGS. 32A-32C show results for the B-side of the radome while FIGS. 32D-32F show results for the A-side of the radome.

FIGS. 34A-34C show results for the B-side of the radome while FIGS. 34D-34F show results for the A-side of the radome.

FIGS. 35A-35C show results for the B-side of the radome while FIGS. 35D-35F show results for the A-side of the radome.

DETAILED DESCRIPTION

Figure 1A:
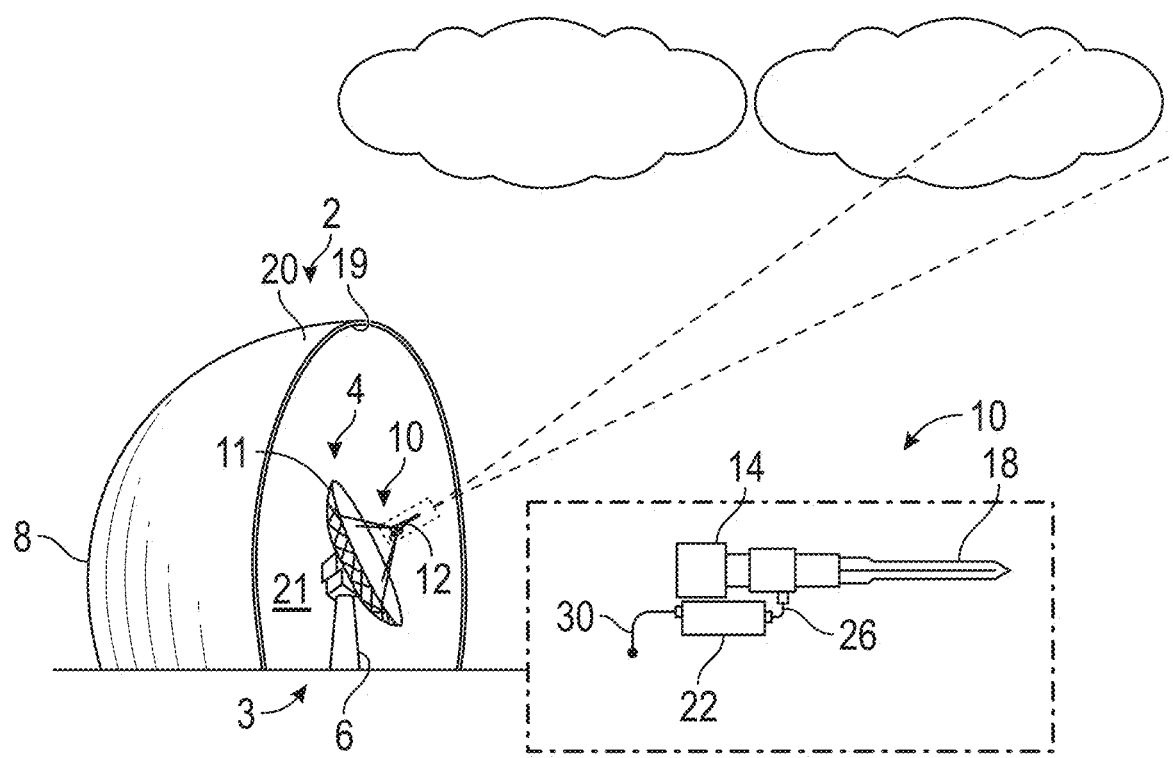
FIG. 1A shows a schematic of a non-limiting embodiment of an operational radar system utilized to fully characterize a radome in accordance with the present disclosure.

Before explaining at least one embodiment of the presently disclosed concepts in detail, it is to be understood that the disclosure is not limited in its application to the details of construction, experiments, exemplary data, and/or the arrangement of the components set forth in the following description or illustrated in the drawings unless otherwise noted.

The disclosure is capable of other embodiments or of being practiced or carried out in various ways. As such, the language used herein is intended to be given the broadest possible scope and meaning, and the embodiments are meant to be exemplary—not exhaustive. Also, it is to be understood that the phraseology and terminology employed herein is for purposes of description, and should not be regarded as limiting unless otherwise indicated as so. Moreover, in the following detailed description, numerous specific details are set forth in order to provide a more thorough understanding of the disclosure. However, it will be apparent to a person having ordinary skill in the art that various embodiments of the present disclosure may be practiced without these specific details. In other instances, features which are well known to persons of ordinary skill in the art have not been described in detail to avoid unnecessary complication of the description.

All patents, published patent applications, and non-patent publications mentioned in the specification are indicative of the level of skill of those of ordinary skill in the art to which the present disclosure pertains. All patents, and published patent applications, referenced in any portion of this application are herein expressly incorporated by reference in their entirety to the same extent as if each individual patent or publication was specifically and individually indicated to be incorporated by reference.

All of the devices and methods disclosed herein can be made and executed without undue experimentation in light of the present disclosure. While the devices and methods of the present disclosure have been described in terms of particular embodiments, it will be apparent to those of skill in the art that variations may be applied to the devices and/or methods and in the steps or in the sequence of steps of the method described herein without departing from the concept, spirit, and scope of the inventive concepts. All such similar substitutes and modifications apparent to those of ordinary skill in the art are deemed to be within the spirit and scope of the inventive concepts as disclosed herein.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example. Reference to an integer with more (greater) or less than includes any number greater or less than the reference number, respectively. Thus, for example, reference to less than 100 includes 99, 98, 97, etc. all the way down to the number one (1); and less than 10 includes 9, 8, 7, etc. all the way down to the number one (1).

As used in this specification, the words "comprising" (and any form of comprising, such as "comprise" and "comprises"), "having" (and any form of having, such as "have"

and "has"), "including" (and any form of including, such as "includes" and "include") or "containing" (and any form of containing, such as "contains" and "contain") are inclusive or open-ended and do not exclude additional, unrecited elements or method steps. For example, unless otherwise noted, a process, method, article, or apparatus that comprises a list of elements is not necessarily limited to only those elements but may also include other elements not expressly listed or inherent to such process, method, article, or apparatus.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more items or terms, such as BB, AAA, AAB, BBC, AAABCCCC, CBBAAA, CABABB, and so forth. One of ordinary skill in the art will understand that typically there is no limit on the number of items or terms in any combination, unless otherwise apparent from the context.

As used herein, any reference to "one embodiment," "an embodiment," "some embodiments," "one example," "for example," or "an example" means that a particular element, feature, structure, or characteristic described in connection with the embodiment is included in at least one embodiment and may be included in other embodiments. The appearance of the phrase "in some embodiments" or "one example" in various places in the specification is not necessarily all referring to the same embodiment, for example, and are not necessarily limited to a single or particular embodiment. In addition, the use of the terms "one embodiment" and "an embodiment" are not to be construed as limiting in any matter of the scope of the present disclosure; unless indicated otherwise, all references to "embodiment(s)" and "example(s)" will be understood to mean "non-limiting embodiment(s)" and "non-limiting example(s)."

Throughout this application, the term "about" is used to indicate that a value includes the inherent variation of error for the compositions and/or methods of the present disclosure. As used herein, the qualifiers "about" or "approximately" are intended to include not only the exact value, amount, degree, orientation, or other qualified characteristic or value, but are intended to include some slight variations due to measuring error, manufacturing tolerances, stress exerted on various parts or components, observer error, wear and tear, and combinations thereof, for example. The term "about," where used herein when referring to a measurable value such as an amount, a temporal duration, and the like, is meant to encompass variations of ±20%, or ±10%, or ±5%, or ±1%, or ±0.1% from the specified value, as such variations are appropriate to perform the disclosed methods and as understood by persons having ordinary skill in the art. Throughout this application, the term "about" is used to indicate that a value includes the inherent variation of error for measuring various parameters. Further, in this detailed description and the appended claims, each numerical value (e.g., temperature or time) should be read once as modified by the term "about" (unless already expressly so modified), and then read again as not so modified unless otherwise indicated in context. Also, any range listed or described herein is intended to include, implicitly or explicitly, any number within the range, particularly all integers, including the end points, and is to be considered as having been so stated. For example, "a range of from 1 to 10" is to be read as indicating each possible number, particularly (but not by way of limitation) integers, along the continuum between about 1 and about 10. Thus, even if specific data points within the range, or even no data points within the range, are explicitly identified or specifically referred to, it is to be understood that any data points within the range are to be considered to have been specified in the present disclosure, and that the inventors possessed knowledge of the entire range and the points within the range.

As used herein, the term "substantially" means that the subsequently described event, circumstance, or object completely occurs, or that the subsequently described event, circumstance, or object occurs to a great extent or degree. For example, the term "substantially" means that the subsequently described event, circumstance, or object occurs at least 75% of the time, or at least 80% of the time, or at least 85% of the time, or at least 90% of the time, or at least 95% of the time, or at least 98% of the time. Alternatively, the term "substantially" means that the subsequently described event, circumstance, or object is present in at least 75%, at least 80%, at least 85%, at least 90%, at least 95%, or at least 98% of the cases. The term "primarily" is intended to mean greater than 50%. The term "substantially" is intended to be a more limited example of "primarily."

As used herein, the term "reflectometer" means an instrument for measuring quantities associated with reflected pulses of energy.

Referring now to the Figures, and more particularly to FIG. 1A, shown therein is a non-limiting embodiment of a radar system 2 constructed in accordance with the present disclosure. The radar system 2 measures reflections of pulses of energy generated at the air-radome interface, either under dry or wet conditions, using, by way of example only, a dielectric antenna as a probe antenna.

As shown in FIG. 1, in one non-limiting embodiment, the radar system 2 is provided with a moving guide 3, which in this embodiment is formed of a radar antenna 4 movably supported by a pedestal 6. The radar system 2 also includes a radome 8 disposed over and encompassing the radar antenna 4, the pedestal 6, and a probe 10. The radar antenna 4 is provided with a dish antenna 11, and an antenna feed 12. In some non-limiting embodiments, the probe 10 comprises a mechanical fixture 14 connected to and supported by the antenna feed 12. The mechanical fixture 14 houses at least one probe antenna 18 (for instance, by way of example only, at least one dielectric probe antenna). The radome 8 has an inner surface 19 and an outer surface 20. The inner surface 19 encompasses and defines a space 21 sized and adapted to receive the radar antenna 4. The probe antenna 18 being selectively attached to and communicating with at least one reflectometer 22 via, for instance, at least one RF cable 26, the probe 10 further comprising a conduit 30 that allows for the transmission of data (both to and from the reflectometer 22 of the probe 10) and which may also provide power to the probe 10, for instance, by way of example only, to the at least one reflectometer 22 of the probe 10.

The reflections captured by the probe 10 are read by, in one non-limiting embodiment, a single port reflectometer 22 set in time domain. In order to fully characterize the overall surface of the radome 8, the probe 10 is mounted to the antenna feed 12 at the antenna feed position, allowing scanning in azimuth and elevation with resolution dictated by the radar system 2. To enable measurement of the radome reflections without affecting the dish antenna 11 performance, the size of the proposed probe 10 is preferably smaller than the antenna feed 12, in order to minimize the attenuation due to blockage. Accordingly, the probe antenna 18 can be configured with a small transversal area that enables a narrow beam pattern for high resolution tests. Since the probe 10 is mounted to the radar antenna 4 within the radome 8, the probe 10 collects reflections generated from the radome 8 in the same direction that the radar antenna 4 is pointing and scanning. The probe antenna 18 is positioned so as to be measuring in a far-field region of the energy pulses emitted by the probe antenna 18, in an electromagnetic shadow region of the antenna feed 12, which is almost not penetrated by the radiation of the radar antenna 4 at the moment of the measurement. Such a method is useful to measure the increased level of reflections due to water on the radome 8 when rain reaches the radar location.

The moving guide 3 is configured to guide the probe antenna 18 through a path within the space defined by the radome 8 such that the probe antenna 18 is spaced a distance from the radome 8 and the radome 8 is within the far field region of the probe antenna 18 as the moving guide 3 guides the probe antenna through the path.

As shown in FIG. 1A, in one non-limiting embodiment, radome characterization is performed utilizing the at least one probe antenna 18 that is connected to the at least one reflectometer 22 (i.e., via at one RF cable 26), and the TDG is appropriately set to measure the reflections at the radome interface. Simultaneous measurements of the reflections generated from the radome in the H- and V-planes are possible by using two (or more) probes 10 (referred to hereinafter as a first probe and a second probe) positioned next to each other, where the first probe is rotated about 90° with respect to the second probe. Another advantage of the low profile probe antenna 18 is to avoid interference with radar operations—this advantage has been proven through numerical simulations in Ansys HFSS. The influence of the probe(s) 10 on performance of the dish antenna 11 has been evaluated for the dual-polarization, which requires the use of two dielectric rod probe antennas 18.

Figure 1B:
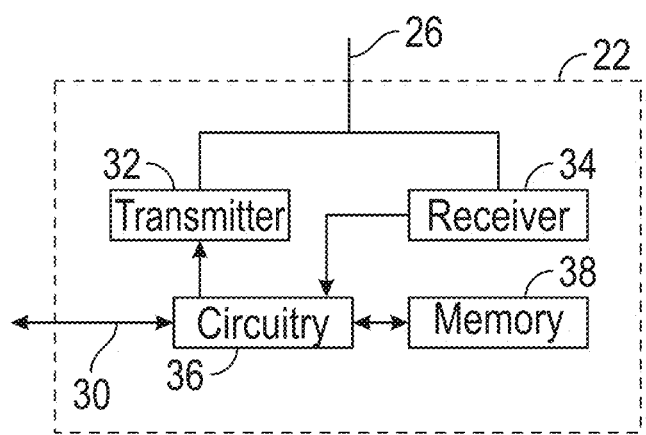
FIG. 1B is a block diagram of a non-limiting embodiment of a reflectometer constructed in accordance with the present disclosure.

A block diagram of the reflectometer 22 is shown in FIG. 1B. In general, the reflectometer 22 is provided with a transmitter 32, a receiver 34, circuitry 36, and non-transitory memory 38. The term "circuitry" may include hardware, such as a processor, an application specific integrated circuit (ASIC), or a field programmable gate array (FPGA), or a combination of hardware and software. The term "processor" as used herein, refers to a single processor or multiple processors working together to perform a task. In some embodiments, the circuitry 36 and the non-transitory memory 38 may be network based or cloud based. In these embodiments, the circuitry 36 and/or the non-transitory memory 38 may include the provision of configurable computational and/or storage resources on demand via interfacing with a computer and/or computer network. Software includes one or more computer executable instructions that when executed by one or more component of the circuitry cause the component to perform a specified function. It should be understood that algorithms indicative of formulas and procedures described herein are stored on one or more non-transitory memory 38. Exemplary non-transitory memory 38 includes random access memory, read only memory, flash memory or the like. Such non-transitory memory can be electrically based or optically based.

The circuitry 36, e.g., a processor, is configured to enable the transmitter 32 to direct a pulse of electromagnetic energy to the probe antenna 18 at first instants of time whereby the dielectric material of the probe antenna 18 emits at least a portion of the pulse of electromagnetic energy in the far field region of the probe antenna 18. The circuitry 36 is also configured to enable the receiver 34 to receive a reflection signal from the probe antenna 18 at second instants of time following the first instants of time using time domain gating in which the receiver 34 is only enabled to receive the reflection signal from the probe antenna 18 during the second instants of time. The circuitry 36 receives the reflection signal and is configured to determine a material property of the radome 8 within the far field region of the probe antenna 18 by analyzing the reflection signal as described in more detail below.

Figure 2A:
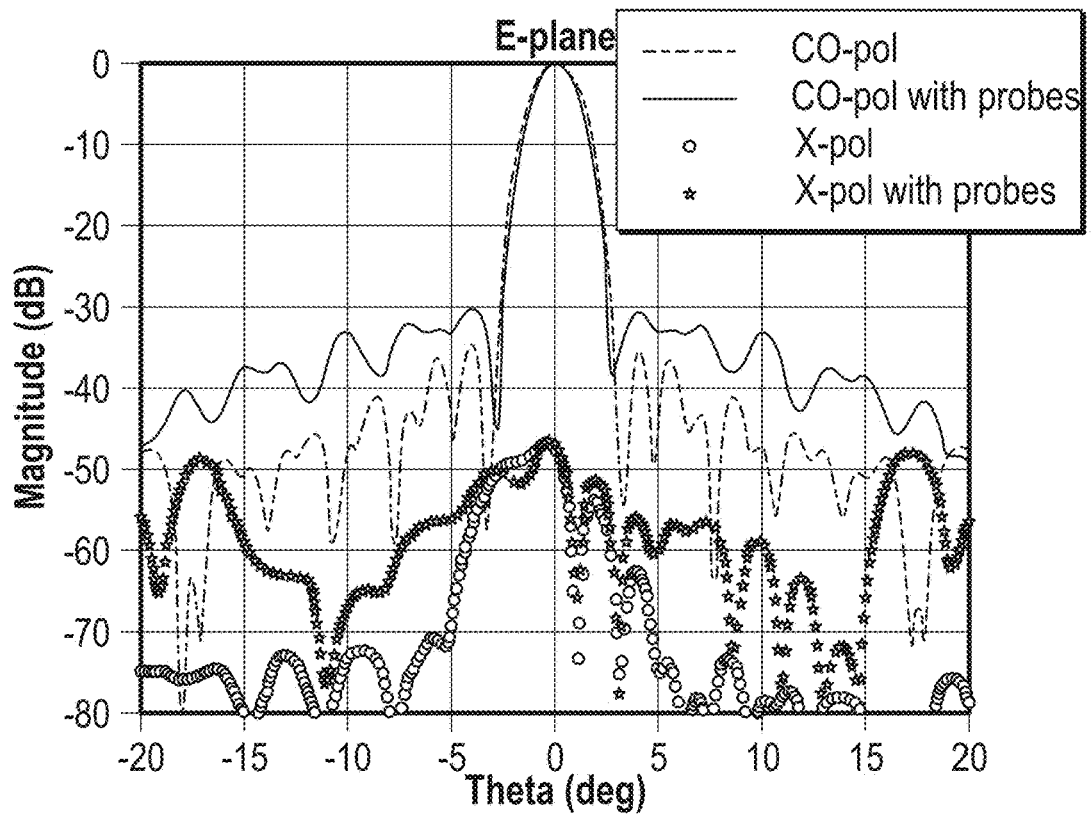
FIGS. 2A-2B show graphical plots of the results of the radar antenna patterns with and without the presence of the probe of the present disclosure for both the E-plane and H-plane, respectively, utilizing the radar system shown in FIG. 1A.
Figure 2B:
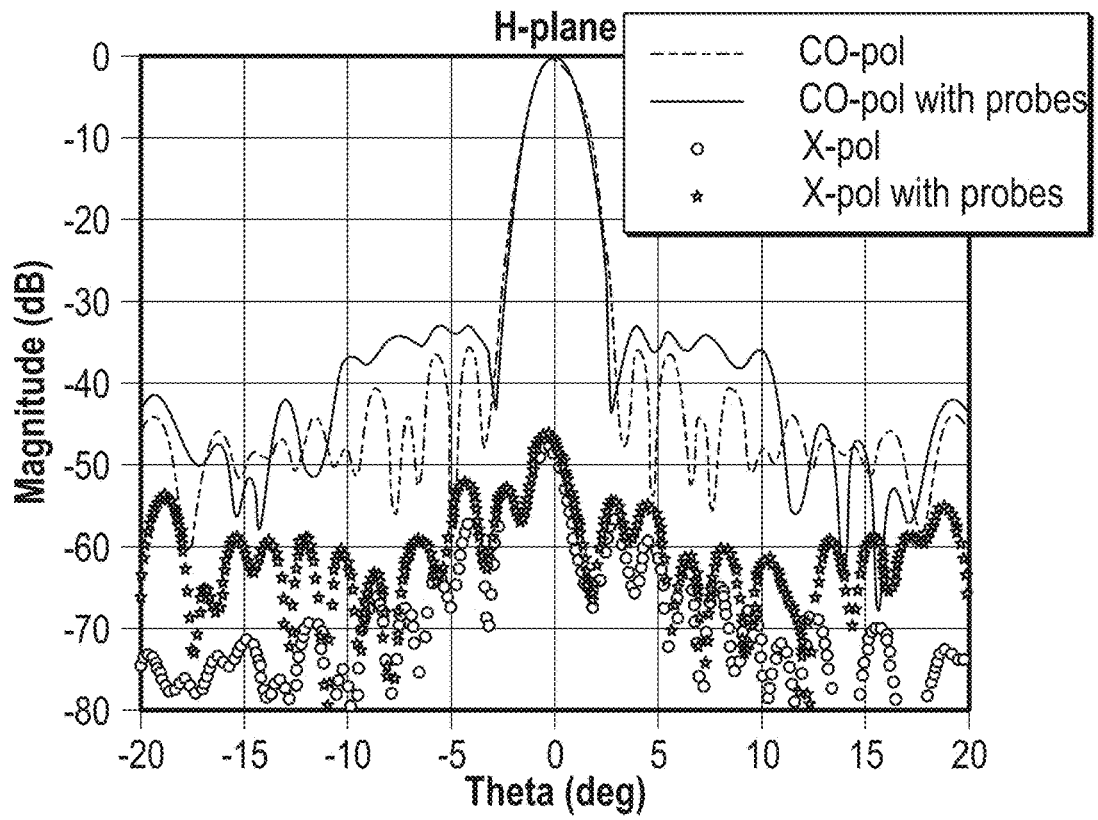

Comparative results of the radar antenna 4 with and without the presently disclosed and/or claimed probe 10 shown in FIG. 1A are shown in FIGS. 2A and 2B, respectively. Results indicate that the main beam of the reflector system is not affected by the presence of the probe(s) 10; however, a rise of sidelobe level is noticed. This implies, for instance, that the probe antenna(s) 18 require a reduction in size using miniaturization techniques, or that a single dual-polarized probe antenna 18 should be used. Synchronization between a controller (not shown), for instance, by way of example only, a controlling laptop, and the radar system 2 is required to trigger the at least one reflectometer 22 to measure when the radar antenna 4 moves to a new position in azimuth or elevation. Synchronization is also utilized to relate the data collected to the actual position. Once the data is collected, through post-processing it is possible to estimate the rain effect on the radome 8 and remove the rain effect, thereby improving the radar data quality and eliminating the bias introduced by the wet surface. Under wet conditions, different water formations are possible on various parts of the radome 8. The presence of rivulets, due to their vertical geometry, induces an increase in the reflections and attenuation more in the vertical plane than in the horizontal plane.

Figure 3A:
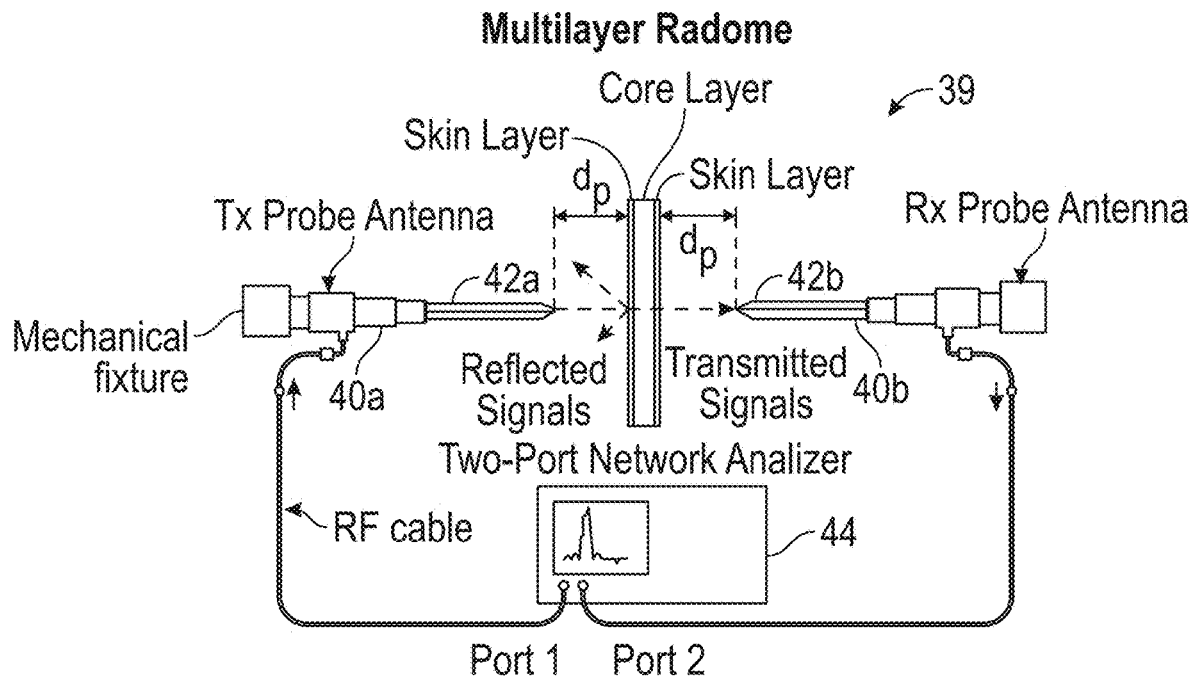
FIG. 3A shows a schematic representation of a prior art system which utilizes two probes for radome characterization.
Figure 3B:
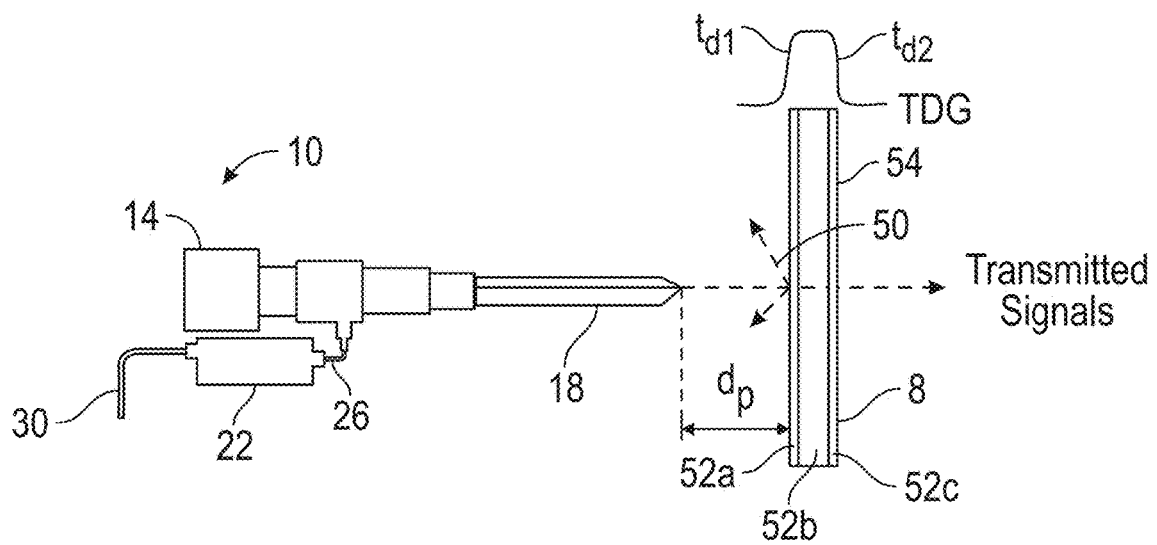
FIG. 3B shows a schematic representation of a non-limiting embodiment of a system of the present disclosure which utilizes a single probe for radome characterization.

Referring now to FIGS. 3A and 3B, a traditional system 39 to measure attenuation in a radome 8 is shown in FIG. 3A. In this case, two probes 40a and 40b are necessary, one probe 40a to transmit and the other probe 40b to receive. The probes 40a and 40b have antennas 42a and 42b the antennas 42a and 42b have to be perfectly aligned facing each other, with the sample material, e.g., a radome, located exactly halfway between the probes 40a and 40b. Based on this configuration, part of the incident field at the air-radome interface is reflected, and part of the incident field is transmitted through the sample material. Although this technique provides excellent results, this technique is impractical for radome characterization in operational radar systems. This procedure, in fact, requires the use of a two-port network analyzer 44 to measure the electric field that is reflected and transmitted through the radome sample. Additional limitations of this technique are the fact that this traditional system 39 is bulky, that the traditional system 39 can only characterize samples of flat radomes, and that most of the radomes employed in operational radar systems make use of different shapes (bullet, spherical, conical, etc).

The probe 10 may be small, lightweight, inexpensive, and easy to implement, allowing installation behind the antenna feed 12 of the dish antenna 11 of the operational radar system 2. The setup employed for this approach is shown in FIG. 3B. To show a preliminary proof of concept, simulations in HFSS were performed considering two different scenarios. The first case used two ports to emulate the traditional system 39 shown in FIG. 2A. A second simulation, to reproduce the probe 10 depicted in FIG. 3B used one port and set the second port as an impedance boundary to simulate the free space.

Figure 4:
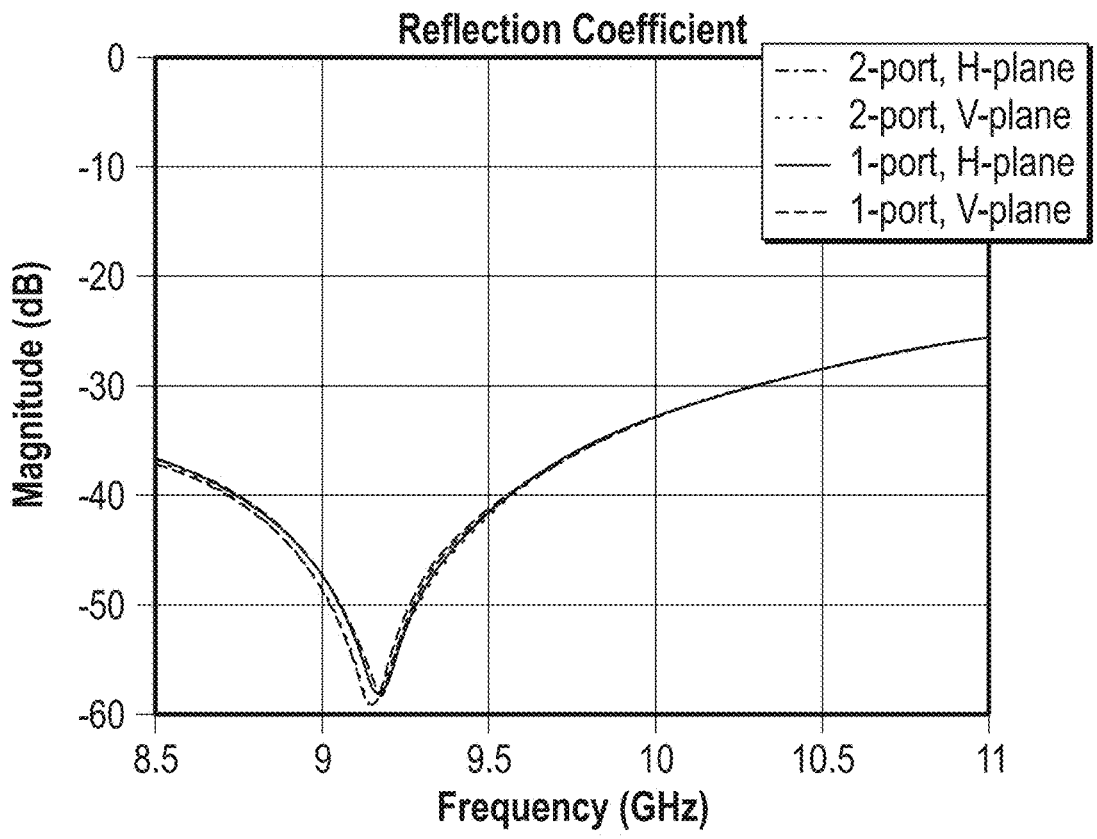
FIG. 4 shows graphical plots of HFSS simulations for the reflection coefficients in both the H-plane and V-plane as measured by the systems shown in both FIG. 3A and FIG. 3B.
Figure 5:
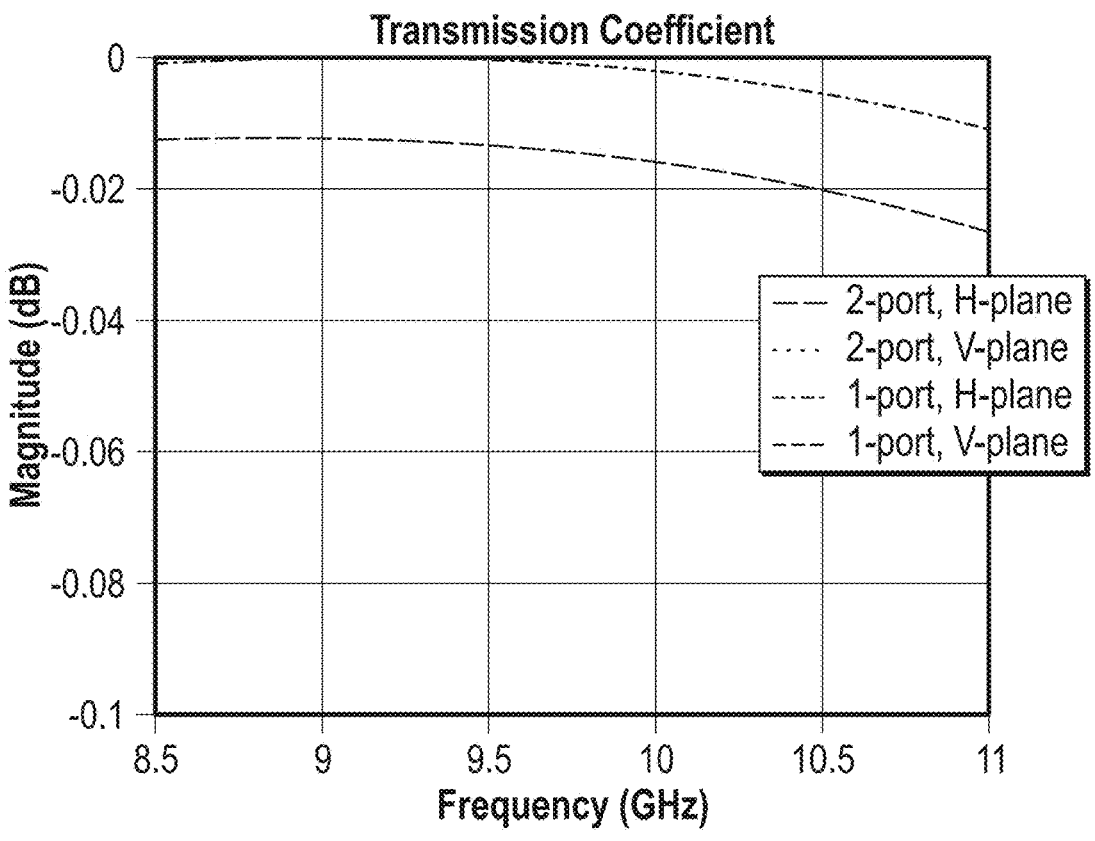
FIG. 5 shows graphical plots of HFSS simulations for the transmission coefficients in both the H-plane and V-plane as measured by the systems shown in both FIG. 3A and FIG. 3B.

Results are presented in FIGS. 4 and 5. The transmission coefficient for the one port case (FIG. 5) is, in one non-limiting embodiment, obtained by 1−R, where R is the reflection coefficient (FIG. 4). Simulations show excellent agreement between the two scenarios and demonstrate that at least for a dry radome, the absorptions are negligible.

In another non-limiting embodiment, the present disclosure relate to apparatus and methodologies for the characterization of radome performance under dry and wet conditions based on the measurements of the reflection coefficient at the air-from an air/radome interface (that is shown by way of example in FIG. 3B as an inner surface 50 of the radome 8). As shown in FIG. 3B, the radome 8 may be constructed of multiple layers 52a, 52b and 52c. The layers 52a and 52c are skin layers, and the layer 52b is a core layer. This characterization takes into account radome imperfections due to the radome fabrication process, radome condition (clean or dirty), as well as the effect of rain accumulation on the surface (film, droplets, or rivulets). Via this new, in-situ, real-time characterization, bias errors generated by the radome 8 in the radar system 2 are removed, especially under rain conditions.

The characterization, accomplished, for instance, by way of example only, via the radar system 2 shown in FIG. 1A, comprises and/or consists of measuring reflections generated at the air-radome interface, either under dry or wet conditions, using the at least one dielectric probe antenna 18. The reflections captured by the probe antenna 18 are read by the single port reflectometer 22 set in time domain. In order to fully characterize the overall surface of the radome 8, the probe 10 is mounted to the antenna feed 12 at the antenna feed position, allowing scanning in azimuth and elevation with resolution dictated by the radar system 2. The probe antenna 18 extends from the antenna feed 12 towards the radome 8 such that the probe antenna 18 is located between the antenna feed 12 and the radome 8. To enable measurement of the radome reflections without affecting performance of the radar antenna 4, a cross-sectional size of the probe antenna 18 is preferably smaller than a cross-sectional size of the antenna feed 12, in order to minimize the attenuation due to blockage. Accordingly, the probe antenna 18 may be provided with a small transversal area that enables a narrow beam pattern for high resolution tests. Since the probe 10 is mounted on the radar antenna 4, the probe antenna 18 of the probe 10 collects reflections generated from the radome 8 in the same direction that the radar antenna 4 is scanning. The probe antenna 18 is measuring in its far-field region, in the electromagnetic shadow region of the antenna feed 12, which is almost not penetrated by the radiation of the radar antenna 4 at the moment of the measurement. The probe antenna 18 and the radar antenna 4 illuminate different regions of the radome 8. The region of the radome 8 sampled by the probe antenna 18 is only a fraction of the region of the radome 8 which is penetrated by the electromagnetic wave emitted by the radar antenna 4. The present disclosure is particularly useful to measure the increased level of reflections due to water on the radome 8 when rain reaches the radar location. Water accumulation is not the same on all the parts of the radome 8. Multiple factors, including dirt on or damage to the radome 8, as well as blowing wind can, in fact, influence water distribution on an exterior surface 54 of the radome 8.

Figure 11A:
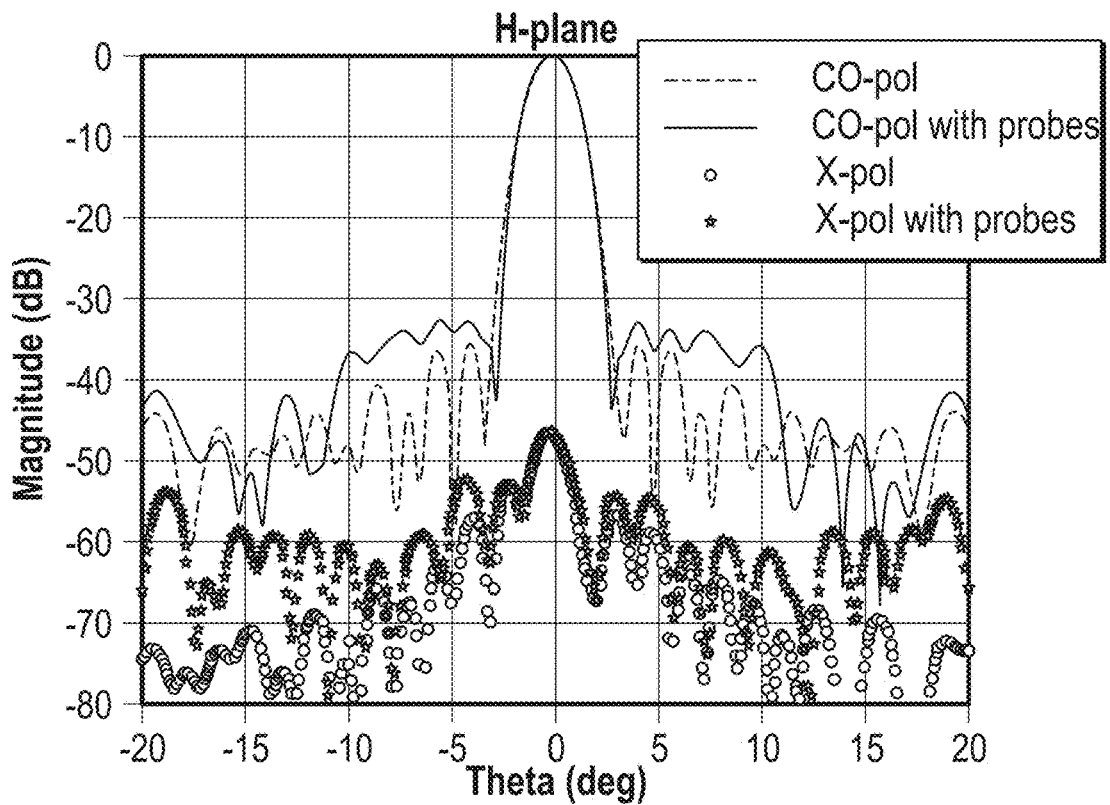
FIGS. 11A-11C show graphical plots of a non-limiting embodiments of simulated radiation patterns of a dish reflector without the dielectric probes in which the simulations are performed in HFSS at 9.55 GHz and show the effect introduced by the probes for the H-plane (FIG. 11A), the D-plane (FIG. 11B), and the E-plane (FIG. 11C).
Figure 11B:
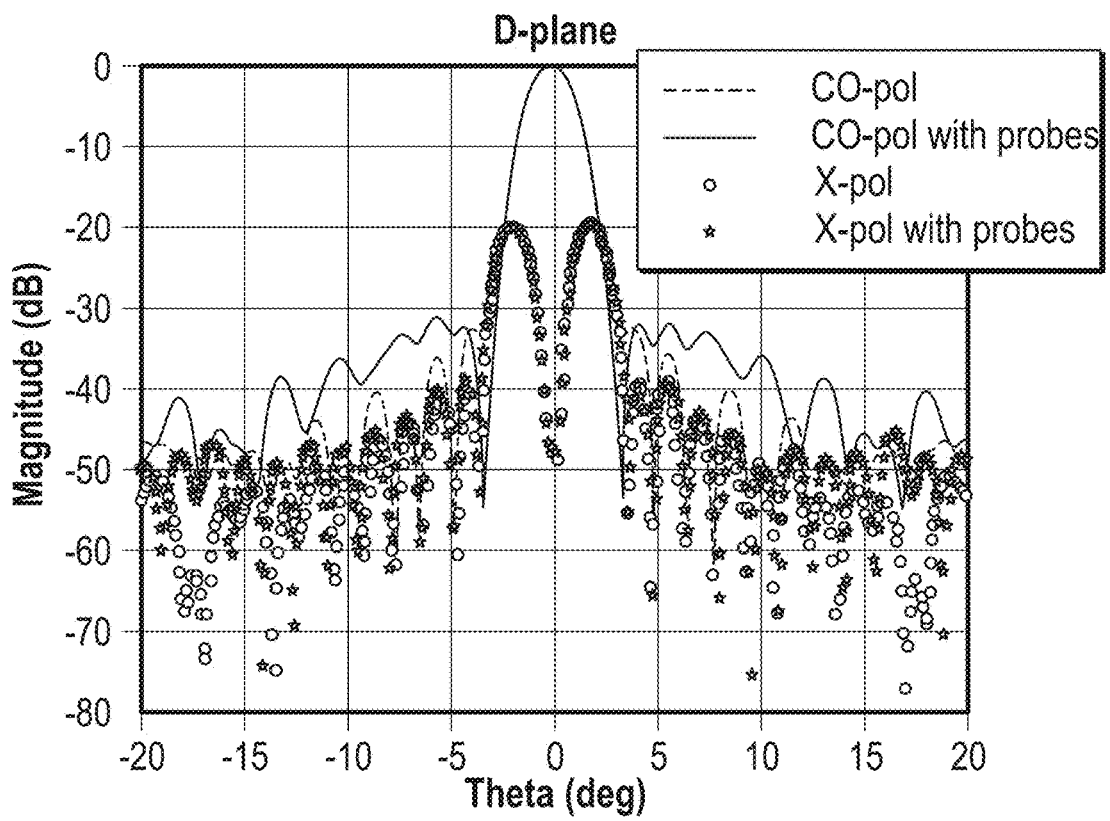
Figure 11C:
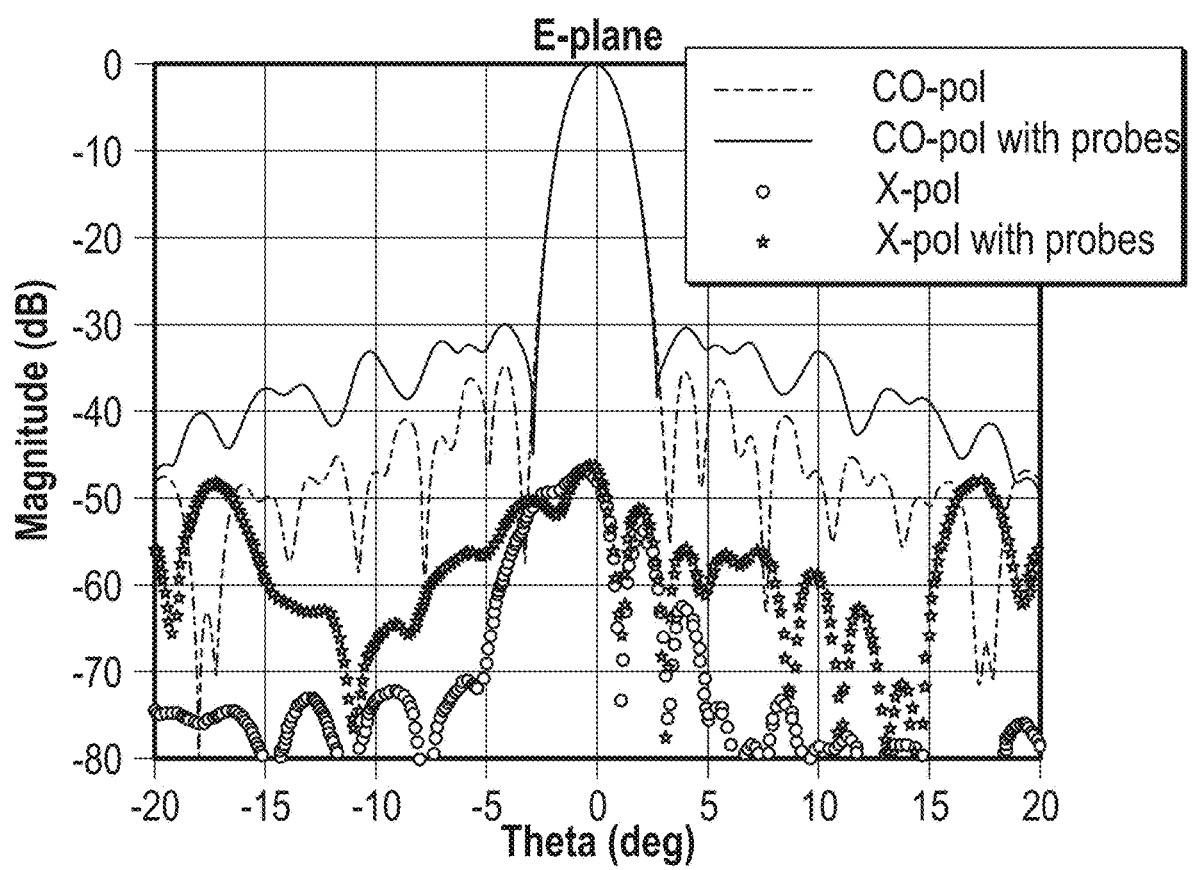

The at least one dielectric probe antenna 18 is connected to the at least one reflectometer 22, and the TDG is appropriately set to measure the reflections at the radome interface 50. The low profile of the probe 10, composed of, in at least one non-limiting embodiment, the probe antenna 18 and the reflectometer 22 allows ease of transport for infield measurements in the case of mobile radar stations. Simultaneous measurements of the reflections generated from the radome 8 in the H- and V-planes are possible by using two probe antennas 18 next to each other, where one probe is rotated about 90° with respect to the other probe. The attenuation generated from the radome 8 can then be derived from the reflections measurement. An additional advantage of the present disclosure is that measurements made by the probe 10 will not interfere with radar operations, which has been proven through numerical simulations (HFSS software). The influence of the proposed setup on the dish antenna performance has been evaluated for the dual-polarization case which preferably utilizes two dielectric probe antennas 18, one to measure the H-plane, the other for the V-plane. The Ansys High Frequency Electromagnetic Field Simulation (HFSS) software utilizes a 3-D, full-wave frequency domain electromagnetic field solver based on the finite element method. One of such studies, was performed to evaluate the effect of the two probe antennas 18 on the radar operations. For this purpose, two scenarios have been considered. The first scenario simulated the reflector system of the PX-1000 without the dielectric probes. (Cheong, B. L., R. Kelley, R. D. Palmer, Y. Zhang, M. Yeary, and T. Yu, "PX-1000: A Solid-State Polarimetric X-Band Weather Radar and Time Frequency Multiplexed Waveform for Blind Range Mitigation," IEEE Transactions on Instrumentation and Measurement, 62, pp. 3064-3072, 2014). Two dielectric probe antennas 18 were then added for a second simulation, placed right behind the antenna feed 12 of the dish antenna 11 of the radar antenna 4 to evaluate the effect of the two dielectric probe antennas 18 on the radiation pattern of the dish antenna 11. The distance between the two dielectric antennas 18 was about 5 cm. Results are presented in FIGS. 11A-11C for the main planes of the radiation pattern. Simulations show that the main beam is not affected by the probes presence. A rise of the secondary beams is noticed, while the cross-polarization remains the same from −5° to 5°, for all the planes. Considering the impact of the two probe antennas 18 in the radiation pattern of the dish antenna 11 (e.g., reflector), a miniaturized version of the dielectric probe antennas 18 may be necessary for real-time applications to further reduce the impact of the probe antennas 18 on the radar performance. In addition, synchronization of a controller (for instance, by way of example only, a controlling laptop) and the radar antenna 4 may be used to trigger the reflectometer 22 to measure when the radar antenna 4 moves to a new position in azimuth or elevation (or both). Synchronization may also be used to relate the data collected to the actual position. In this way, it is possible to have information about the condition of the radome 8 at the same time and in the same position where the radar antenna 4 is scanning. Eventual damages or the presence of joints in the radome 8, could negatively impact radar measurements. Damages affect water distribution in a particular location on the radome 8, and the presence of joints within the radome 8 could increase the level of reflection. Under wet conditions, different water formations are possible on various parts of the radome 8. The presence of rivulets is critical based on their vertical geometry which increases reflections more in the vertical than in the horizontal plane. Consequently, the measurements preferably utilize a linearly polarized probe antenna 18 for the H-plane and another probe antenna 18 (90° rotated) for the V-plane.

The presence of water on the radome 8 introduces additional attenuation of the signal. To quantify the level of signal absorbed by water film, a mathematical model has been created and validated through simulations using Ansys HFSS. The mathematical model starts from the definition of the dielectric constant of a lossy medium (water) and arrives at the calculation of the transmittance through a slab of water for different thicknesses. The definition of complex dielectric constant ($\varepsilon_c$), for a lossy medium, is:

$$\varepsilon_c = \varepsilon - j\frac{\sigma}{\omega} \quad (1)$$

The second term of Equation 1 represents the losses associated with the conductivity ($\sigma$). The relative dielectric constant is:

$$\varepsilon_c = \frac{\varepsilon_c}{\varepsilon_0} = \frac{\varepsilon}{\varepsilon_0} - j\frac{\sigma}{\omega\varepsilon_0} = \varepsilon' - j\varepsilon'' \quad (2)$$

As recited in Zhang et al., supra, the real and imaginary part of the $\varepsilon_r$ are:

$$\varepsilon' = \varepsilon_\infty + \frac{(\varepsilon_x - \varepsilon_\infty)[1 + (\lambda_s/\lambda)^{1-\nu}\sin(\nu\pi/2)]}{1 + 2(\lambda_s/\lambda)^{1-\nu}\sin(\nu\pi/2) + (\lambda_s/\lambda)^{2(1-\nu)}} \quad (3)$$

$$\varepsilon'' = \frac{(\varepsilon_x - \varepsilon_\infty)[1 + (\lambda_s/\lambda)^{1-\nu}\cos(\nu\pi/2)]}{1 + 2(\lambda_s/\lambda)^{1-\nu}\sin(\nu\pi/2) + (\lambda_s/\lambda)^{2(1-\nu)}} + \frac{\sigma\lambda}{2\pi c\varepsilon_0}$$

The formulas in Equation 3 are the Debye's equations with the modifications introduced by Cole and Cole to take into account spread effects $\varepsilon\infty$, $\varepsilon s$, $\lambda s$, and $\nu$ are dependent on the temperature are defined in Zhang. (Cole, K. S., and R. H. Cole, "Dispersion and Absorption in Di-electrics in Alternating Current Characteristics," The Journal of Chemical Physics., 9, pp. 341-351; and Zhang, G., "Weather Radar polarimetry," Taylor and Francis Group, LLC, pp. 34-37). The tangent loss is obtained by the following relation:

$$\tan\delta = \frac{\omega\varepsilon'' + \sigma}{\omega\varepsilon'} \quad (4)$$

$\varepsilon_r$ and tan $\delta$ of fresh water are plotted for different temperatures in FIG. 12.

Considering a plane wave propagating in a lossy medium, the propagation constant can be written as:

$$\gamma = \alpha + i\beta = \frac{\omega N}{c} \quad (5)$$

where c is the speed of light in the vacuum, and N is the complex refraction index of the medium defined by the following equation:

$$N = \sqrt{\frac{\varepsilon\mu}{\varepsilon_0\mu_0}} = n + ik \quad (6)$$

The power associated to this wave propagating in the z-direction, is defined by the vector Poynting:

$$S = \frac{1}{2}\text{Re}\{E \times H^*\} \quad (7)$$

the magnitude of S is called irradiance (I). If the medium is lossy (as is the case of water), part of the energy is absorbed by the material, the irradiance is then attenuated by the following law:

$$I = I_0 e^{-\alpha z} \quad (8)$$

The quantity $\alpha$ determines the amount of energy lost by absorption inside the material. The absorption coefficient is defined as:

$$\alpha = \frac{4\pi k}{\lambda} \quad (9)$$

The imaginary part of the refraction index (k in Equation 6), determines the rate at which the electromagnetic energy is lost by the material absorption. Considering a plane wave propagating in two semi-infinite media, where the first one is non-absorbing (air) with refraction index N1, and the other material is absorbing, with refractive index N2=n2+ik2, part of the wave is reflected and part is transmitted through the interface. The incident, reflected, and transmitted electric fields are named $E_I$, $E_R$, and $E_T$ respectively. The reflection (r) and transmission (t) coefficients determine the amount of electric field reflected and transmitted. Such coefficients are defined as:

$$r = \frac{E_R}{E_I} \text{ and } t = \frac{E_T}{E_I} \quad (10)$$

Defining the ratio of $N_1/N_2 = m$, the coefficients introduced above can be rewritten as:

$$r = \frac{1-m}{1+m} \text{ and } t = \frac{2}{1+m} \quad (11)$$

Reflectance (R) and reflection coefficient (as well as transmittance—T—and transmission coefficient) are directly related:

$$R = |r|^2 = \left|\frac{1-m}{1+m}\right|^2 \text{ and } T = |t|^2 = \left|\frac{2}{1+m}\right|^2 \quad (12)$$

Considering an absorbing dielectric slab (medium 2, water) of thickness h and refraction index N2=n2+ik2, placed in between two semi-infinite mediums made of air, both with N1=n1, the transmission and reflection coefficients at the air-water interface, are:

$$r_{slab} = \frac{r(1 - e^{i2kN_2h})}{1 - r^2 e^{i2kN_1h}} \quad (13)$$

$$R_{slab} = |r_{slab}|^2$$

$$t_{slab} = \frac{4m}{(m+1)^2} \frac{e^{-ikN_1h}}{(e^{-ikN_2h} - r^2 e^{ikN_2h})} \quad (14)$$

$$T_{slab} = |t_{slab}|^2 = \frac{(1-R)^2 + 4R\sin^2\psi}{R^2 e^{-\alpha h} + e^{\alpha h} - 2R\cos(\xi + 2\psi)}$$

where:

$$\psi = \tan^{-1}\left(\frac{2n_1 k_2}{n_2^2 + k_2^2 - n_1^2}\right) \quad 0 \le \psi \le \pi, \quad \xi = \frac{4\pi n_2 h}{\lambda} \quad (15)$$

$\alpha$ has previously been introduced in Eq. 9 and for the specific case k needs to be replaced with $k_2$. The portion of the electromagnetic wave that is transmitted through the first boundary, when it reaches the second interface, is again partially reflected back to the first boundary and partly transmitted through the slab. This mechanism happens inside the slab infinite times producing as many terms that adds up producing the total, or folded, reflected or transmitted energy, or equivalently, the folded reflectance or transmittance. The total transmitted irradiance is:

$$I_1 = I_1(1-R)^2 e^{-\alpha h}(1 + R^2 e^{-2\alpha h} + R^4 e^{-4\alpha h} + \dots) \quad (16)$$

the infinite series can be written as:

$$T_{slab} = \frac{(1-R)^2 e^{-\alpha h}}{1 - R^2 e^{-\alpha h}} \quad (17)$$

Equation 17 is an approximation of Equation 14 and represents the folded transmittance. The same discussion applies to the reflectance.

For the case of a plane wave incident to a boundary separating two lossless media, the law of energy conservation can be written in terms of transmittance and reflectance (as noted in Balanis, C. A., "Advanced Engineering Electromagnetics," Wiley, pp. 173-205, 2012) as:

$$T + R = 1 \quad (18)$$

In the scenario where losses occur (absorbing material), Equation 18 must be rewritten taking into account the attenuation or absorptance (A), due to the absorption of the lossy material:

$$T + R + A = 1 \quad (19)$$

In Equations 18 and 19, T and R are the folded reflectance and transmittance for the case of a slab or multilayer material. Simulations in Ansys HFSS were performed to validate the concept and setup shown in FIG. 3B. To achieve this goal, two scenarios have been replicated, both employing a low loss sandwiched material, representing an X-Band radome. The first scenario used two ports to emulate the historical system shown in FIG. 3A. A second simulation to reproduce the present disclosure shown in FIG. 3B utilized one port and set the second port as impedance boundary to simulate the free space. Results for the reflection and transmission coefficients for H- and V-planes are shown in FIGS. 4 and 5, respectively. The curves in FIG. 4 are results of direct simulation, the same for the transmission coefficient, blue curve, of the 2-port case (FIG. 5). The curve for 1-port in FIG. 5 is obtained applying Equation 18 because the materials considered are very low loss. Simulations show good agreement between the two-port and one-port scenarios for both transmission and reflection coefficients, for both H- and V-planes, thereby confirming the validity of the approach chosen and assuring that the absorption can be neglected because of the materials employed. The absorption for the study just shown, is given by the difference between the two curves in FIG. 5, which is lower than 0.02 dB. The stackup employed for the X-band radome simulated in HFSS, is summarized in Table 1 below.

TABLE 1

The radome stackup employed in the HFSS simulation to prove the concept.

| Material | Thickness (mm) | $\varepsilon_r$ | tanδ | Description |
|---|---|---|---|---|
| Teflon | 0.53 | 2.1 | 0.001 | outer skin |
| Rohacell | 8.32 | 1.05 | 0.0017 | core |
| Teflon | 0.53 | 2.1 | 0.001 | inner skinte |

Figure 12A:
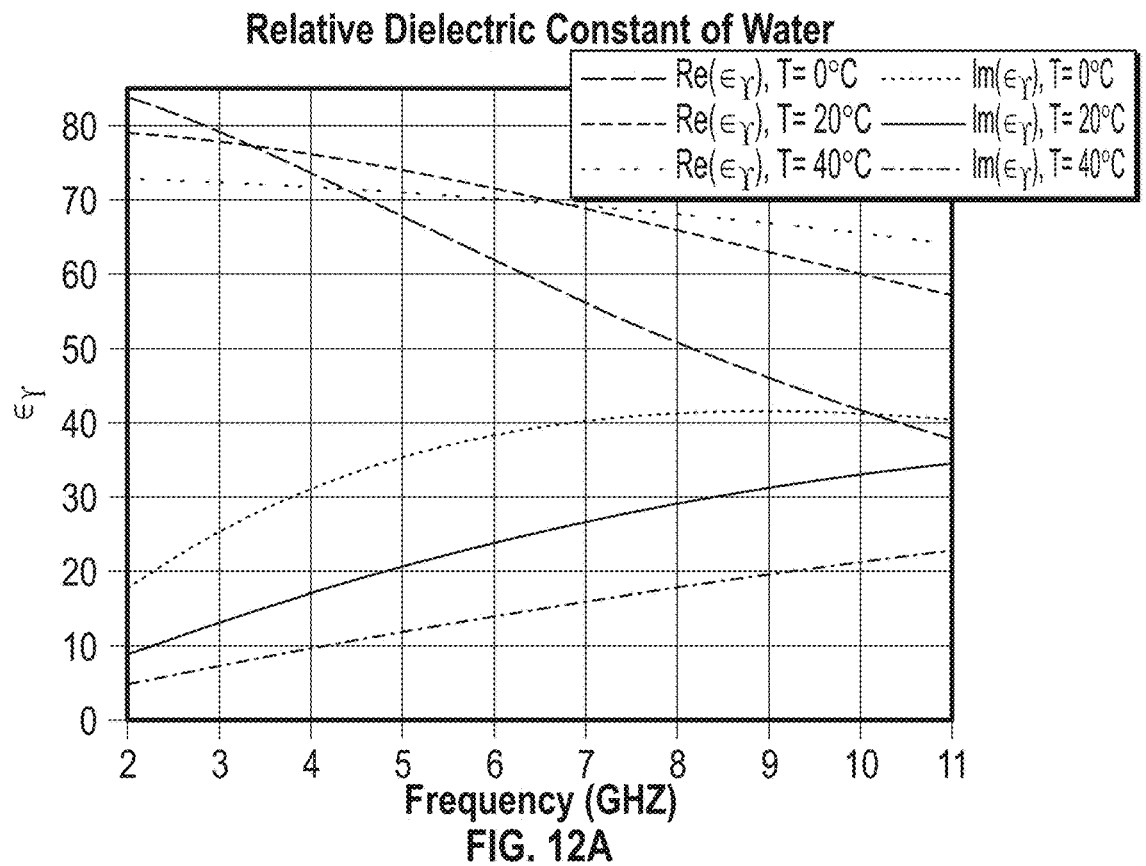
FIGS. 12A-12B show graphical plots of the dielectric parameters of water taken at different temperatures in which the real and imaginary part of the relative dielectric constant is shown (FIG. 12A) as is the relative tangent loss (FIG. 12B).
Figure 12B:
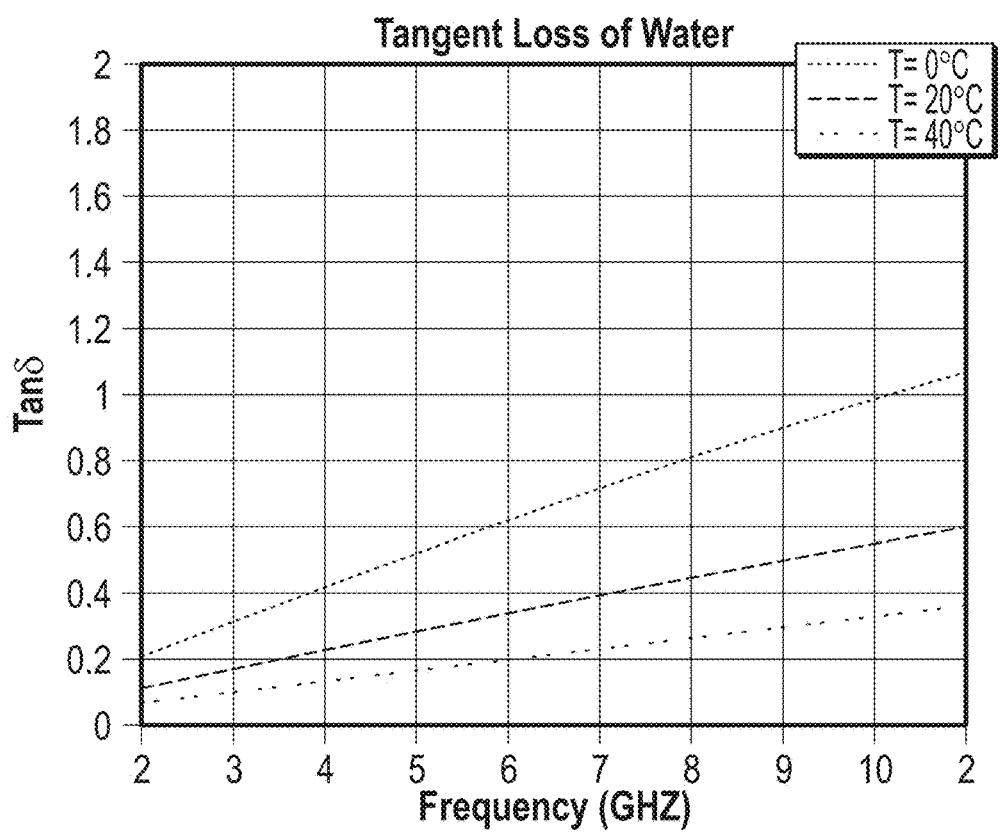
Figure 13A:
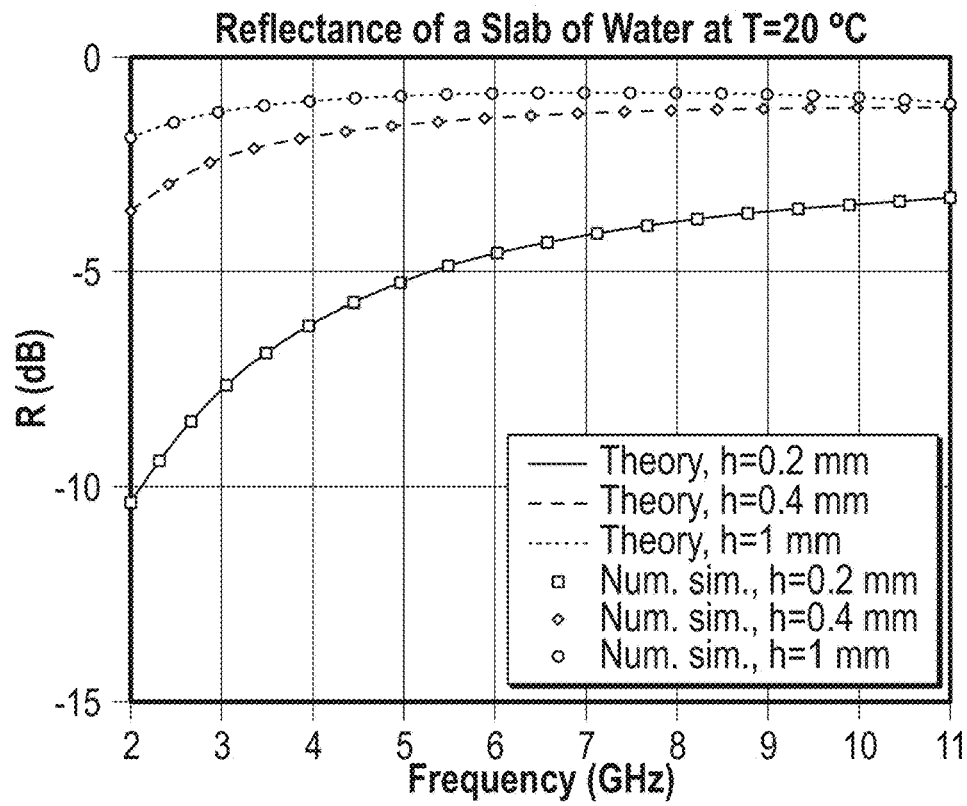
FIGS. 13A-13C show graphical plots comparing the various parameters taken for simulations conducted utilizing the present disclosure and simulations conducted utilizing HFSS for water at 20° C. with different thicknesses, the parameters including reflectance (FIG. 13A), transmittance (FIG. 13B), and absorption (FIG. 13C).
Figure 13B:
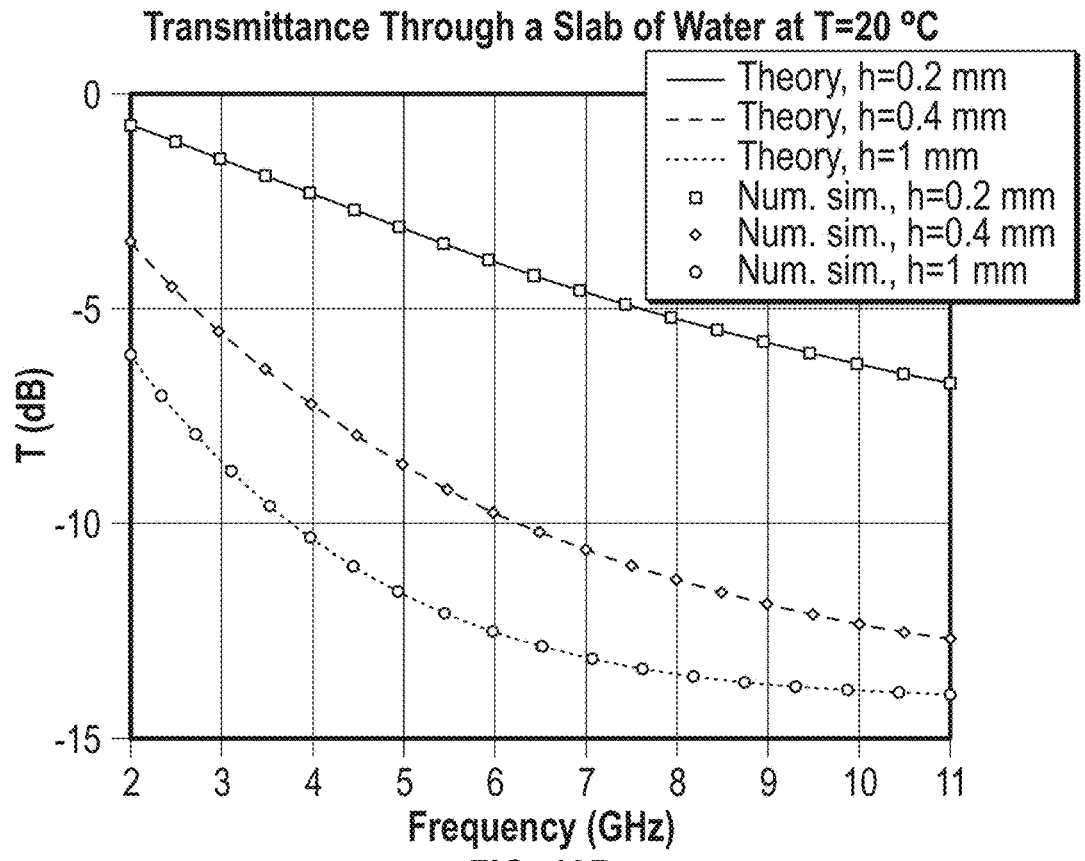
Figure 13C:
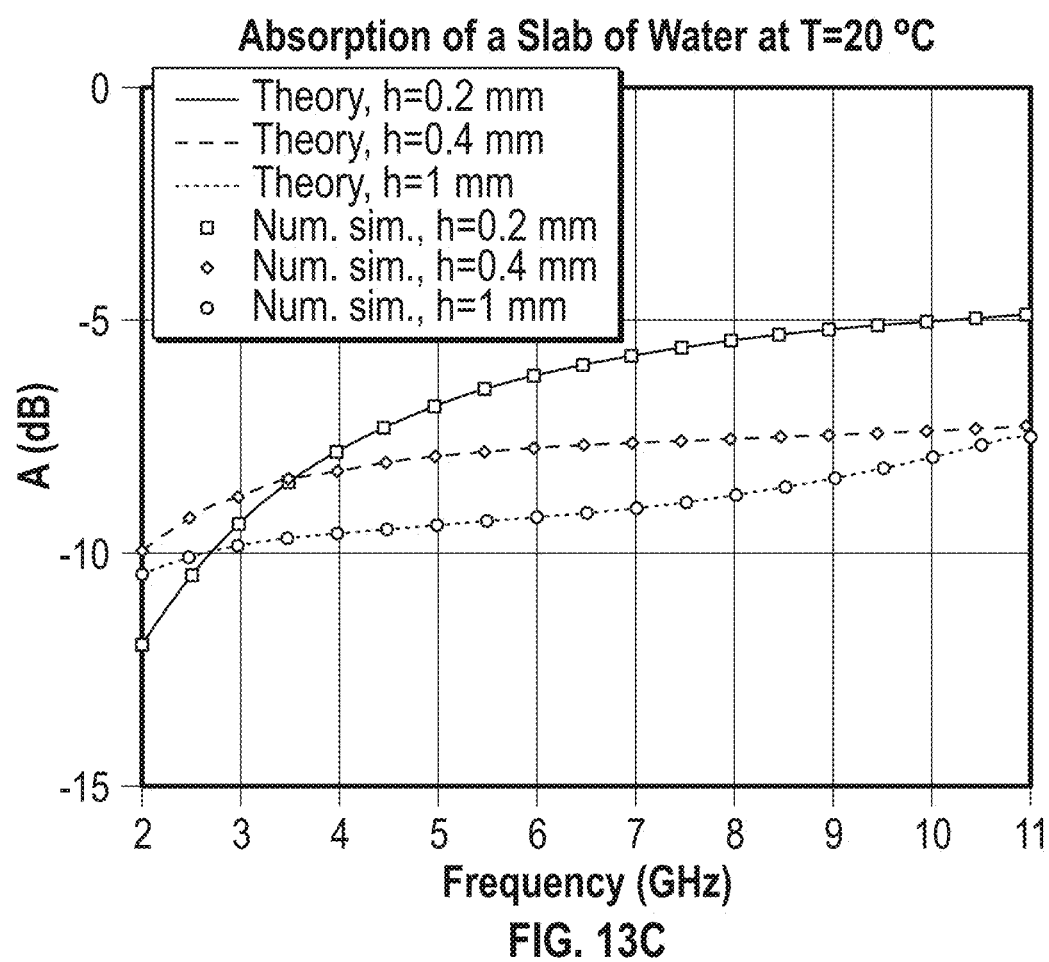

To evaluate the impact of the absorption, an analytical approach comprising a slab of water at 20° C. with thicknesses of about 0.2, 0.6, and 1 mm has been considered. First $\varepsilon'$, $\varepsilon''$, and tan δ have been computed from Equations 3 and 4, respectively (FIGS. 12A and 12B for T=20° C.). Then the reflectance and transmittance through the slab is calculated using Equations 13 and 14, respectively. The same scenario has been replicated in Ansys HFSS. The dielectric properties ($\varepsilon'$ and tan δ) of the water implemented in the simulator, were set to be frequency dependent (as in FIG. 12A), in order to have a more accurate electromagnetic behavior of the material. The situation described emulates the water film that forms over the outer surface of radomes 8 in real scenarios. Results computed by the analytical case are overlapped with the HFSS simulations in FIGS. 13A-13C. Results show a good agreement between the two methods. In FIG. 13A, an increase of the reflectance with the frequency is noticed and with the thickness of the slab. Dually, in FIG. 13B, the transmittance is higher at lower frequencies and for thinner water films. The absorption in FIG. 13C has been computed using Equation 19 as a function as the known quantities (because directly computed or simulated) R and T. The absorption is lower at S-band frequencies and increases as approaching the X-band. Unexpectedly, the highest absorption occurs for the thinnest slab (0.2 mm) of water. This may be a consequence of the low reflectance that happens for 0.2 mm-film. Since high reflectance is observed for the 1 mm-slab (about −1 dB in average), most of the energy is reflected. Since just a low amount of energy penetrates into the slab, a low ratio of this is absorbed. Dual discussion is for the 0.2 mm-slab of water.

In another non-limiting embodiment, the present disclosure relate to apparatus and methodologies for characterizing a bullet-shaped radome of an operative weather radar, such as, by way of example only, the PX-1000 radar developed by the Advanced Radar Research Center (ARRC) at the University of Oklahoma. In the experiments conducted with respect to the bullet-shaped radome, the probe 10 was mounted to a robot arm (not shown) that was placed on the radar pedestal 6. In accordance with this setup, was used to provide a full characterization of the radome in agreement with its geometry, by maintaining the probe antenna 18 orthogonal to the radome, and assuring high accuracy in the probe position during the conducted tests. Tests were performed in dry conditions for the cylindrical base and for the spherical portion (i.e, the top section) of the radome. The spherical portion was also characterized in wet conditions, either under artificial and/or natural rains.

NON-LIMITING EXAMPLES OF THE INVENTIVE CONCEPT(S)

The apparatus and methodologies of the present disclosure, having now been generally described, will be more readily understood by reference to the following examples and embodiments, which are included merely for purposes of illustration of certain aspects and embodiments of the present disclosure and are not intended to be limiting. The following detailed examples of apparatus, device(s), and/or methodologies are to be construed, as noted above, only as illustrative, and not as limitations of the present disclosure in any way whatsoever. Those of ordinary skill in the art will promptly recognize appropriate variations from the various structures, components, compositions, procedures, and methods disclosed herein.

Example 1: Radome Characterization Via Utilization of the Reflection Coefficient Time Domain Gating (TDG).

A primary concept behind TDG is to use a filter in the time domain. This time filter works exactly the same as a filter in the frequency domain. TDG applications have various uses across disciplines. They have previously been used to remove discontinuities or reflections in a free-space context, and for tuning purposes. (B. Archambeault, S. Connor, and J. C. Diepenbrock, "Time Domain Gating of Frequency Domain S-Parameter Data to Remove Connector End Effects for PCB and Cable Applications," 2006 IEEE International Symposium on Electromagnetic Compatibility, IEEE, 2006, pp. 199-202). TDG has also been employed to calculate radiation pattern measurements and for calibration in free-space measurements. (G. A. Burrell and A. R. Jamieson, "Antenna Radiation Pattern Measurement Using Time Domain-To-Frequency Transformation (TFT) Techniques," IEEE Trans. Antennas Propag., IEEE, 1973, pp. 702-704; D. K. Ghodgaonkar, V. V. Varadan, and V. K. Varadan, "A Free-Space Method for Measurement of Dielectric Constants and Loss Tangents at Microwave Frequencies," IEEE Trans. Instrum. Meas., Vol. 38, pp. 789-793, 1989; and M. Zaho, J. D. Shea, S. C. Hagness, and D. W. van der Weide, "Calibrated Free-Space Microwave Measurements with an Ultrawideband Reflectometer-Antenna System," IEEE Microwave and Wireless Components Letters, Vol. 16, pp. 675-677, 2006). TDG was employed in the present disclosure to more accurately investigate reflections produced from the source of interest without contamination from the reflections generated by the surrounding environment.

A. Laboratory Setup

Figure 6:
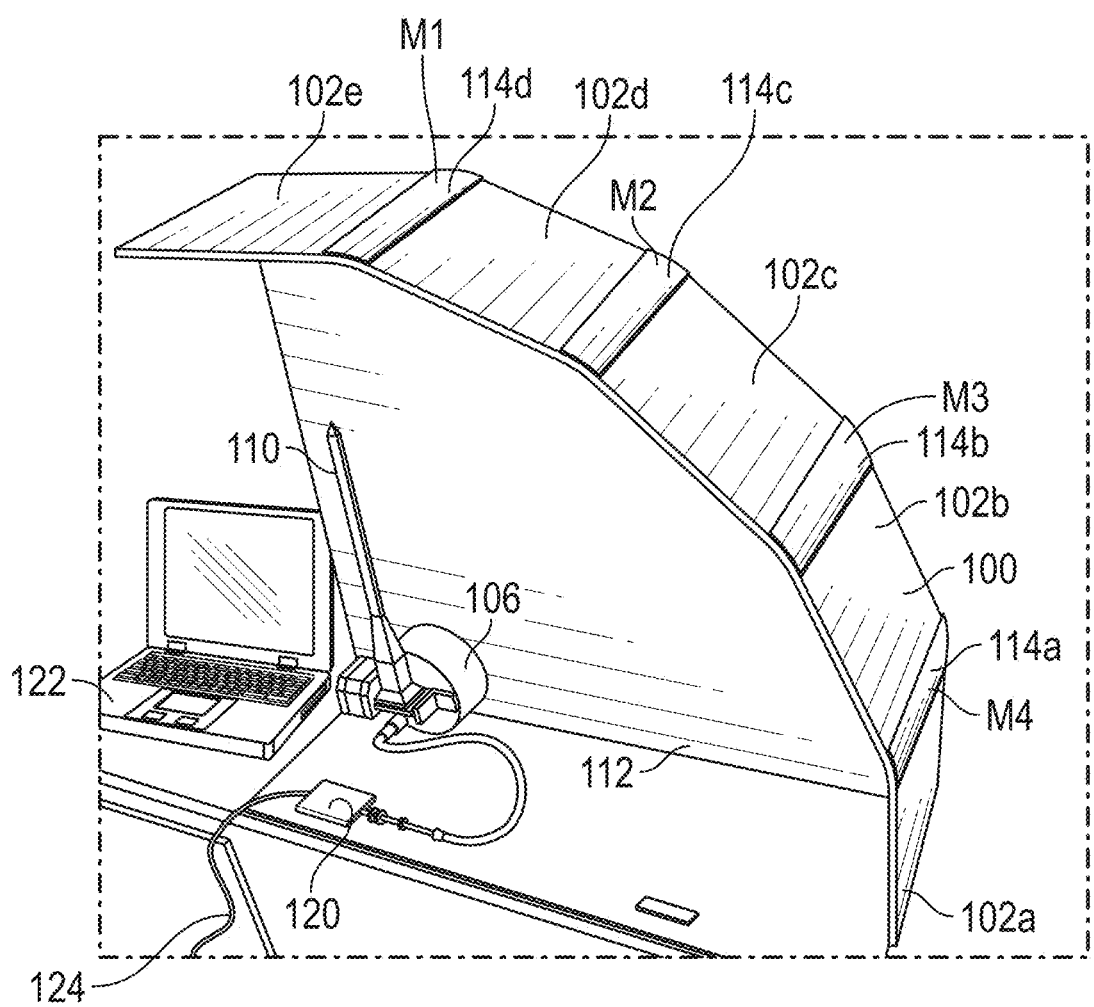
FIG. 6 shows a non-limiting embodiment of a laboratory setup constructed in accordance with the present disclosure for the conductance of various measurements associated with the radome characterization.

A photograph of a non-limiting embodiment of a laboratory setup for the validation and characterization of a radome 100 is shown in FIG. 6. In this non-limiting embodiment, the laboratory setup is composed of five radome panels 102a-e. A rotary motor 106 mounted to a probe antenna 110 is located in the corner of the setup. The panels 102a-e are placed abutting each other, however small air gaps between the panels 102a-e remain, and the panels 102a-e are located at θ=17°, 37°, 57°, and 77° with respect to the initial position of the rotary motor 106. A wooden support 112 was included to maintain the radome panels 102a-e in a stable position above the probe antenna 110 and to secure the rotary motor 106 as well. The radome panel stackup is composed of an inner layer of foam (about 6.62 mm) and an outer layer of Teflon (about 0.53 mm). Metal strips 114a-d were placed on the top outer part of the radome 100 with the purpose of providing a reference for the measurements.

1. Reflectometer.

In one non-limiting embodiment, a novel aspect of the present disclosure is that radome characterization is based on a reflection coefficient rather than on a transmission coefficient. For this purpose, a vector network analyzer (VNA) reflectometer 120 was used. The VNA works in the frequency range of about 85 MHz to about 14 GHz, and is designed for operation with an external computer 122 which also feeds the reflectometer 120 using a USB port and cable 124. The test port provides the incident signal as the output. To accomplish the reflections measurement, the VNA reflectometer 120 compares the received (reflected) signal with the source signal.

2. Dielectric Rod Antenna.

Figure 8:
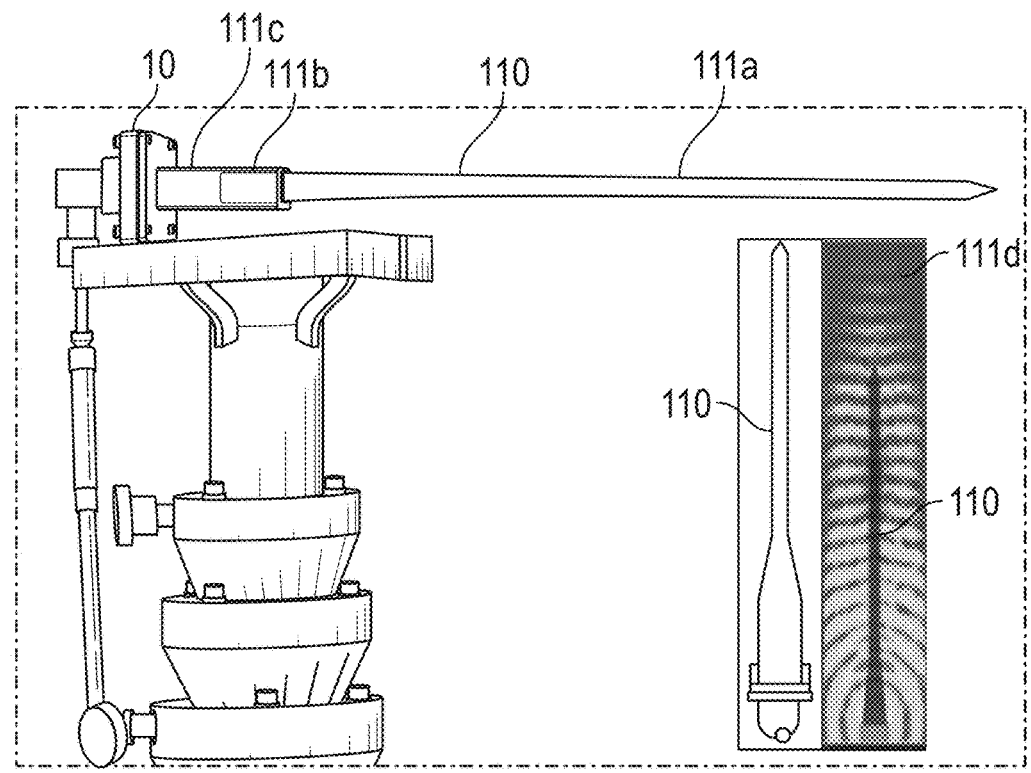
FIG. 8 shows a photograph of a non-limiting embodiment of a dielectric rod antenna utilized in accordance with the present disclosure and an image of the antenna's related electric field as simulated in HFSS.
Figure 9:
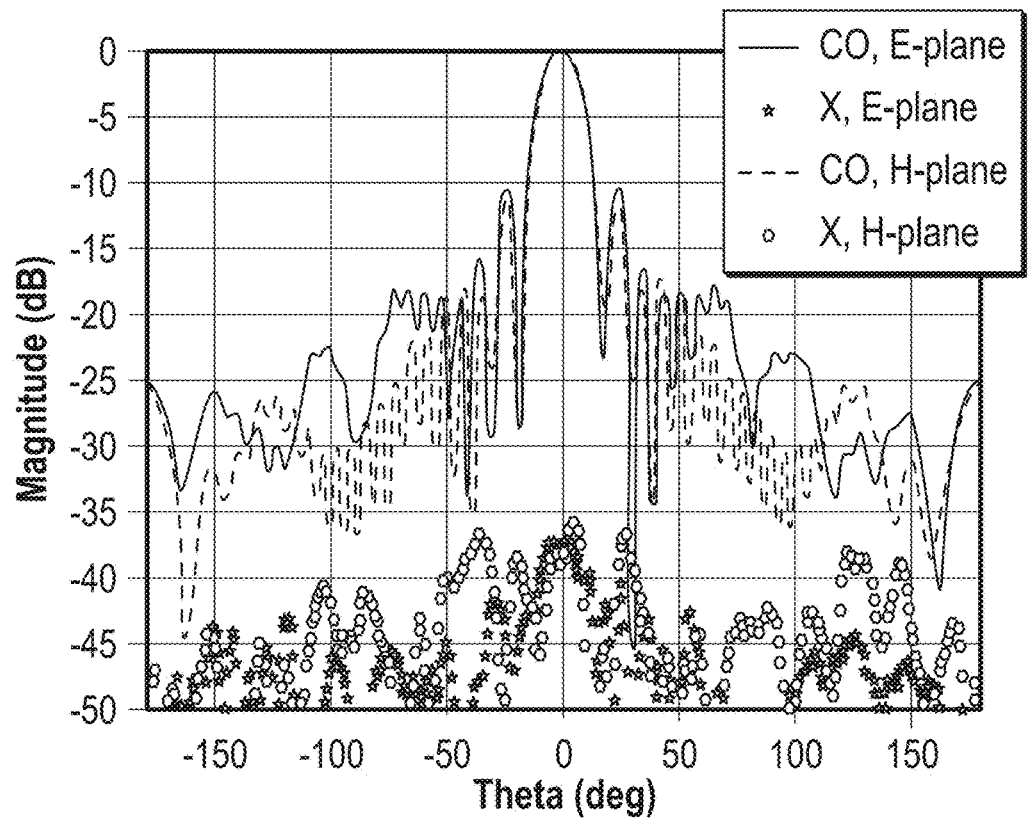
FIG. 9 shows a graphical plot of the radiation patterns measured in a far-field chamber which is generated by the dielectric rod antenna shown in FIG. 8.

To fully characterize the radome 100 and achieve high spatial resolution, the probe antenna 110 was designed with high gain and narrow beam-width. Furthermore, for a mobile station, a low-profile probe antenna 110 is also desirable. These parameters are met via utilization of at least one dielectric rod antenna. Such antennas have been successfully employed in other studies. (G. E. Mueller and W. A. Tyrrell, "Polyrod Antennas," Alcatel-Lucent Journal, Vol. 26, pp. 837-851, 1947; R. B. Watson and C. W. Horton, "The Radiation Pattern of Dielectric Rods—Experiment and Theory," Journal of Applied Physics, Vol. 19, pp. 661-670, 1948; and F. J. Zucker, "Surface-Wave Antennas," Antenna Theory, R. E. Collin and F. J. Zucker, Eds. McGraw-Hill, 2007, pp. 298-348). The at least one dielectric rod antenna comprises and/or consists of a dielectric rod 111a placed in a waveguide aperture 111b. The far-field distance, for a dielectric rod antenna, is about 2-32 (λ=3.2 cm at 9.4 GHz). The radome characterization was performed using a rectangular waveguide 111c and an ABS rod designed to operate at X-band. A perspective view of an exemplary probe antenna 110 utilized in accordance with the present disclosure, as well as an electric field level simulated in HFSS having a far-field region 111d is shown in FIG. 8. FIG. 9 shows a plotted graph of the far-field radiation pattern measured at 9.4 GHz. The 3 dB-beam-width is about 18°.

3. Radome.

The bullet-shaped radome of the PX-1000 radar was employed for radome characterization. This radome has physical external dimensions of about 87.23" in diameter, about 75.25" in total height, and about 31.63" for the height of the cylindrical base. The panels that comprise the radome are made of honeycomb hexagons which have different patterns along the directions of x and y, resulting in the distance between two consecutive hexagons being different in vertical and horizontal directions. Therefore, the distribution of hexagons and the presence of non-homogeneity (dark areas) could affect the level of polarization in the H- and V-planes and their related attenuation. Two panels located next to each other could introduce further attenuation, particularly at the junction. Other issues impacting the attenuation are due to flaws or damage in the radome that may not visible to the eye.

4. Robot.

In order to perform the radome characterization, the antenna was mounted on a device which would allow rotation in azimuth and elevation while keeping the probe antenna orthogonal to the surface of the radome. In one non-limiting embodiment, a six-axis robotic arm (for instance, by way of example only, a UR3 robot commercially offered for sale by Universal Robots) was employed to substitute for the radar pedestal 6. The robot is versatile in that it allows for characterization of radomes with different shapes. With the probe mounted on it, the UR3 has been programmed to perform movements based on spherical coordinates in agreement with the geometry of the radome, and to have a full scan in azimuth and elevation. The robot has been mounted in the position where the radar pedestal of the PX-1000 would sit. In this way, the UR3 was positioned in the geometric center of the cylinder/sphere in order to avoid misalignment during measurements.

B. Preliminary Results.

Figure 7A:
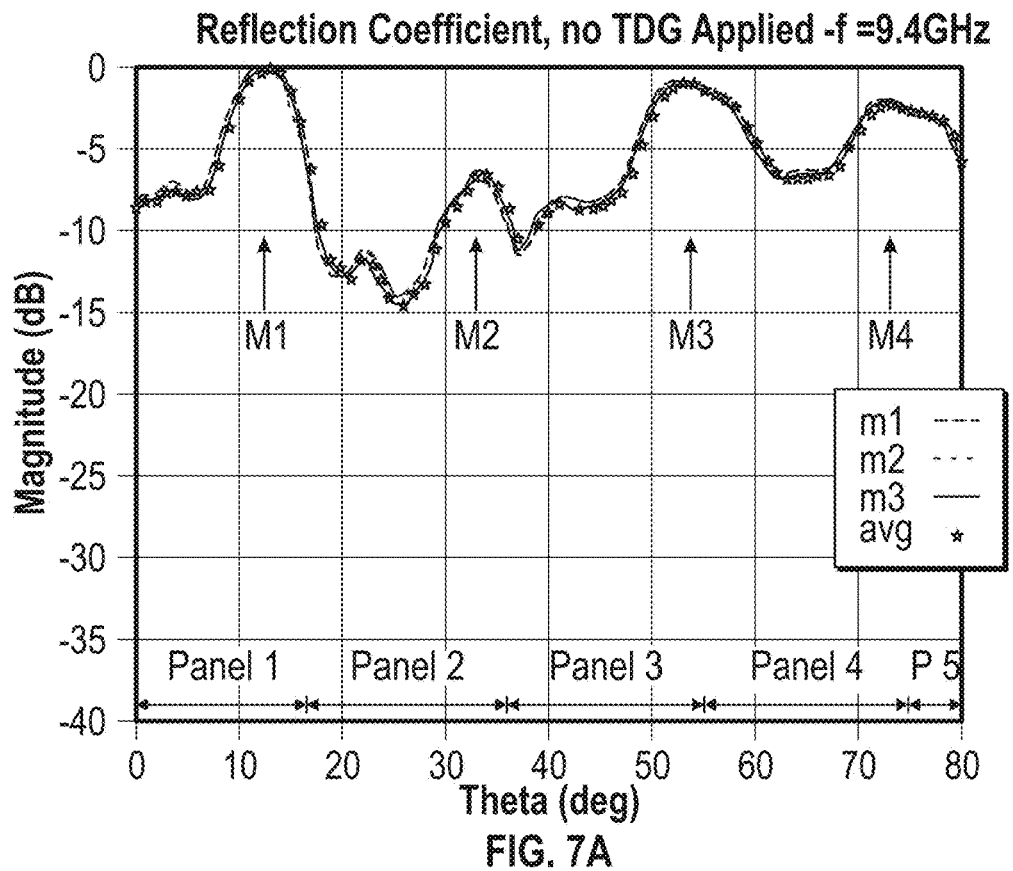
FIG. 7A shows a graphical plot of the reflection coefficient in which no TDG is applied which is obtained from the laboratory setup shown in FIG. 6 in which four metal strips are positioned at $\theta=17°$, $37°$, $57°$, and $77°$.
Figure 7B:
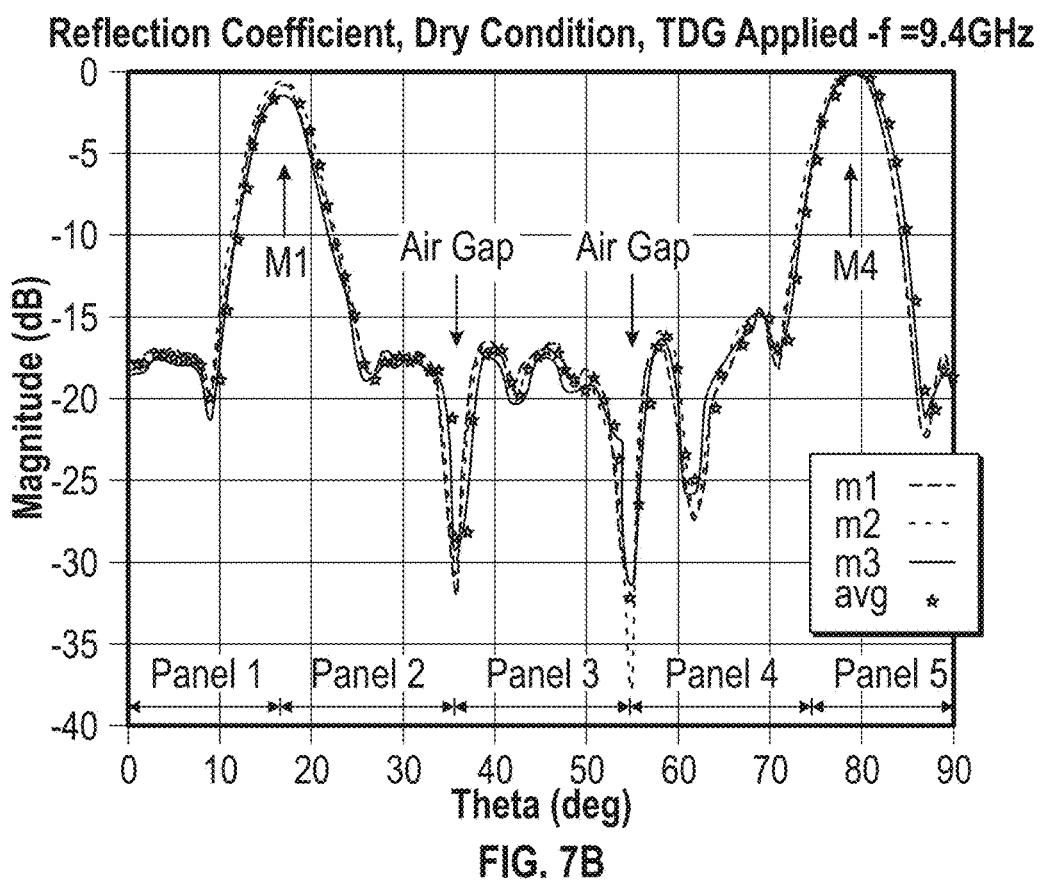
FIG. 7B shows a graphical plot of the reflection coefficient in which TDG is applied which is obtained from the laboratory setup shown in FIG. 6 in which two metal strips are positioned at $\theta=17°$ and $77°$.

Preliminary results were obtained for the laboratory setup illustrated in FIG. 6. Such results were obtained at about 9.4 GHz. The measurements were performed more than one time and under the same conditions, to assure the reproducibility of the experiment, and to compare the results of each test to the average. The first experiment was performed without applying the TDG. Four metal strips were placed in the air gaps located between the consecutive panels to provide reference in the measurement, as shown in FIG. 6). The purpose of this experiment was to evaluate if a satisfactory measurement of the reflections could be achieved without using the filter in the time domain. The reflections coming from the metal strips were expected to be stronger than the ones generated from the rest of the setup, and therefore could be visualized without TDG. The results for this embodiment are shown in FIG. 7A. When tested, although the metal strips provided high reflection of the signal compared to the ones produced by the radome panels, the multiple paths generated from other generic surfaces of the environment strongly affected the measurements. A second experiment repeated the first, but with this embodiment utilizing TDG. In this test, the metal strips M2 and M3 were removed, exposing the air gaps between the panels. The results for this embodiment are shown in FIG. 7B. Comparing the results from the two scenarios, the advantages of employing the TDG analysis during the measurements is validated.

C. Experimental Results.

The tests performed in the bullet-shaped radome of the PX-1000 weather radar are discussed hereinbelow. The tests were executed applying TDG, for both H- and V-polarizations and considered the radome under dry and wet conditions. The experiment was conducted by measuring one polarization at a time, performing a 360° azimuth scan for each cut in elevation. The range in elevation varied from about 0° to about 80°. The angle resolutions in azimuth and elevation were about 1° and about 5°, respectively. The dry radome investigation is useful for detection of damages, or non-homogeneous patterns present on the surface that are not necessarily detected by visual inspection. Studies done under wet conditions took place under natural rain. A complication of performing measurements under natural rain conditions is that the full radome characterization, with the mentioned angle resolution, required a long time to be executed (about 10 mins per azimuth scan). For the measurement to be completed, the rain had to last long enough. In the data presented, the storm lasted a sufficient duration to permit full characterization of the radome. However, the rain rate was not constant during the test, which means that scans at different elevation angles might have measured the reflection coefficient under different rain intensities. Also, the rain rate could have changed from the time the test of the first polarization was performed until the time the test of the second polarization was conducted. Before starting the experiments, a hydrophibic silicon polymer sold under the trademark "Rain-X" (referred to herein as "Rain-X") was applied to a quarter of the radome sphere. Rain-X is a commercially available substance to increase the hydrophobic property of surfaces. Rain-X was used only on part of the radome for the purpose of comparing different water distributions on the surface. Water was expected to be substantially present as droplets or rivulets on the Rain-X sector, and as a film on the remainder of the radome. It was expected that the two areas would respond differently to the incident signal. The hydrophobic effect due to Rain-X, was thought to potentially have more impact on the H-polarization, since it prevents film formation and keeps water in droplets or rivulets. Results for each of the cases are presented showing the reflection coefficient (R) for H- and V-polarizations, and the difference between the two polarizations: RH,dB−RV,dB. A vertical metal strip was placed on the outer surface of the radome to provide reference during the tests. The tests were performed at 8.8 GHz.

1. Dry Results.

Figure 10A:
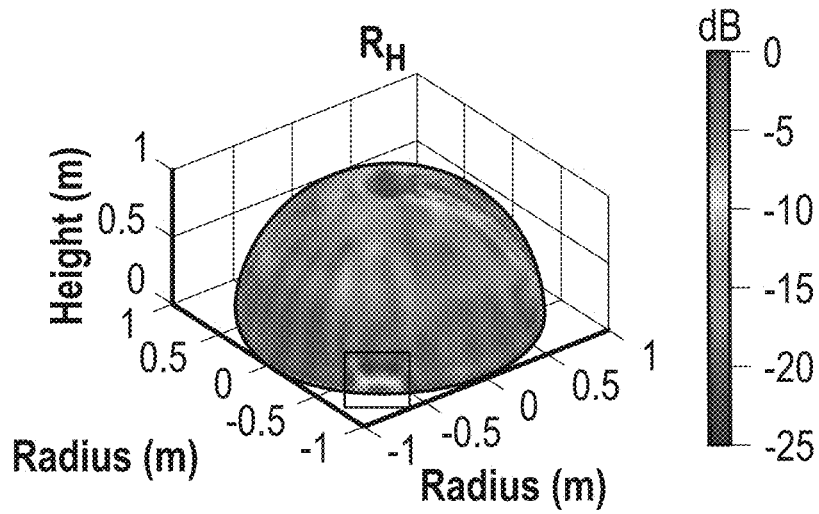
FIGS. 10A-10L show graphical plots of the reflection coefficient measurement for the spherical portion of the radome under dry condition (FIGS. 10A-10F) and wet conditions (FIGS. 10G-10L). The columns further show H-polarization, V-polarization, and the difference between the two polarizations.
Figure 10B:
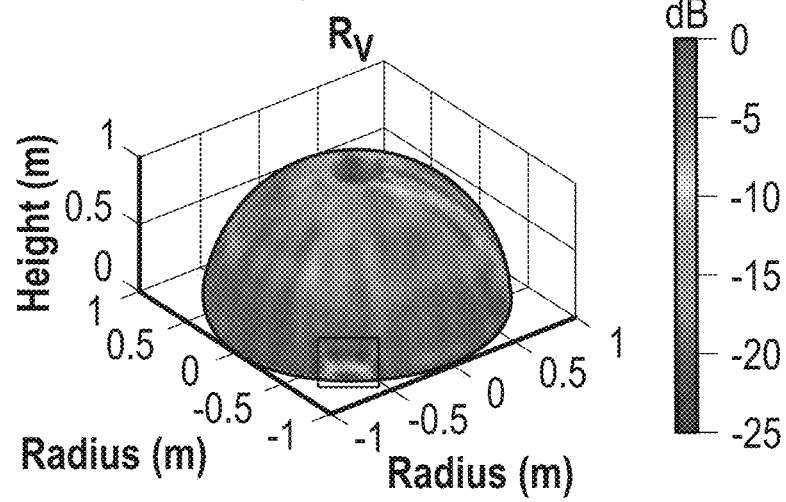
Figure 10C:
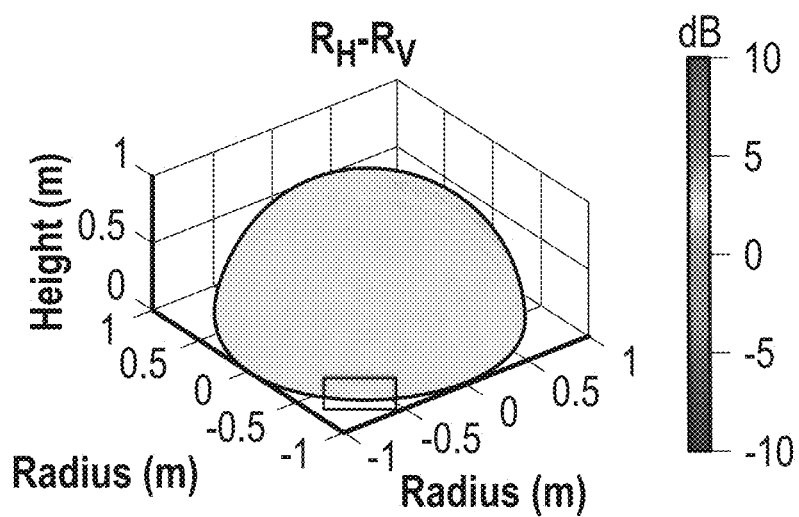
Figure 10D:
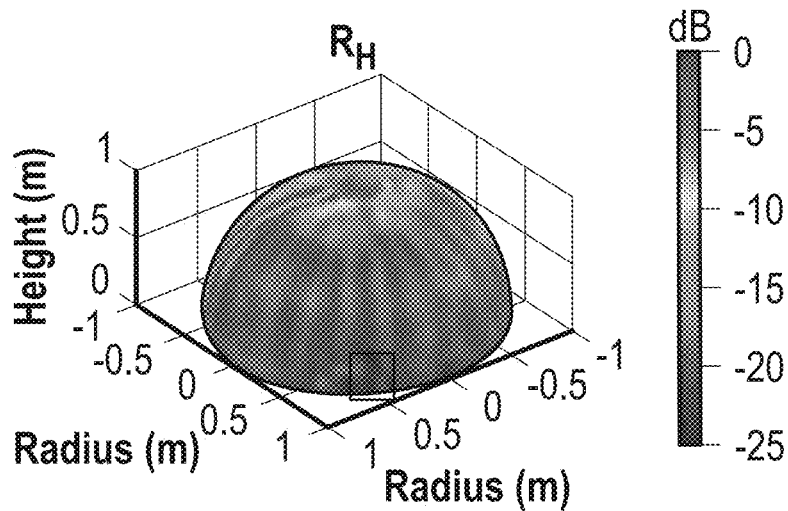
Figure 10E:
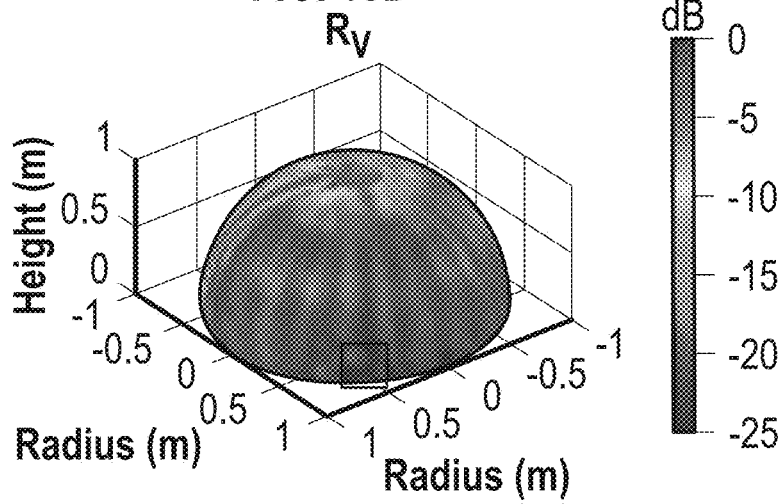
Figure 10F:
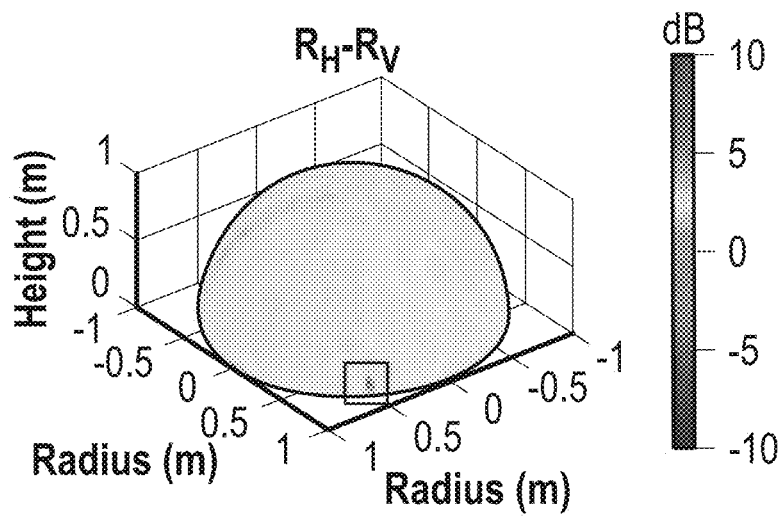

The results for the spherical part of the radome are shown in FIGS. 10A-10F. As shown in FIGS. 10A and 10B, a fabrication imperfection (i.e., an air gap), not detectable by visual inspection, is noticeable at the base of the sphere, but only present on one side of the radome. The reflections due to this flaw, are generated by diffraction that occurs at the border of the air gap. The differential reflection coefficient is shown in FIGS. 10C and 10F.

2. Wet Results.

Figure 10G:
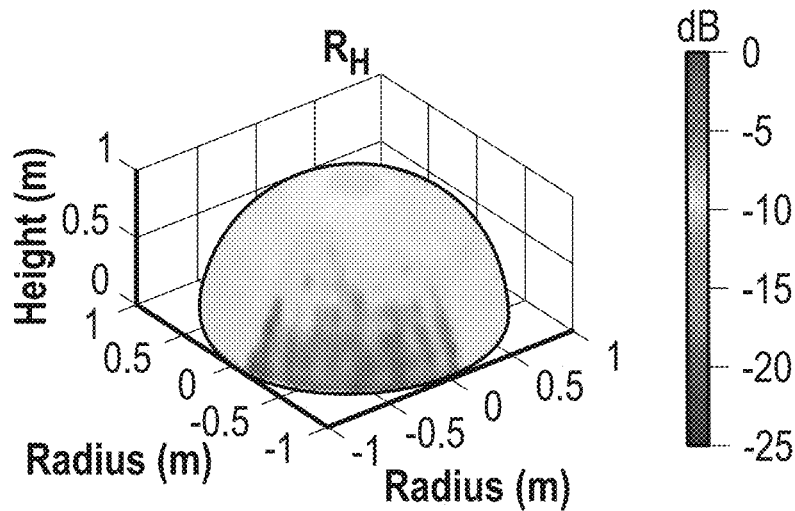
Figure 10H:
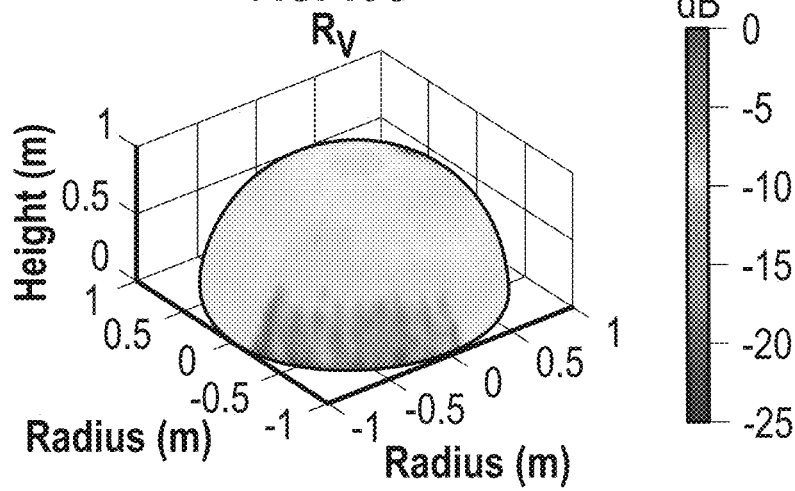
Figure 10I:
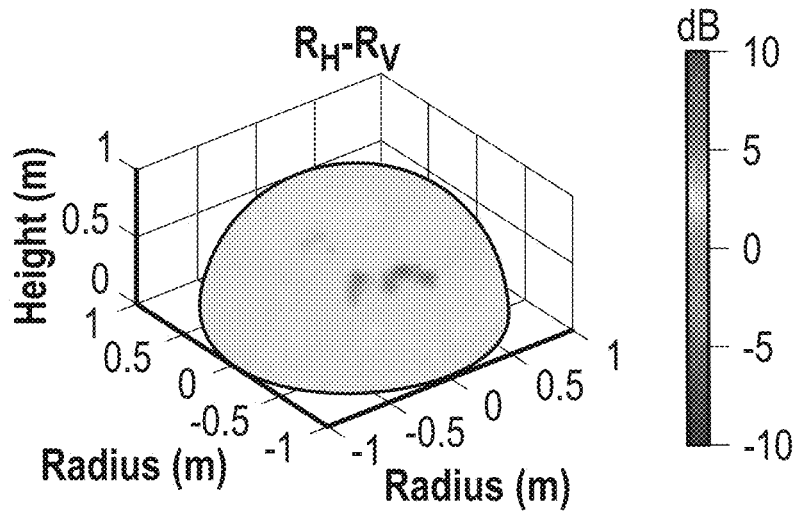
Figure 10J:
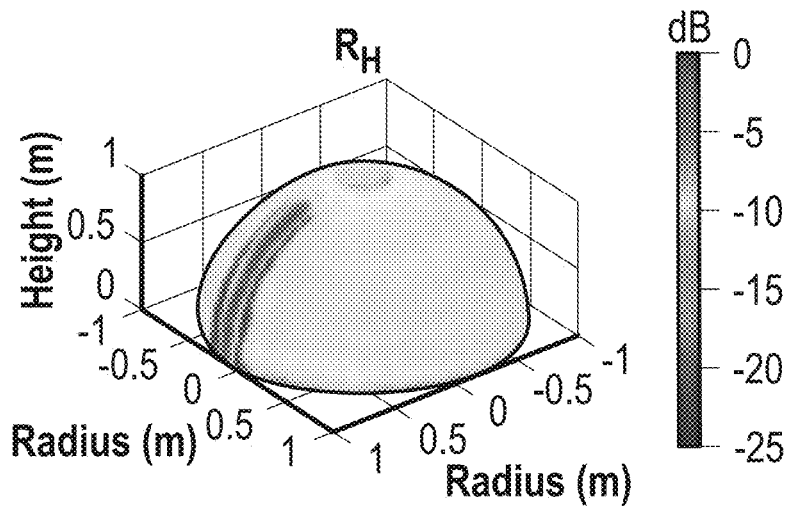
Figure 10K:
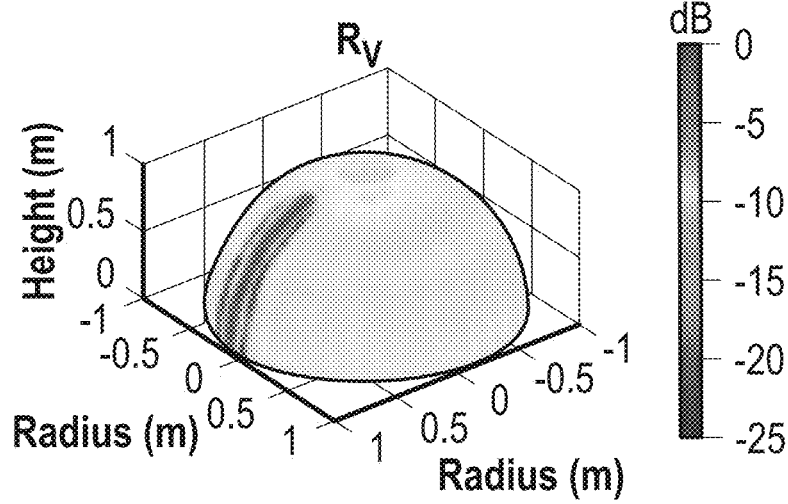
Figure 10L:
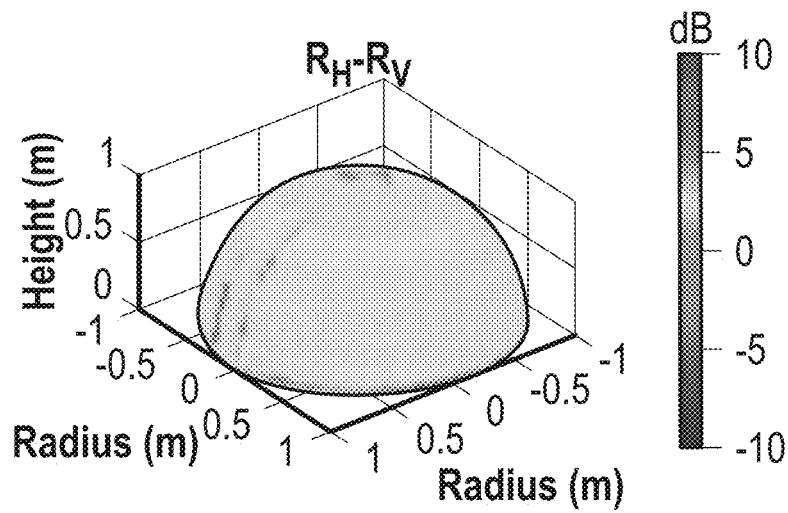

The full radome characterization was performed for one polarization, then the test for the other polarization was performed. Results of the rain test are presented in FIGS. 10G-10N. The Rain-X effect is highlighted in FIGS. 10G and 10H, in contrast to the other side of the radome shown in FIGS. 10L and 10M. Also, it was noticed that at the top of the spherical part of the radome ($\theta\sim=800$), without any distinction among the different sectors, the level of reflections is higher. At such elevations the component of the gravity force is smaller than at lower elevations, causing the water to stay agglomerated and in bigger drops. The differential reflection coefficient is shown in FIGS. 10I and 10N. A pattern of parallel rings is noticeable and indicates a stronger difference between the two polarizations. Considering that the rain intensity could have changed during the test, the pattern of parallel rings seems to be consistent and constant in azimuth, and therefore it should not be assumed that it is associated with rain rate changes.

Example 2: Radome Characterization Utilizing a Dielectric Rod Antenna Employed as a Probe, a Reflectometer, and a Time Domain Gating (TDG) Analysis Implemented in the Reflectometer A. Probe: Dielectric Rod Antenna To fully characterize the radome and then achieve high spatial resolution, an antenna with high gain and narrow beam-width was utilized via the use of a dielectric antenna. This type of antenna was suitable as a probe, also, its small size (low profile) allows for mounting it on the existing antenna feed of a reflector, without affecting the radar operation.

The dielectric antenna belongs to the family of surface-wave antennas and comprises and/or consists of a dielectric rod placed in the waveguide aperture. The portion of the dielectric located inside the waveguide is called the feed taper. The feed taper has the function of providing matching at the waveguide-dielectric transition, increasing the efficiency of excitation. The body taper, another part of the dielectric antenna, mainly reduces the level of sidelobes and also increases the bandwidth. The terminal taper, located at the tip of the dielectric antenna, improves the matching between the dielectric antenna and air, thereby decreasing the reflected surface wave level. If the beam is narrower, it is possible to use a smaller radome panel for characterization, since a narrow beam is more easily confined in the radome sample and no fringing effects from the borders occur. The far-field distance for a dielectric rod antenna is about 2-3λ ($\lambda=3.2$ cm at 9.4 GHz). Considerations regarding the far-field distance of the probe are important, because all the radar products are obtained in the far-field region of the dish reflector.

Figure 14A:
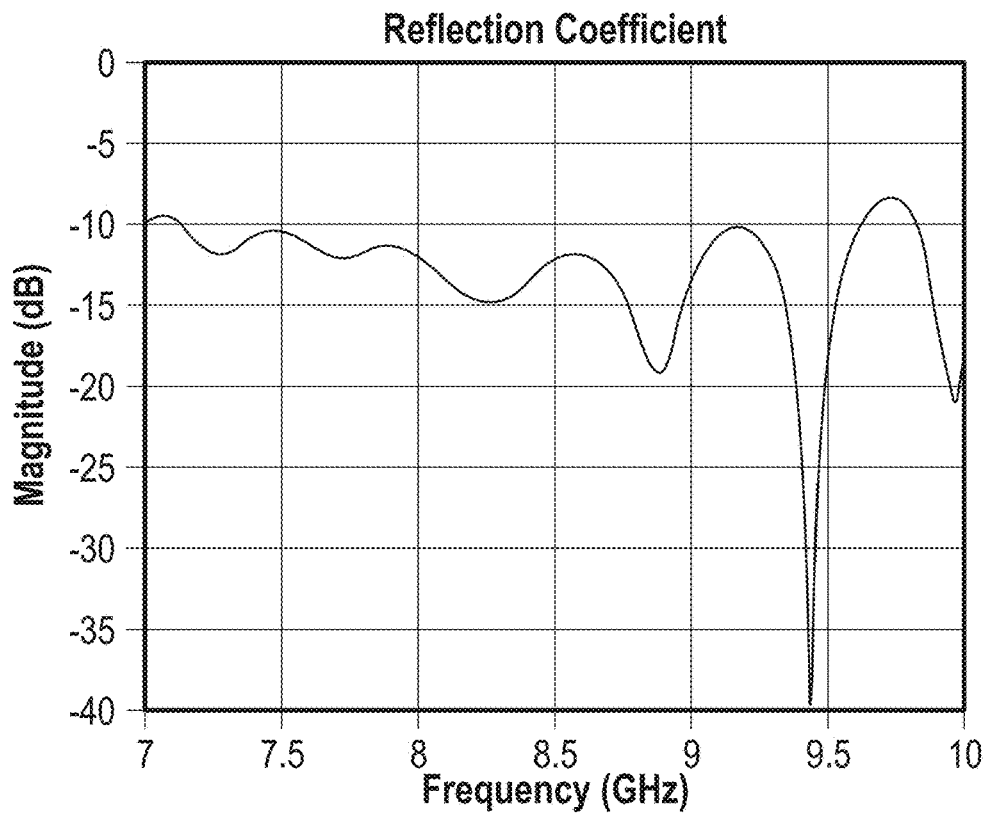
FIG. 14A shows a graphical plot of the reflection coefficient associated with a non-limiting embodiment of a dielectric rod antenna constructed in accordance with the present disclosure.
Figure 14B:
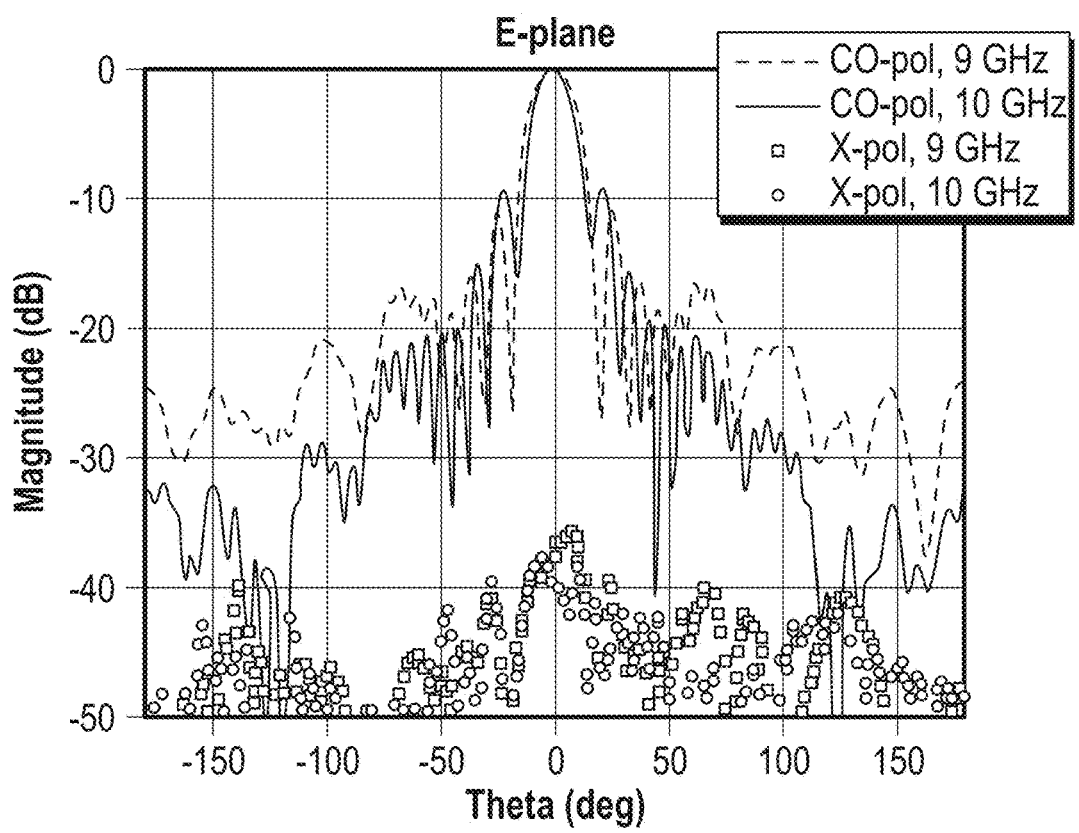
FIG. 14B shows a graphical plot of the radiation pattern of a non-limiting embodiment of a dielectric rod antenna constructed in accordance with the present disclosure measured in a far-field chamber at 9 GHz and 10 GHz for the E-plane.
Figure 14C:
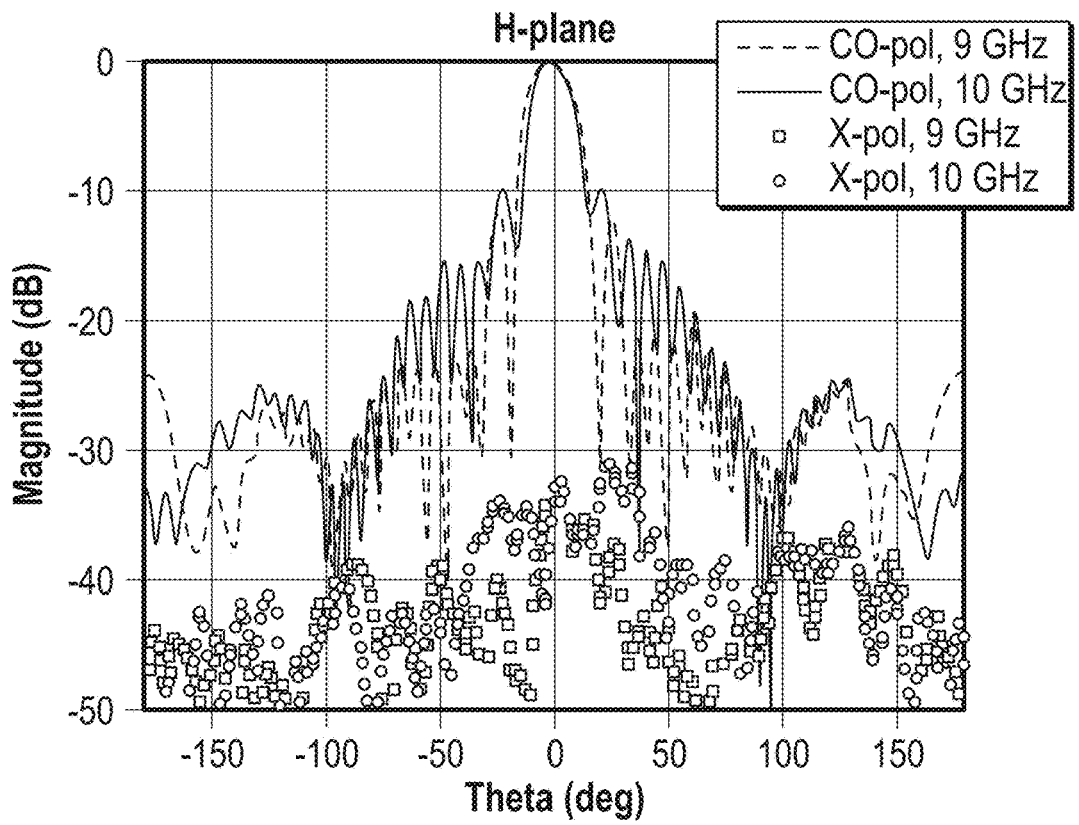
FIG. 14C shows a graphical plot of the radiation pattern of a non-limiting embodiment of a dielectric rod antenna constructed in accordance with the present disclosure measured in a far-field chamber at 9 GHz and 10 GHz for the H-plane.

In the present research, the probe antenna for the radome characterization was a rectangular waveguide (commercially available) and an ABS rod optimized to operate at X-band (designed in HFSS and in-house 3D printed); however, a person having ordinary skill in the art should readily appreciate that the probe antenna can be of any shape and operate in any band that accomplishes the present disclosure. The probe antenna was then obtained by wedging the dielectric rod inside the waveguide. As previously detailed, FIG. 8 shows a photograph of the probe antenna employed in this study is presented. In FIG. 14A, the electric field level simulated in HFSS is shown. In FIGS. 14B and 14C, the reflection coefficient is plotted, and at the bottom is the far-field radiation patterns measured at 9 and 10 GHz. The radiation pattern of the proposed probe antenna, presents a 3 dB-beam-width of 18°, a probe antenna with such a narrow beam-width makes it suitable for the current study because it allows achievement of a good spatial resolution. The gain of the probe antenna, simulated in HFSS, is 15 dB. Measurement of the gain are not available, however given the good agreement between simulations and measurements, the value provided by the simulator is considered trustful.

B. Reflectometer and Time Domain Gating (TDG)

One novel aspect of the present disclosure is that characterization of the radome is based on the reflection coefficient rather than on the transmission coefficient. For this purpose, in one-nonlimiting embodiment, a R140 1-Port vector network analyzer (VNA) reflectometer (commercially offered for sale by Copper Mountain Technologies) was utilized. This device has several applications including adjustment and testing of antenna-feeder devices and use in automated measurement systems. The VNA reflectometer works in the frequency range of about 85 MHz to about 14 GHz, and is designed for operation with an external PC which also feeds the VNA reflectometer. The test port provides the incident signal as the output. To accomplish the reflection measurement, the VNA reflectometer compares the received (reflected) signal with the source signal. An important aspect of the reflectometer is to be able to operate in time domain using TDG analysis. The pulse repetition frequency of the VNA R140 is about 30 KHz and the peak power was set to −10 dBm for the measurements later described. The frequency accuracy of the VNA is ±25×10-6 ppm and the measurement accuracy is summarized in Table 2 below.

TABLE 2

Measurement accuracy of the R140 VNA reflectometer.

| Measurement | Accuracy (magnitude/phase) |
|---|---|
| −15 dB to 0 dB | 1.0 dB/7° |
| −25 dB to −15 dB | 1.5 dB/10° |
| −35 dB to −25 dB | 5.0 dB/29° |

The concept behind time gating is to use a filter in the time domain. This time filter works exactly the same as a filter in the frequency domain. TDG applications have various uses across disciplines. They have been used in the past by researchers to remove discontinuities or reflections in a free-space context and for tuning purposes. (Archambeault, B., S. Connor, and J. C. Diepenbrock, "Time Domain Gating of Frequency Domain S-Parameter Data to Remove Connector End Effects for PCB and Cable Applications," IEEE International Symposium on Electromagnetic Compatibility, IEEE, pp/ 199-202, 2006). They have also been used for radiation pattern measurements, and also for calibration in free-space measurements. (Burrell, G. A. et al., supra; Fordham, J., "Use of Time Domain Gating in Spherical Near-Field Measurements," 14th International Symposium on Antenna Technology and Applied Electromagnetics and the American Electromagnetics Conference (ANTEM-AMEREM), IEEE, pp. 1-4, 2010; Ghodgaonkar, D. K. et al., supra; Wayapattanakorn, C., and C. G. Parini, "Theoretical and Experimental Investigations of Using Time Domain Gating in Antenna Pattern Measurements," 8th International Conference on Antennas and Propagation, IEEE, pp. 327-330, 1993; and Zaho et al., supra).

The presently disclose and/or claimed inventive concept(s) employ TDG to more accurately investigate reflections produced from the source of interest without contamination from the reflections generated by the surrounding environment.

Figure 15:
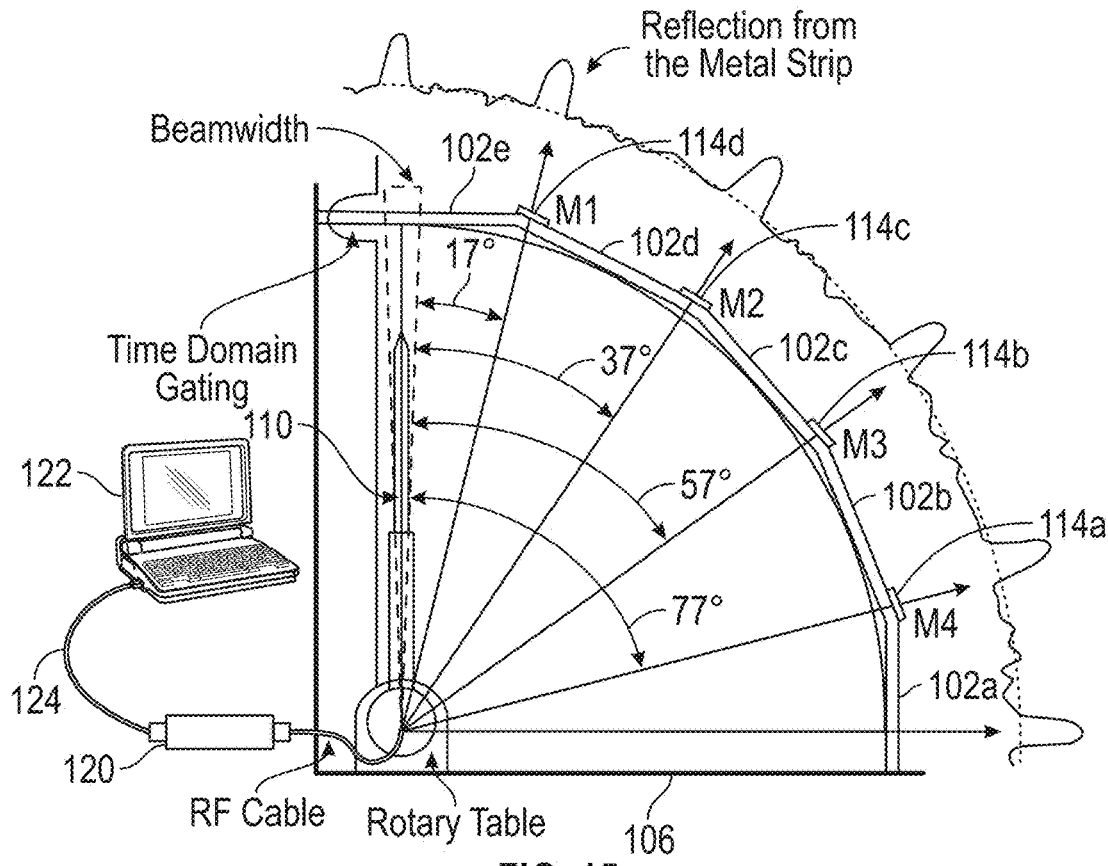
FIG. 15 shows a partial perspective, side elevational view of a non-limiting embodiment of a laboratory setup constructed in accordance with the present disclosure for the conductance of various measurements associated with the radome characterization.
Figure 16A:
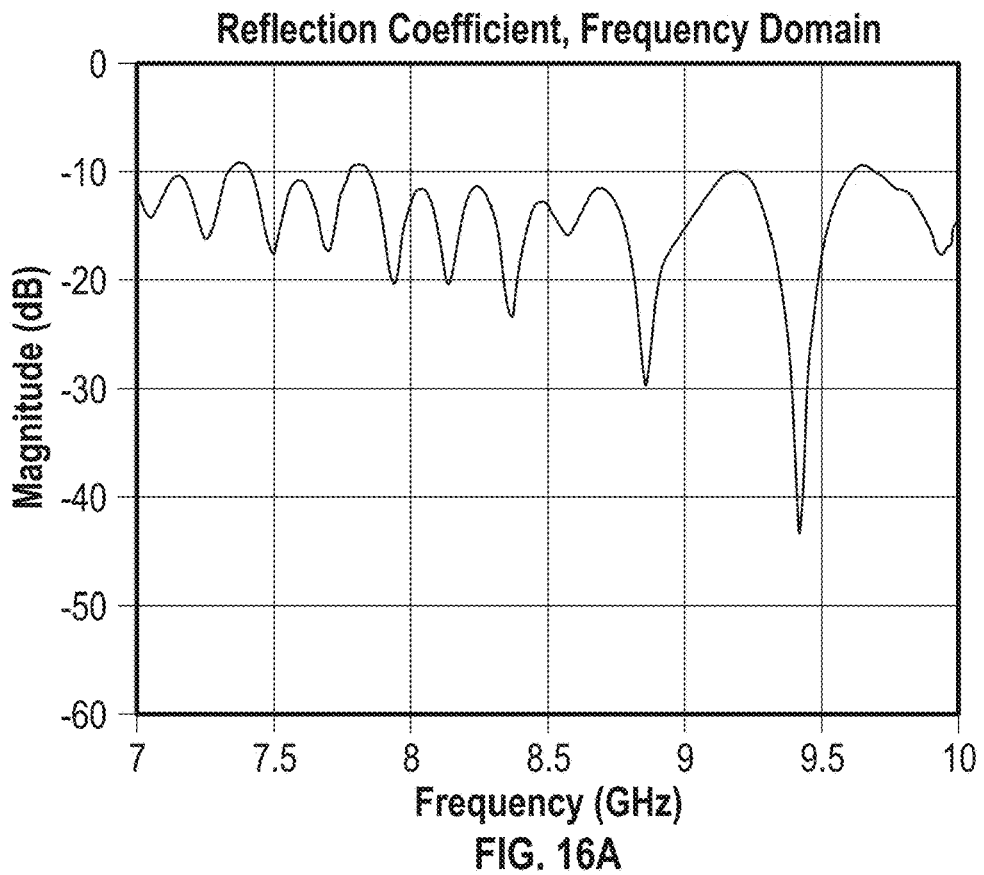
FIGS. 16A-16B show graphical plots of reflection responses produced from the laboratory setup of FIG. 15 both in the frequency domain (FIG. 16A) and the time domain (FIG. 16B).

The implementation of the TDG to the laboratory setup used to validate the proposed concept, is herein discussed. A non-limiting embodiment of the laboratory setup is shown in FIG. 15. With the dielectric probe antenna placed at θ=0°, the measured reflection coefficient is plotted in FIGS. 16A and 16B in the frequency (FIG. 16A) and time (FIG. 16C) domains. The frequency plot shows the antenna band-width affected by the reflections coming from the radome panel immediately above it, parts of the setup, and the surrounding external environment. It is very difficult to separate and establish which reflections are due to the radome panel (useful part) and which reflections are due to the rest of the environment (undesired reflections). The time domain plot (FIG. 16B) shows the reflections (peaks) versus the "distance" in time VNA-target. The electromagnetic distance, expressed in time, takes into account the guided propagation of the signal inside the RF cable, the waveguide and dielectric rod of the antenna, and the free space propagation.

Figure 16B:
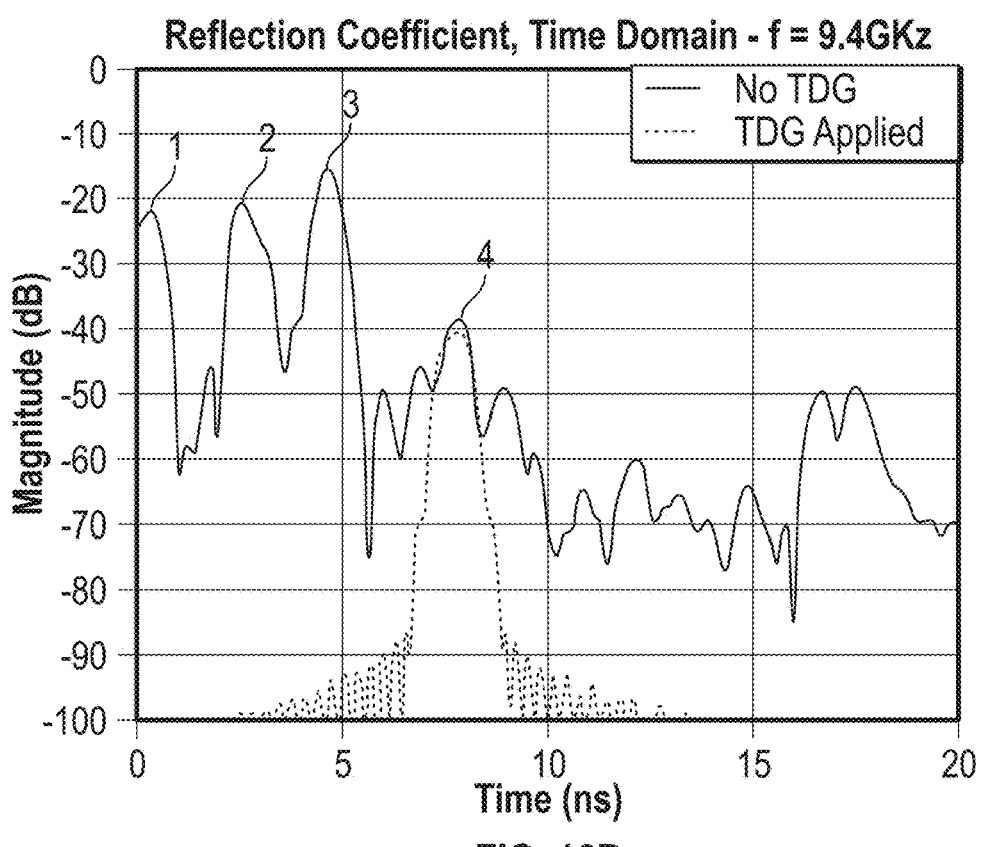

Analyzing the time domain response without applying the TDG represented by the blue curve in FIG. 16B, it is possible to distinguish the reflections and their related sources since they are expressed versus the distance in time. The three dominant peaks (1, 2, and 3) located approximately at 0.3, 2.5, and 4.6 ns are generated by impedance mismatches. The reference plane, which corresponds to 0 ns, is located at the port of the reflectometer. A thru, reflect, line (TRL) calibration is necessary to remove the reflection (peak) due to the cable. Peak 1 is created by the cable mismatch (no TRL calibration applied), peak 2 is due to the mismatch introduced by the waveguide, and peak 3 is produced by the waveguide-dielectric rod junction. Peak 4, located at about 7.8 ns, represents the reflections generated from the radome placed at about 12.5 cm above the antenna. Other minor peaks are visible at times >7.8 ns and are the result of multiple contributions from the environment that are received together. The plot in the time domain has been obtained using a frequency resolution of 3 GHz, since in the frequency plot (FIG. 16A), a 3 GHz-range (7-10 GHz) was used to display the curve. Defining the start and final cut-off times of the filter, equal to 7.5 and 8 ns respectively ($t_{d1}$ and $t_{d2}$ in FIG. 3B), the result is the red curve shown in FIG. 16B. The result of eliminating all the undesired peaks provides a purer reflection coefficient in the frequency domain (no fluctuations).

Figure 17:
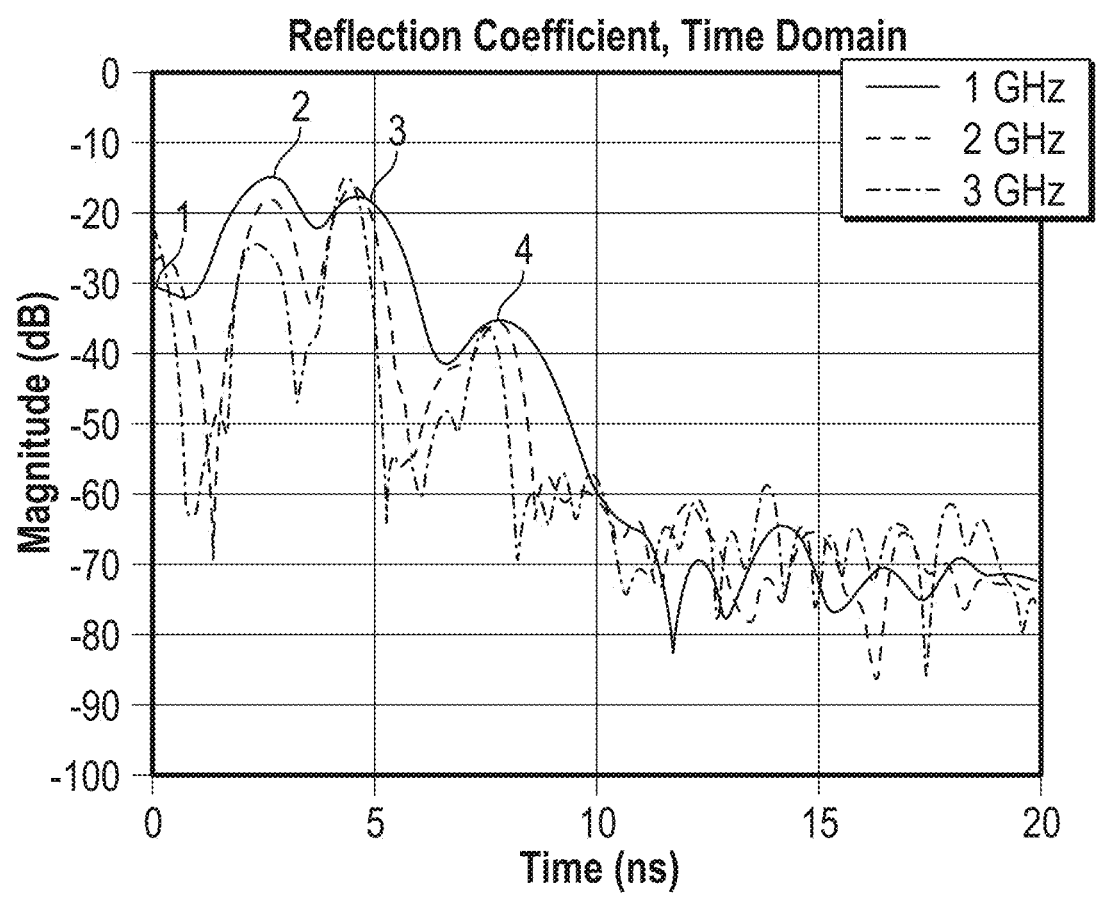
FIG. 17 shows a graphical plot of a resolution comparison in the time domain for different frequency bands in which peaks 1, 2, and 3 represent cable, waveguide, and dielectric rod impedance mismatches.

Bandwidth (B) plays an important role in the time domain. FIG. 17 presents a comparison of resolutions for different frequency spans in the laboratory setup scenario. It can be immediately observed that increasing the band-width improves the resolution.

Figure 18A:
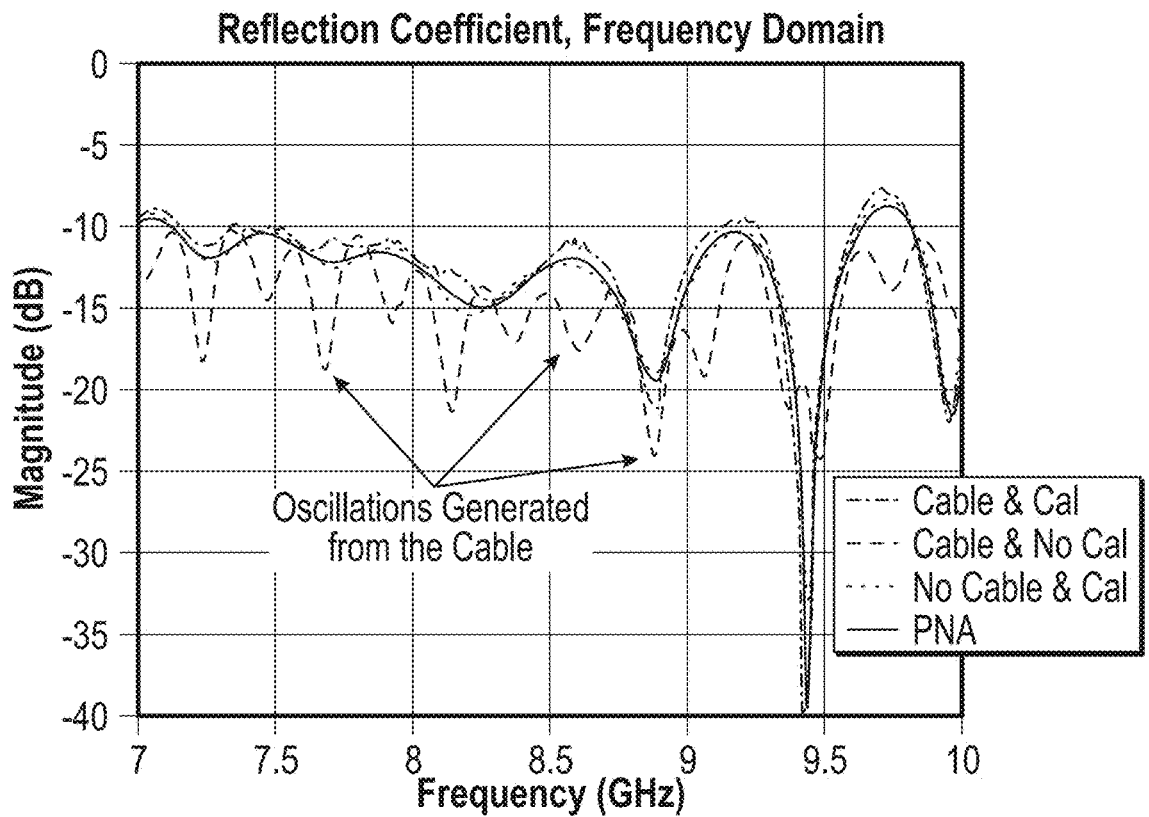
FIGS. 18A-18B show graphical plots of thru, reflect, line (TRL) calibration effects using a 3 GHz bandwidth resolution in the frequency domain (FIG. 18A) and the time domain (FIG. 18B)
Figure 18B:
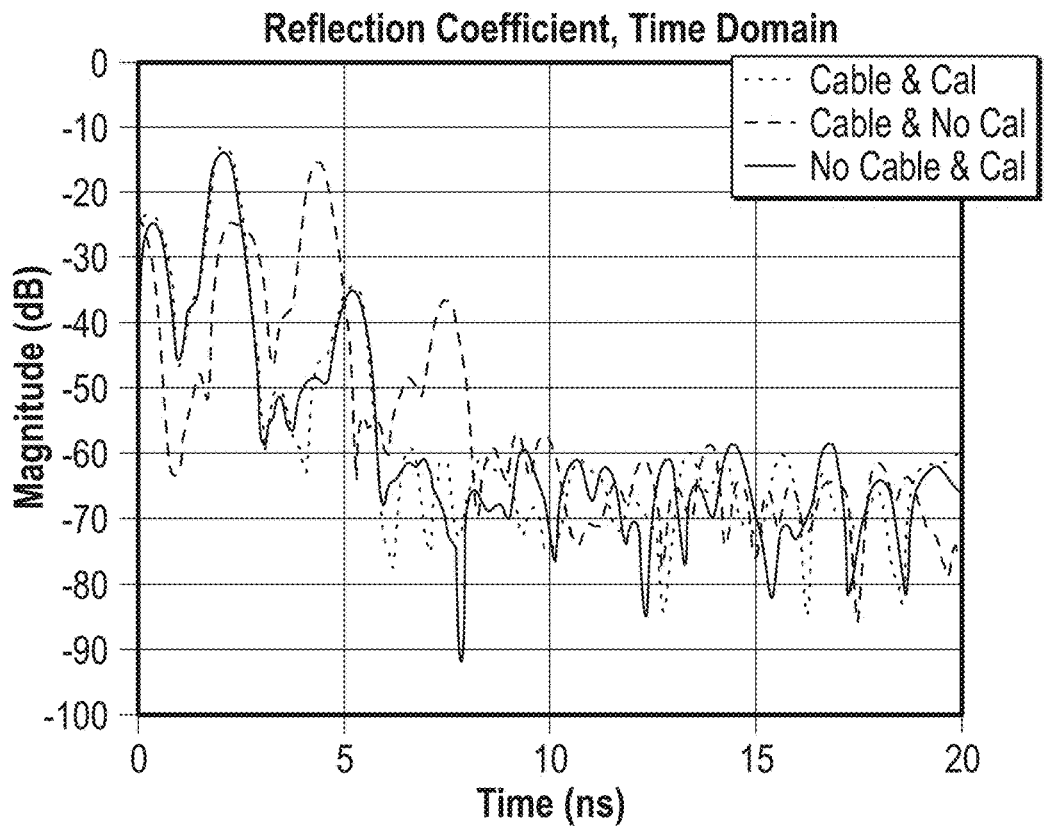

The effects of the mismatches due to cable, waveguide, and dielectric rod (previously described), are presented in FIGS. 18A and 18B. In these figures, three cases are considered: one using an ordinary RF cable for the antenna-reflectometer connection with the TRL calibration applied (blue curve); the second using the cable but without applying the TRL calibration (black curve); and the last case without using the cable but connecting the VNA directly to the antenna and applying TRL calibration (green curve). These three cases are presented in both frequency (FIG. 18A) and in time domain (FIG. 18B). In the frequency plot the cases have been compared with the reflection coefficient of the antenna measured with a Keysight PNA (red curve) for the purpose of reference. The oscillations produced by the RF cable (black curve) are clearly noticeable. When applying the TRL calibration, the plane of reference is shifted to the output of the cable, and then the cable reflection (peak 1) is moved to the negative axis of the time. Removing such a peak, the curve that was obtained by using the cable with TRL calibration applied (blue curve) matches with the green curve where no cable was used and it also matches with the reflection coefficient in the frequency domain of the antenna measured with a Keysight PNA.

C. Laboratory Experimental Results

To validate the present disclosure, a non-limiting embodiment of a laboratory setup was built to enable the testing that provided preliminary results. In FIG. 15, a schematic representation, and in FIG. 6, a line drawing of a photograph of the laboratory setup, are shown. As shown in FIG. 15, the non-limiting embodiment of the laboratory setup is composed of five radome panels 102*a-e* arranged to approximate a quarter of circumference. The rotary table/motor 106 with the probe antenna 110 mounted on the rotary motor 106 is located at the origin of the circumference. The panels 102*a-e* are placed abutting each other, however, small air gaps between the panels 102*a-e* remain, and the panels 102*a-e* are located at $\theta=17°$, $37°$, $57°$, and $77°$ with respect the initial position of the rotary motor 106. A wooden support 112 was used to maintain the radome panels 102*a-e* in a stable position above the probe antenna 110 and to secure the rotary motor 106 as well.

The radome panel stack-up is composed of an inner layer of foam (about 6.62 mm) and an outer layer of Teflon (about 0.53 mm). Metal strips 114*a-d* were placed on the top outer part of the radome 100 in the initial position ($\theta=0°$) of the rotary motor 106 and in the air gap locations for a purpose of providing a reference for the measurements. As shown in FIG. 15, the probe antenna 110 is placed at the start position (broadside, $\theta=0°$) of the rotary motor 106, the probe beamwidth is shown in green, the TDG is displayed in red and centered at the radome location, and the predicted results for reflection measurement are shown. Both a flat response of the reflection coefficient from the radome panel, and a strong reflection coefficient peak generated from each metal strip located at the junction between two consecutive panels were expected.

Figure 19:
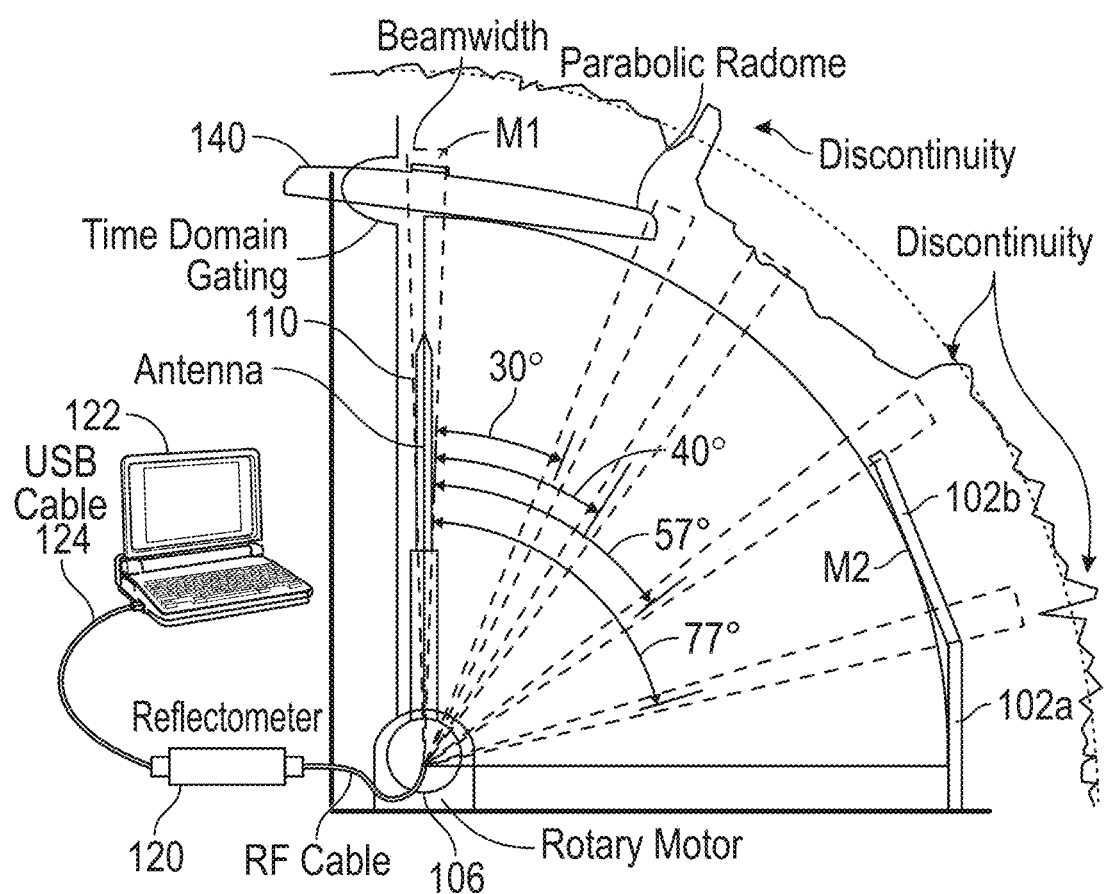
FIG. 19 shows a partial perspective, side elevational view of a non-limiting embodiment of a laboratory setup constructed in accordance with the present disclosure for the conductance of various measurements associated with the radome characterization.

Referring now to FIG. 19, the laboratory setup was modified to characterize an operational radome that is not flat but presents a curvature. Three of the radome panels 102*e*, 102*d* and 102*c* were removed and a Ku-band radome 140 (also applicable at X-band) replaced the three removed radome panels, leaving a large air gap between the Ku-band radome 140 and the remaining two radome panels 102*a* and 102*b*. The Ku-band radome 140 has a circular shape with about a 60 cm-diameter and presents a small angle curvature from the center to the peripheral area, but in the borders, the termination is cornered so it can be mechanically fixed to the reflector.

1. Case 1: Five-Section Uniform Radome

Figure 20A:
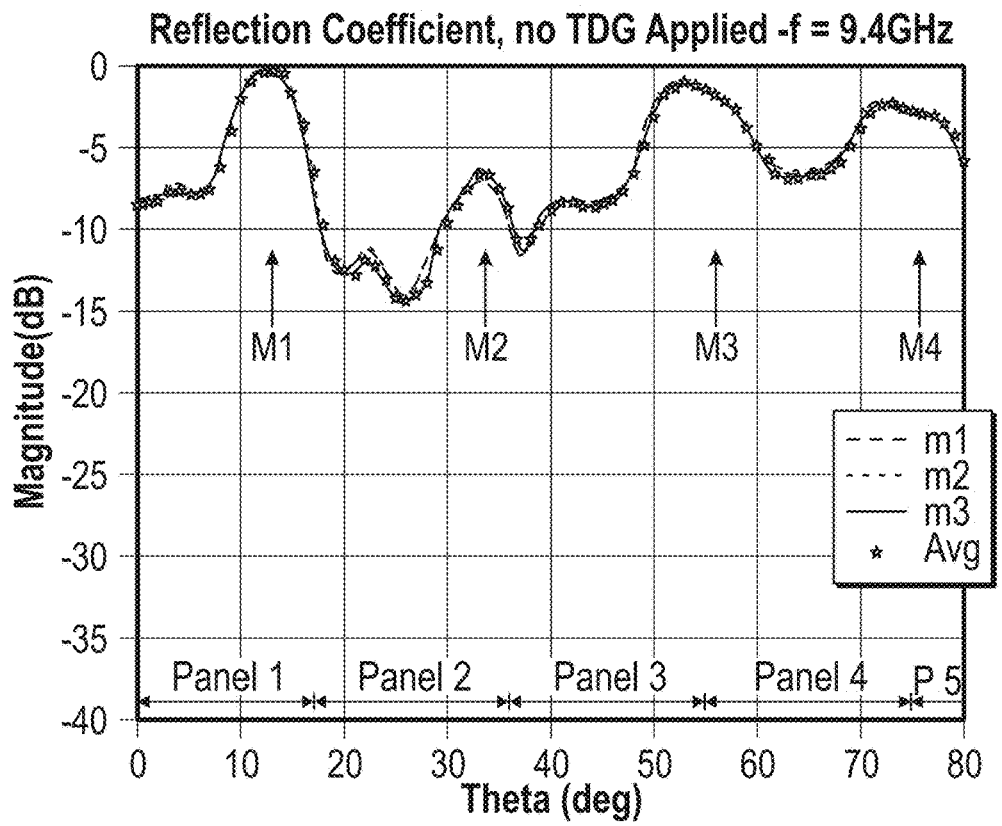
FIGS. 20A-20C show graphical plots showing the measured reflection coefficient versus the tilting angle ($\theta$) for the laboratory setup shown in FIG. 19 in which results utilizing four metal strips positioned at $\theta=17°, 37°, 57°,$ and $77°$ without applying TDG analysis is shown (FIG. 20A), results utilizing two metal strips positioned at $\theta=17°$ and $77°$, with TDG analysis applied (FIG. 20B), and a comparison of the results for dry and wet scenarios (FIG. 20C).
Figure 20B:
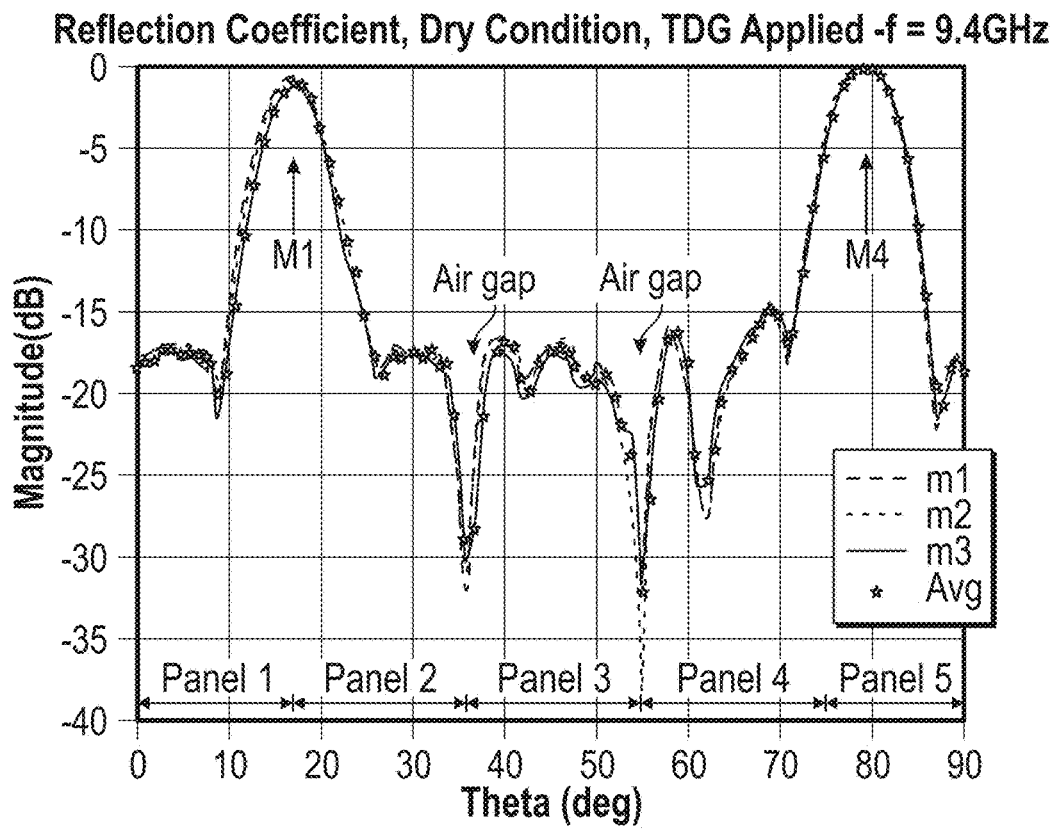
Figure 20C:
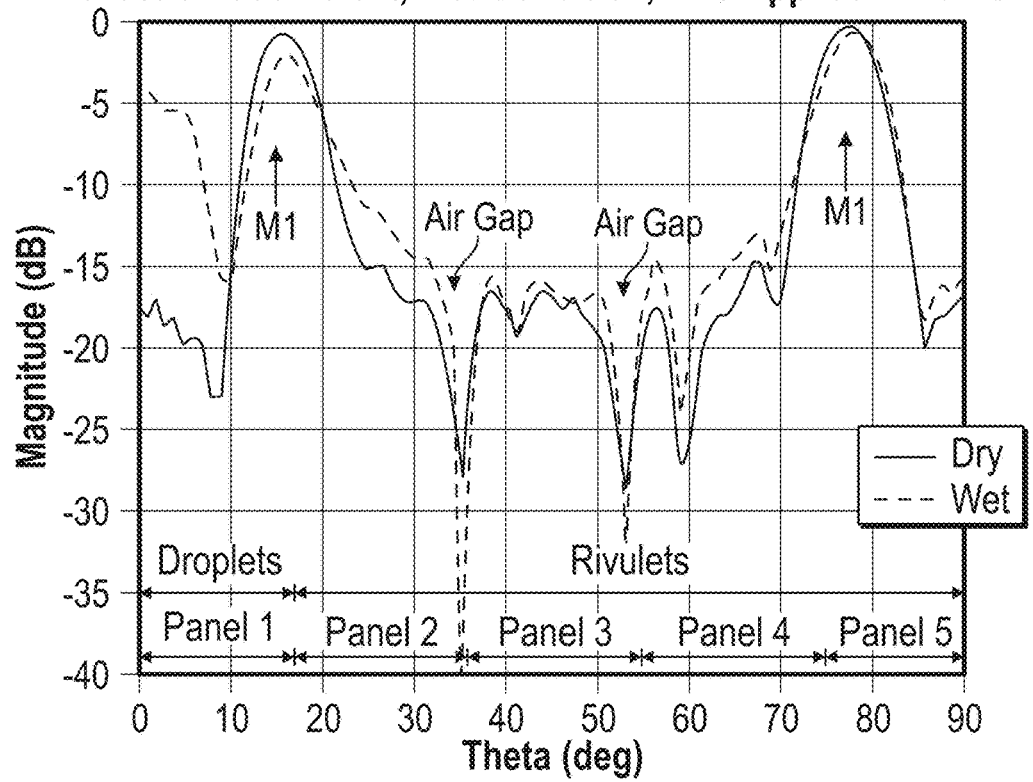

The results obtained from the laboratory setup shown in FIG. 15 are displayed in FIGS. 20A-20C. Measurements were taken at 9.4 GHz using a 3 GHz-bandwidth (7-10 GHz) to have a good resolution in time domain. The tests were performed more than one time, under the same conditions, to assure the reproducibility of the experiment, and to compare the results of each test to the average. In FIGS. 20A-20C, m1, m2, m3, and average represent the three measurements and the related average, respectively. The purpose of these experiments is to validate the dielectric probe antenna 110 and the reflectometer 120, with TDG applied, as a system to evaluate the effect introduced by the radome in terms of reflections, in particular to evaluate and/or prove that the TDG is a analysis that can be implemented in accordance with the present disclosure. The first experiment was performed without applying the TDG. Four metal strips were placed in the air gaps located between the consecutive panels to provide reference in the measurement, as shown in FIG. 15. A purpose of this experiment was to evaluate if a satisfactory reflection coefficient measurement could be achieved without using the filter in the time domain. The reflections coming from the metal strips would be expected to be stronger than the ones generated from the rest of the setup, and therefore could be visualized without TDG. The results of these experiments are shown in FIGS. 20A-20C. Although the metal strips provided high reflection of the signal, when compared to the signals produced by the radome panels, the multiple paths generated from other generic surfaces of the rest of the setup (or of the environment) strongly affected the measurements. As shown in FIG. 20A, only the first strip (M1), located at 17° generates a well-shaped peak. The peaks related to M3 (at 57°) and to M4 (at 77°) are barely visible. The peak of M2 (at 37°) is less pronounced due to a combination of destructive reflections. The peaks M1, M3, and M4 shown in FIG. 20A also do not have the same amplitude, in part due to the fact that the distance from the antenna to a generic radome panel is not the same for all panels. The second experiment repeated the first but applying the TDG. In this test, the strips M2 and M3 were removed, exposing the air gaps between the panels. The results for the second test are shown in FIG. 20B. Diffractions due to the antenna beam in the transition between the radome and the air gap are visible. The diffraction occurs, because in the junctions between two consecutive panels, the antenna beam is not orthogonal to the radome surface. Results, however, are much improved by applying TDG analysis, thereby confirming the importance of the filter in the present disclosure. In the last test performed, the radome panels were wet to evaluate the effect of water. Water distributes differently at various angles because the radome panels are tilted. Water was stationary, forming a thick layer on the first panel, since it was not angled. Rivulets were expected to form in all the other panels. The more a panel is tilted, the thinner and more pronounced rivulets were found to be, because most of the water would just run off. The results for this scenario are shown in FIG. 20C, which also compares the test done under dry conditions (i.e., the black curve shown in FIG. 20B). As expected, water on the radome increased the level of reflection, especially in the first panel where the droplets stayed agglomerated in a thicker layer than in the other panels. Consequently, the reflection coefficient shows higher values within the angle range which corresponds to the position of the first radome panel. Reflections in the third test were slightly higher in the second panel but stayed almost the same as the second test in the other panels, especially in the last panel that is tilted 90°. One goal of the wet experiment was to establish a qualitative increase of the reflections due to the different water distribution on the tilted panels. Similar results can be expected in real situations where operational radomes are employed. In a bullet-shaped radome, for example, water distributes differently at the top or at the bottom of the hemisphere because the component of the gravity force is different.

2. Case 2: Mix Radome (Ku-Band, Air, and X-Band)

Figure 21A:
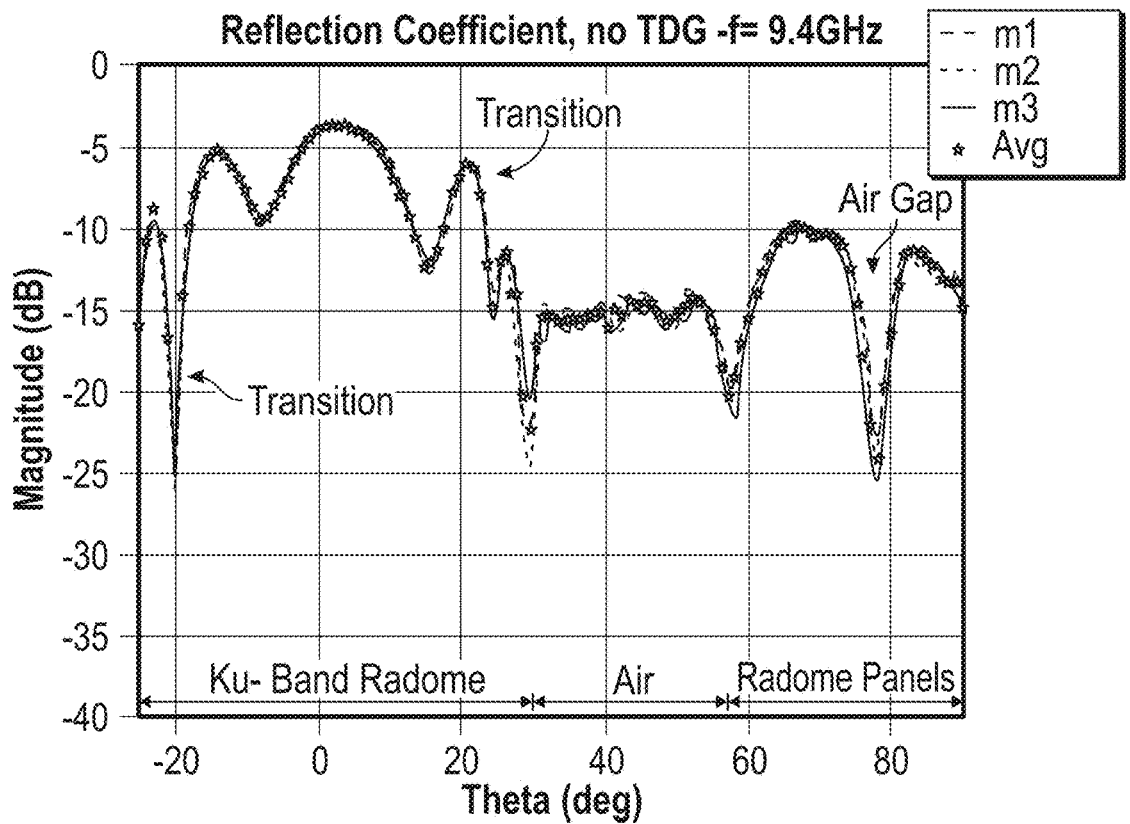
FIGS. 21A-21C show graphical plots showing the measured reflection coefficient versus the tilting angle ($\theta$) for the laboratory setup shown in FIG. 19 showing results in which TDS analysis is not applied (FIG. 21A), results in which TDG analysis is applied (FIG. 21B), and a comparison of the results using metal test strips in which TDS analysis is applied (FIG. 21C).
Figure 21B:
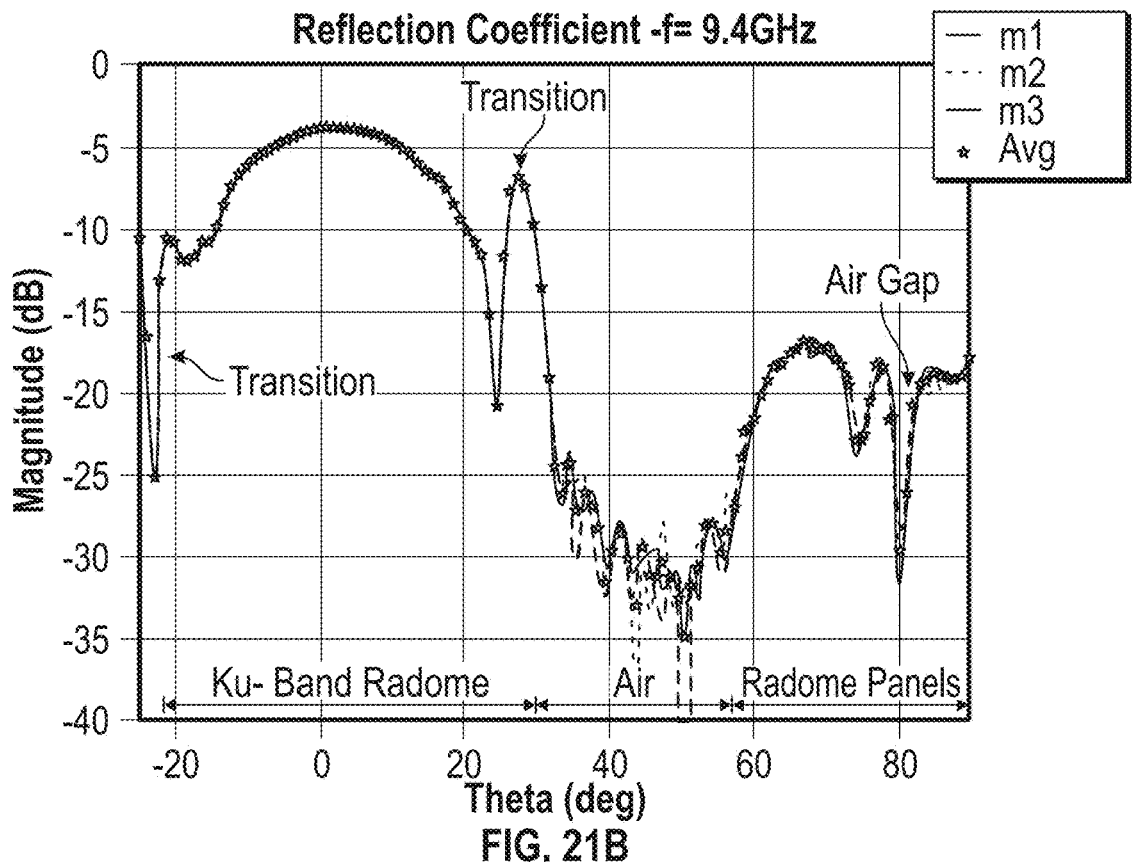
Figure 21C:
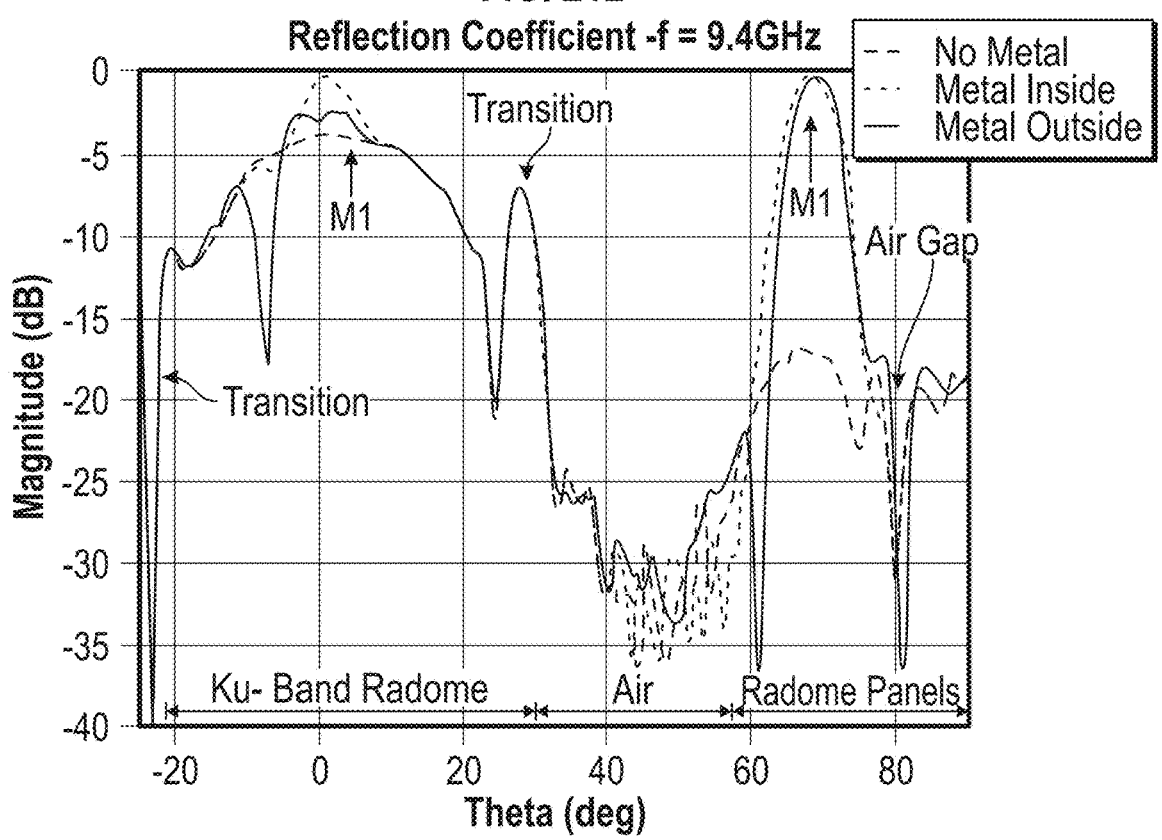

The results obtained from the laboratory setup shown in FIG. 19 are displayed in FIGS. 21A-21C. Measurements performed using the laboratory setup presented in FIG. 19 are shown at the frequency of 9.4 GHz. To have a complete scan of the Ku-band radome 140, the measurements were started at θ=−25° (instead of 0° as in the first setup employed as shown in FIG. 15). In the first test, to provide better visualization of the diffractions introduced by the border of the new radome, it was decided that no metal reference would be used. The TDG analysis was not employed for the first experiment (FIG. 21A). As in the case presented in FIG. 15, this experiment also utilized the filter in the time domain in order to improve the quality of the tests. In the second experiment (FIG. 21B), the TDG analysis was applied and a 3 GHz-bandwidth (7-10 GHz) was employed to have a good resolution in time domain. It is valuable to compare the two plots shown in FIGS. 21A and 21B in the range of 30° to 60°, where no reflection was supposed to be measured, since it is the air region. In the air region, the value of reflection is higher without applying the filter in the time domain because reflections from other parts of the setup and from the rest of the environment were not filtered out. Two final tests were performed to measure the attenuation introduced by the Ku-band radome 140. In the first test, a metal strip (M1) was placed on the outer surface of the Ku-band radome 140 in the center corresponding to θ=0°. A second metal strip (M2), was placed on the interior surface of the radome panel at θ=70° to provide a reference. The scenario is shown in the schematic of FIG. 19. In the second test, M1 was moved from the outside surface to the inside of the Ku-band radome 140 at the same location, while M2 did not change position. These two tests were compared with the results shown in FIG. 21B. For purposes of comparison, an overlapping view of the three cases is presented in FIG. 21C. Results shown in FIG. 21C show the importance of using the probe antenna 110 with high spatial resolution and the TDG analysis to evaluate the effect introduced by the radome removing all the unwanted reflections.

3. Software Interface

A graphic user interface (GUI) has been programmed in LabVIEW to create a fully automated system to coordinate the rotary motor 106 and the reflectometer 120. The USB cable 124 was used for the laptop and reflectometer communication. The input parameters to set the reflectometer 120 include bandwidth and the TDG settings (start and stop times). The input parameters for the rotary motor 106, are the start and stop angle (θ) and related number of points which determine the resolution in the measurement.

Example 3: Bullet-Shaped Radome Characterization of the PX-1000 Radar

1. Experimental Setup

A. X-Band Radome

Figure 22:
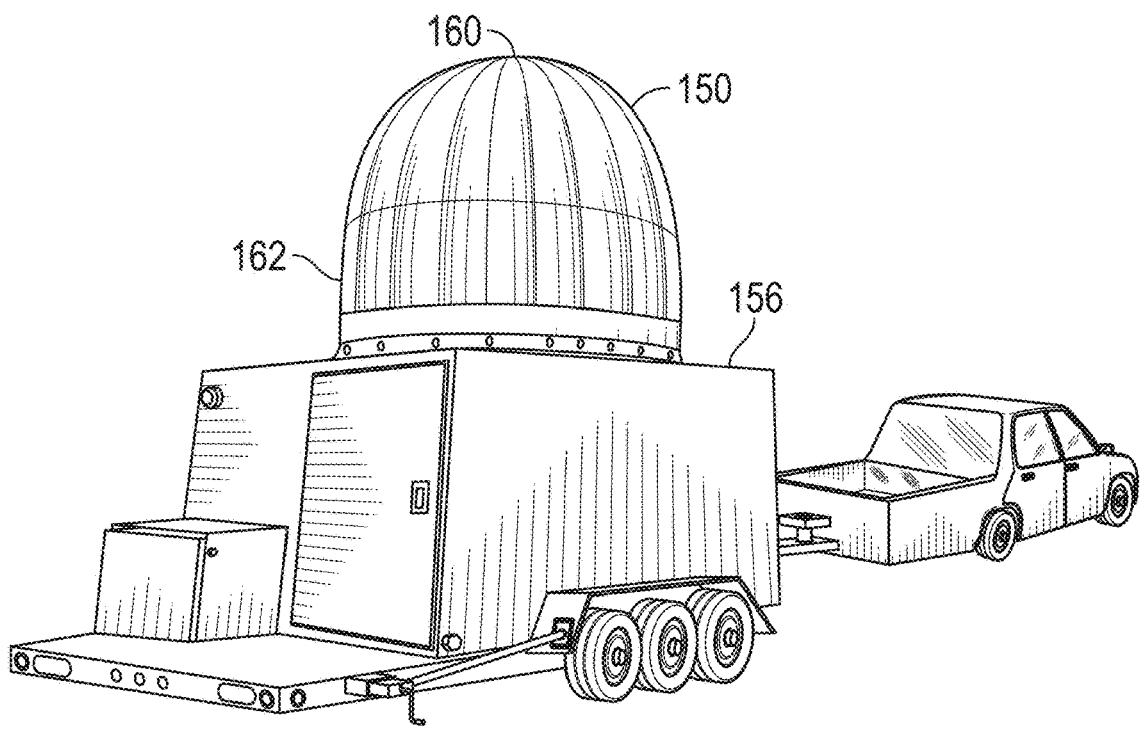
FIG. 22 shows a photograph of the PX-1000 operational weather radar taken at night.
Figure 23:
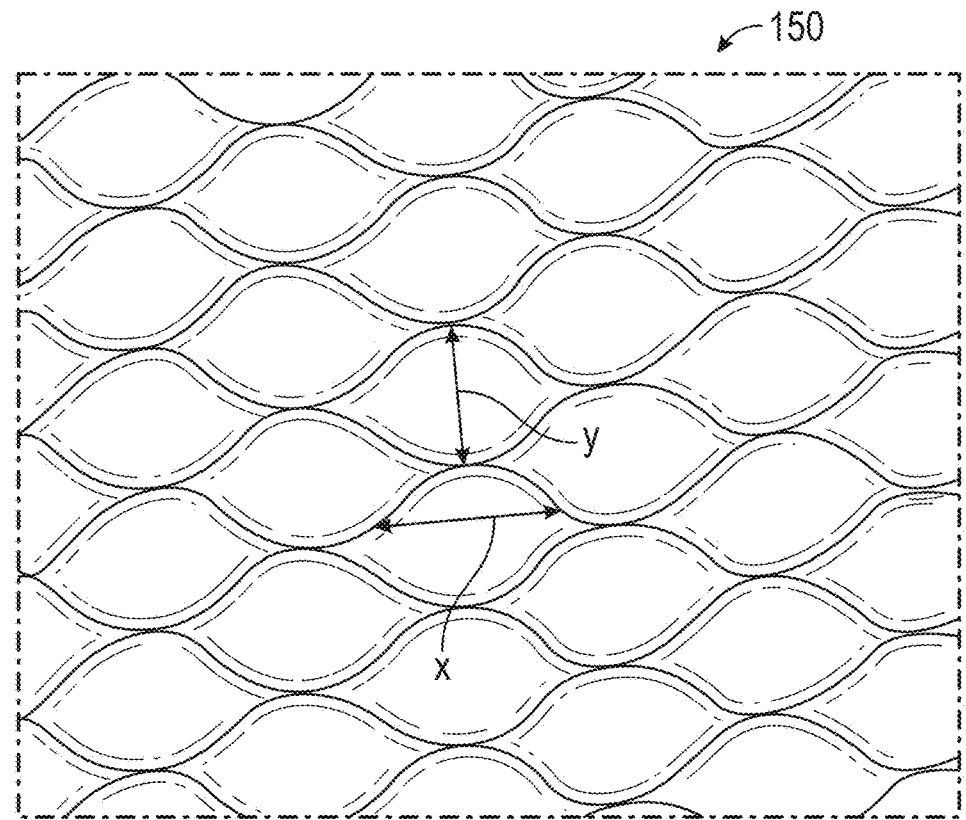
FIG. 23 shows a close-up photograph of the PX-1000 operational weather radar's radome panels in which the radome panels comprise honeycomb hexagons.

FIG. 22 shows a photograph of a radome 150 of a PX-1000 radar system 156. This radome 150 has physical external dimensions of about 87.23" in diameter, about 75.25" in total height, and about 31.63" for the height of the cylindrical base. As shown in FIG. 23, the panels that comprise the radome 150 are, in one non-limiting embodiment, made of honeycomb-shaped hexagons which give different patterns along the directions of x and y axes, thereby resulting in the distance between two consecutive hexagons being different in the vertical and horizontal planes. Therefore, it may be expected that both the distribution of hexagons and the presence of non-homogeneity (dark areas shown in FIG. 22) could affect, in differing ways, the level of polarization in the H- and V-planes and their related attenuation. Different levels of attenuation may occur not only along an elevation cut, but also in azimuth. Two panels located next to each other could introduce further attenuation, particularly at the junction. Other issues impacting the attenuation are due to flaws or damage in the radome that are not necessarily visible to the eye. In one non-limiting embodiment, the radome 150 is fabricated in two halves. All the above-mentioned factors can affect the radar signal, degrading the radar signal in different levels at different locations, both in azimuth and elevation and in amplitude or polarization, especially during rain. A dry radome characterization is useful to determine if there are different responses in the H- and V-planes, and also to detect other imperfections not apparent by a simple visual inspection.

B. Measurements Criteria

As previously stated, the bullet-shaped radome 150 employed in the PX-1000 weather radar 156 has been employed for the experiments.

Figure 24A:
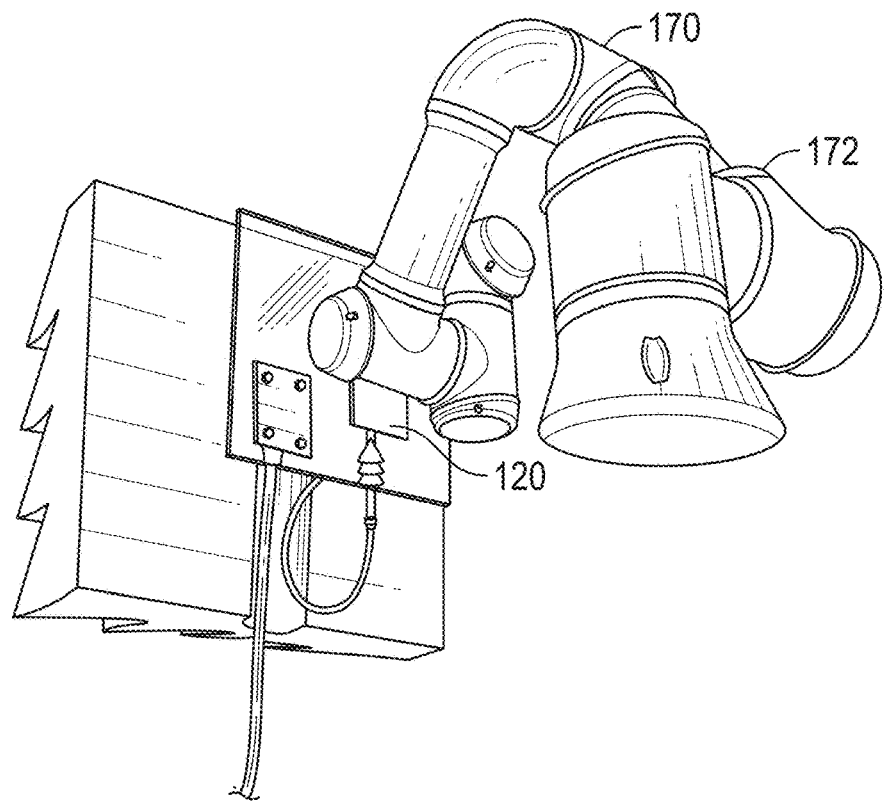
FIG. 24A is a rear perspective view of a non-limiting embodiment of a probe constructed in accordance with the present disclosure, mounted to and movable by a robotic arm.
Figure 24B:
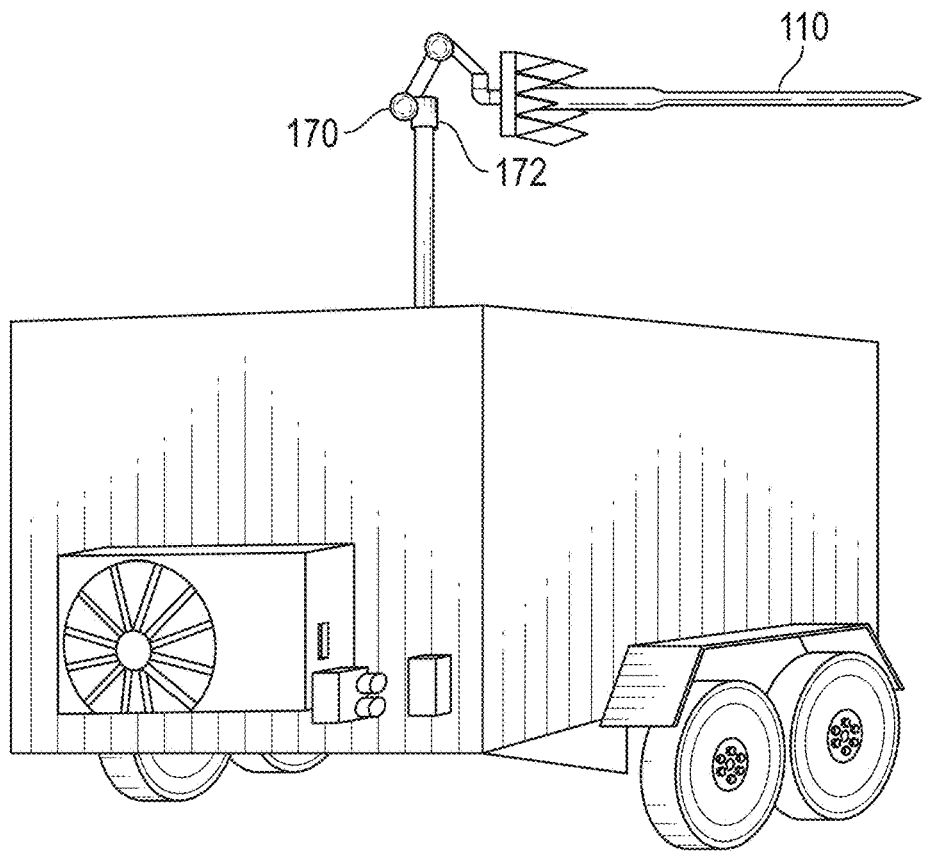
FIG. 24B is a front perspective view of a non-limiting embodiment of the probe and robotic arm of FIG. 24A.
Figure 25A:
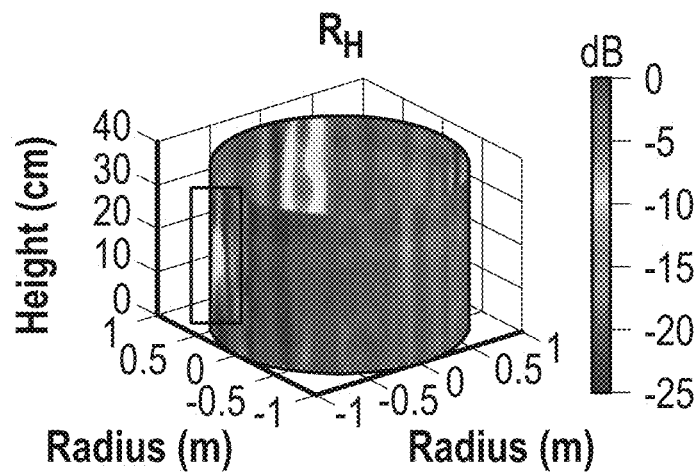
FIGS. 25A-25F show three-dimensional graphical plots depicting the reflection coefficient (R) measurement for the cylindrical portion of the radome under dry conditions. Rows show H-polarization, V-polarization, and the difference between the two polarizations. In addition.
Figure 25B:
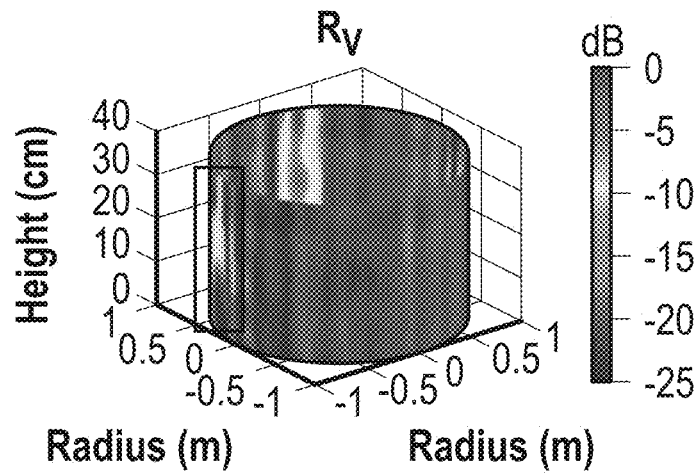
Figure 25C:
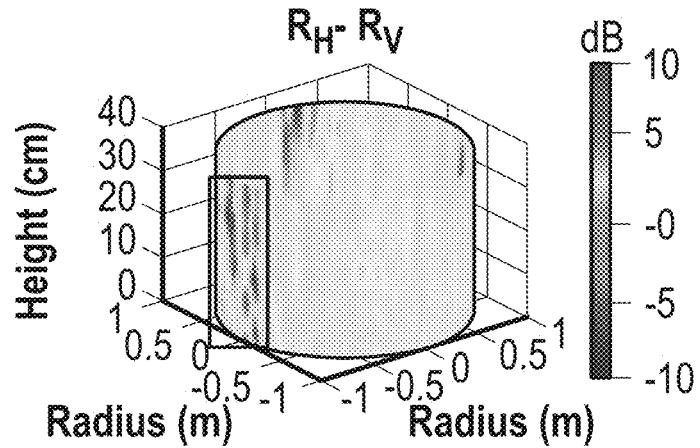
Figure 25D:
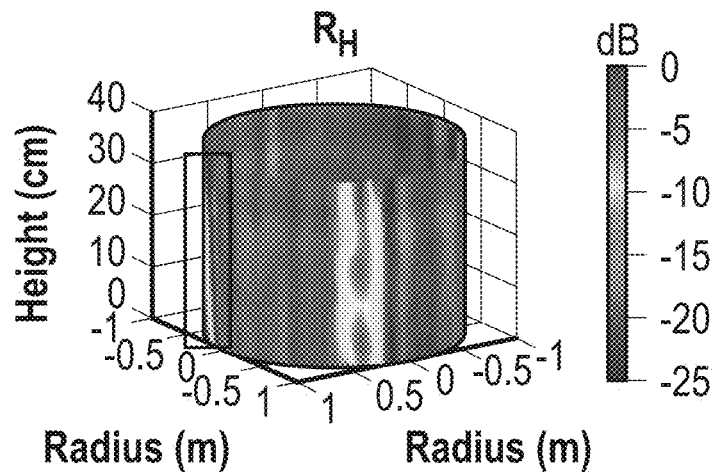
Figure 25E:
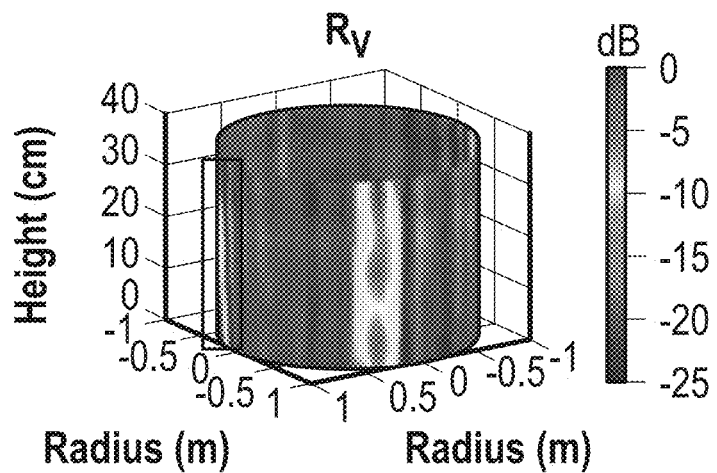
Figure 25F:
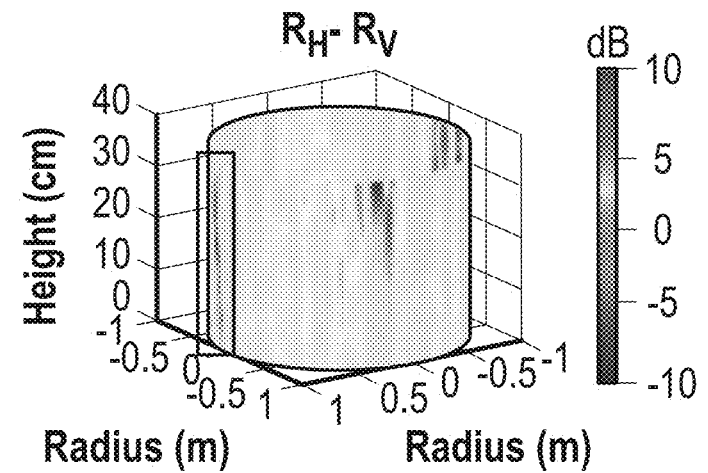

The radome characterization was performed considering a spherical part 160 of the radome 150 either in dry and wet conditions. A cylindrical portion 162 was characterized only when dry. Dry and wet scenarios were studied considering both polarizations (H and V). However, given that only one probe 10 was available, only one polarization at a time was possible to measure. The probe 10 was attached to a robotic arm 170 of a robot 172. In one embodiment, the probe 10 included the probe antenna 110 communicating with the reflectometer 120, via a cable, for example. First, a full scan of the radome 150 for one polarization was taken. Once completed, a scan for the second polarization was subsequently executed. The time span between the beginning of a measurement associated to one polarization, to the start of the test for the second polarization depends on the angle resolutions in azimuth and elevation. In one non-limiting embodiment, the radome characterization was done performing a 360° azimuth scan for each cut in elevation. The range in elevation varied from 0° to 80°. The angle resolutions in azimuth and elevation were 1° and 5°, respectively. Given such fine angle resolutions, the time lag between the start of the two polarizations was approximately 2 hours and 30 minutes (9 mins per azimuth scan). Such a time span can then be decreased by doing a less fine resolution or increasing the robot arm rotation speed. While taking a sample of the reflection coming from the radome 150, the robotic arm 170 did not move. This means that the robotic arm 170 was rotating in azimuth in which resolution dictated by the user (1°) and the robotic arm 170 stopped at the point where the measurement was supposed to be taken to then move again to the next position. The movement of the robotic arm 170 was not continuous to avoid that the peak of the probe antenna 110, mounted on the robotic arm 170 (shown in greater detail in FIG. 24), was not vibrating due to the rotational motion while taking the sample. This resulted in not only a more precise characterization but also in an increase of the time to fully characterize the radome 150. In brief, the non-continuity of the robot rotation to collect each sample as well as the angle resolutions both contribute to increase the total time for the radome characterization. In practical applications, the probe antennas 18 or 110 (for H- and V-polarizations) would be mounted on the back of the antenna feed 12 and scanning with the speed dictated by the radar antenna 4. The peak vibration is directly correlated to the length of the dielectric rod of the probe antenna 18 or 110. However, it has been already mentioned that for operative cases, the probe antenna 18 or 110 needs to be miniaturized (shortened) to avoid interactions with the radar operation. At the same time, this shortening would also solve the vibration issue related to the probe motion.

The tests were executed by applying TDG analysis with a 3 GHz-bandwidth (7-10 GHz). Such a frequency range provides a suitable resolution in the time domain as previously discussed with respect to Mancini et al., supra. The start and stop times of the gating were about 5.3 and about 6.44 ns, respectively.

The dry radome investigation is useful for detection of damages or non-homogeneous patterns present on the surface of the radome 150 that are not necessarily detected by visual inspection. Studies performed under wet conditions took place under artificial and natural rain conditions. For artificial precipitation, a sprinkler was employed to allow a constant rain rate during the experiment, with wind being the only variable factor since the experiment was performed outdoors. To have full radome characterization with the mentioned angle resolutions, a relatively lengthy amount of time was required for the execution. This was especially important as a factor for the natural rain scenario because for the measurement to be completed, the rain had to last long enough. In the data presented for natural rain, the storm lasted long enough to have a full characterization of the radome 150; however, the rain rate was not constant during the test, which means that scans at different elevation angles might have measured reflections from the radome 150 under different rain intensities. Also, the rain rate could have changed from the time the test of the first polarization was performed until the time the test of the second polarization was conducted.

All the radome characterizations in the different scenarios started at the elevation of 0° and concluded at 80°. This is relevant for the natural rain experiment because for reference is shown a plot of the rain rate averaged every 10 minutes (same duration as an azimuth scan). In this way, it is possible to know the rain rate (mm/10 mins) during the azimuth scan.

2. Experimental Results

Before starting the experiments in wet conditions, Rain-X was applied to a quarter of the radome 150. Rain-X is a substance made for car windshields to increase the hydrophobic property of the glass which keeps the water in droplet form. Rain-X was used only on part of the radome for the purpose of comparing different water distribution and formations on the radome 150. Water was expected to present as droplets and/or rivulets in the Rain-X sector, and substantially as a film in the remainder of the radome 150. It was expected that the two areas, differently treated, would have different responses of the reflectance (R) and transmittance (T). The hydrophobic effect due to Rain-X was anticipated to potentially have more impact on the H-polarization, since it prevents film formation and keeps water in droplets and/or rivulets.

A. Case 1: Cylindrical Radome in Dry Conditions

The cylinder was tested only under dry conditions. The related measurements are shown in FIGS. 25A-F and 26A-F for the reflection and transmission coefficients, respectively.

In the FIGS. 25A, 25B, 25D, and 25E, an important observation can be made, which is discernible in an area of high reflection on the left side of the radome. It is probably an imperfection produced during the assembly process. The cylindrical portion 162 of the radome 150 is constructed with joined halves. The area shown in these figures is the junction where the two halves are attached and patched, presenting a discontinuity. When the probe 10 scans in regions where such imperfections occur, diffraction is generated. Such diffraction is different in the H- and V-planes. This statement is confirmed in FIGS. 25C and 25D where levels of differential reflection are higher than about 10 dB (or lower than about −10 dB) in the spot where the imperfection is located. In the rest of the radome (besides the vertical section corresponding to the metal strip), the differential reflection is between about 3 and about −3 dB.

Figure 26A:
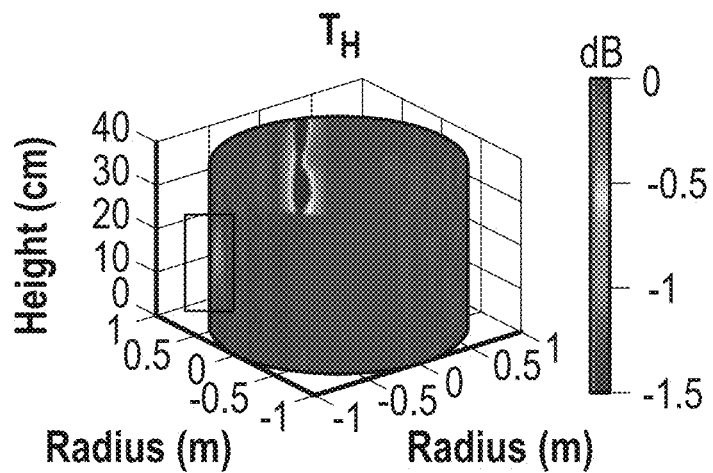
FIGS. 26A-26F show three-dimensional graphical plots depicting the transmission coefficient (T) measurement for the cylindrical portion of the radome under dry conditions. Rows show H-polarization, V-polarization, and the difference between the two polarizations. In addition.
Figure 26B:
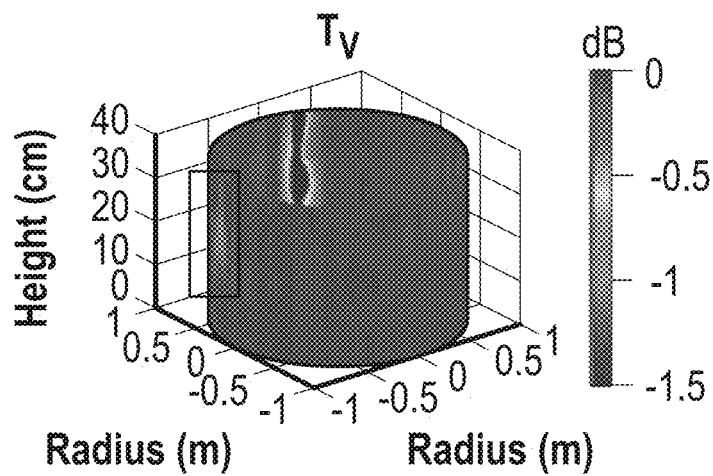
Figure 26C:
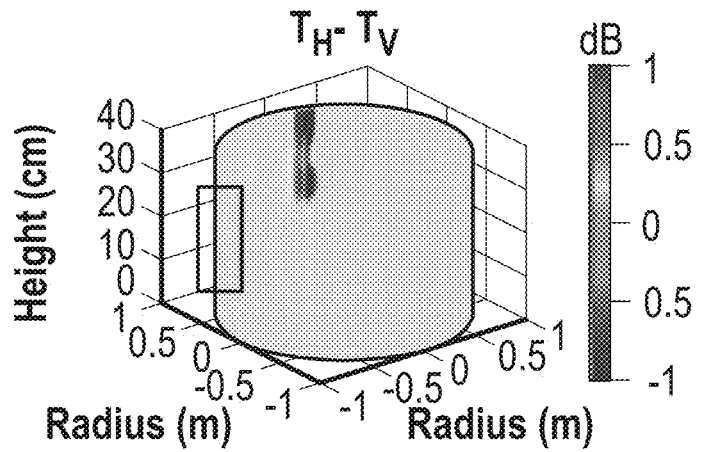
Figure 26D:
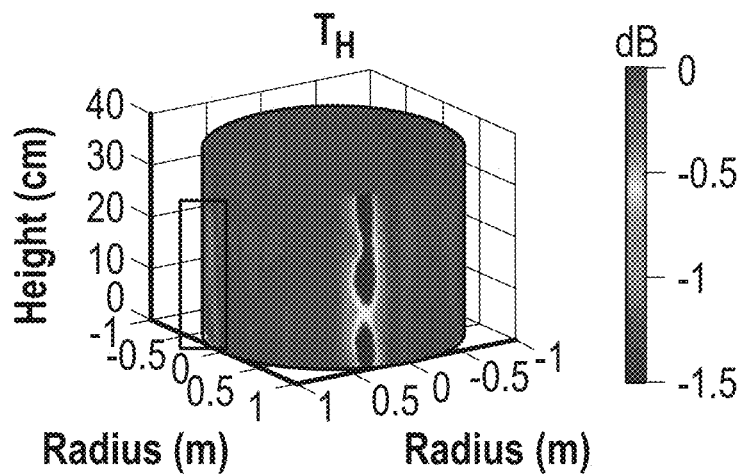
Figure 26E:
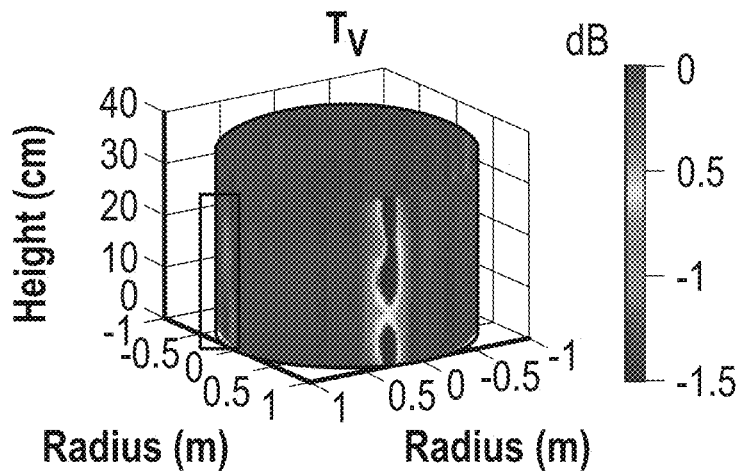
Figure 26F:
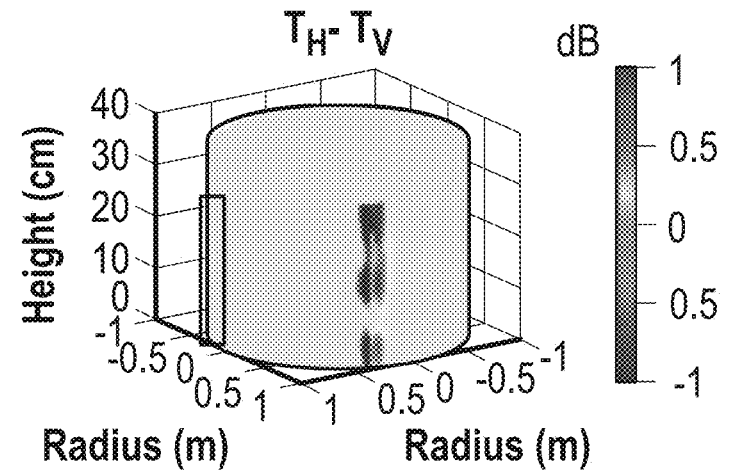

The transmission coefficient has been computed using the equation 1—R, since the absorption (A) could not be measured. Results are shown in FIGS. 26A-26F. The two polarizations present similar values of transmission coefficient (about −0.1 dB). On the left side of these figures, corresponding to the spot where the imperfection is located, an area with about 0.4 dB attenuation is noticeable. Comparing the two sides of the cylinder, they exhibit about the same differential transmission coefficient which is shown in FIGS. 26C and 26F.

B. Case 2: Semi-Spherical Radome in Dry Conditions

Figure 27A:
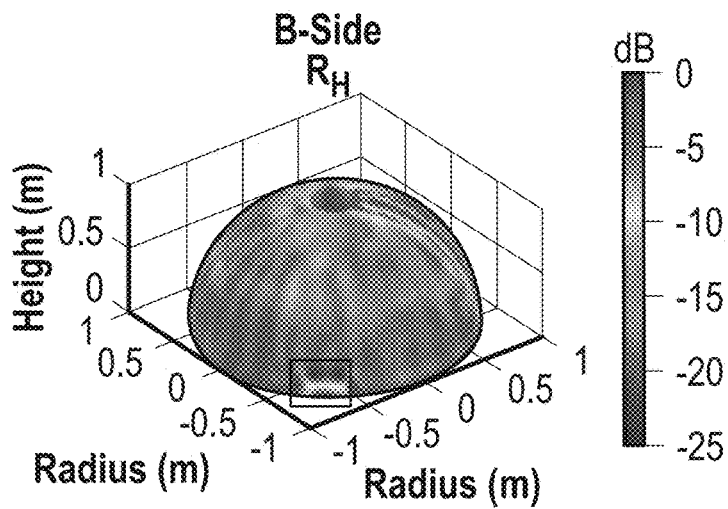
FIGS. 27A-27F show three-dimensional graphical plots depicting the reflection coefficient (R) measurement for the spherical portion of the radome under dry conditions. Rows show H-polarization, V-polarization, and the difference between the two polarizations. In addition.
Figure 27B:
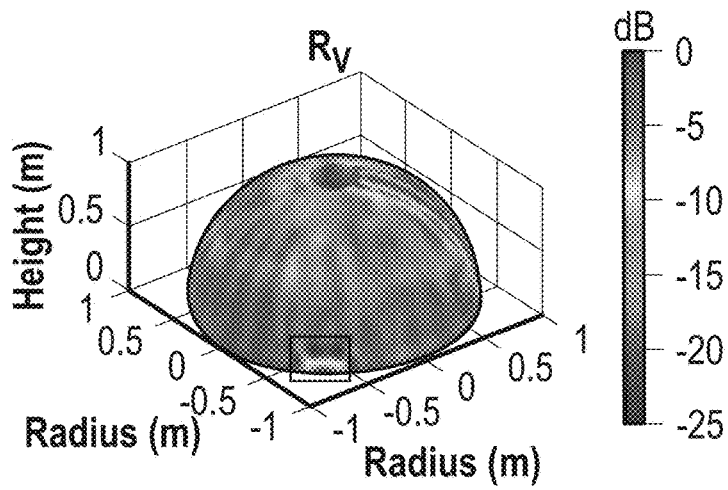
Figure 27C:
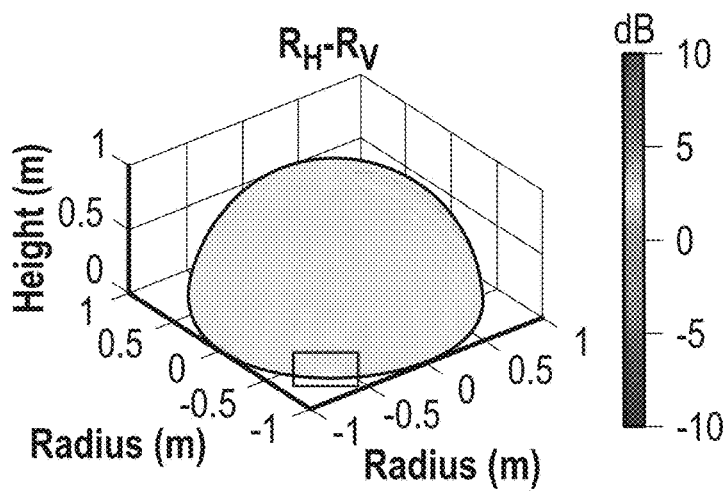
Figure 27D:
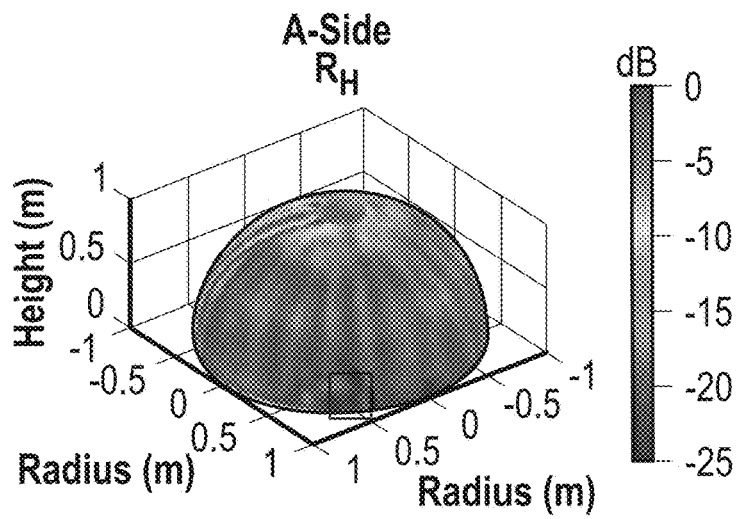
Figure 27E:
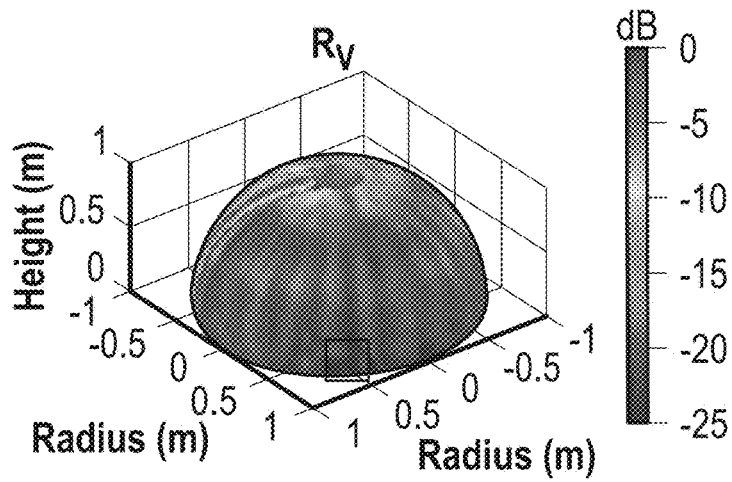
Figure 27F:
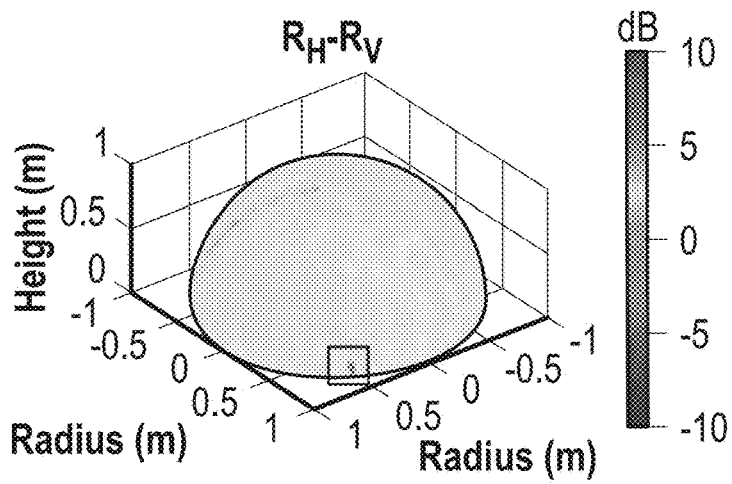
Figure 28A:
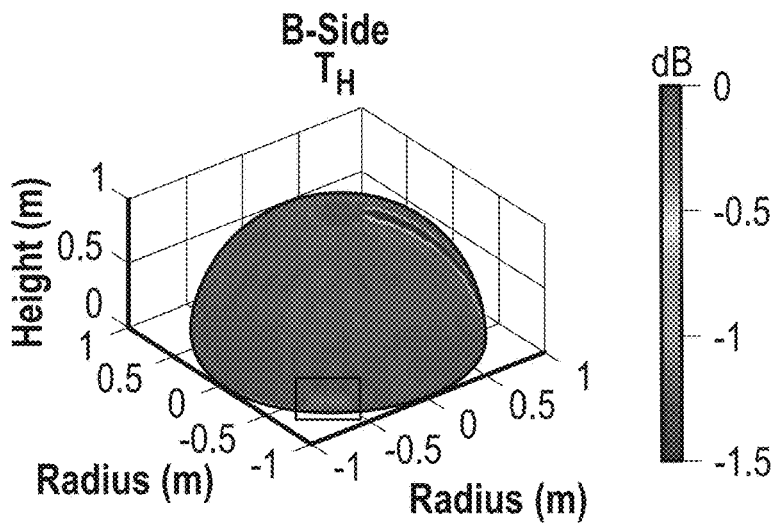
FIGS. 28A-28F show three-dimensional graphical plots depicting the transmission coefficient (T) measurement for the spherical portion of the radome under dry conditions. Rows show H-polarization, V-polarization, and the difference between the two polarizations. In addition.
Figure 28B:
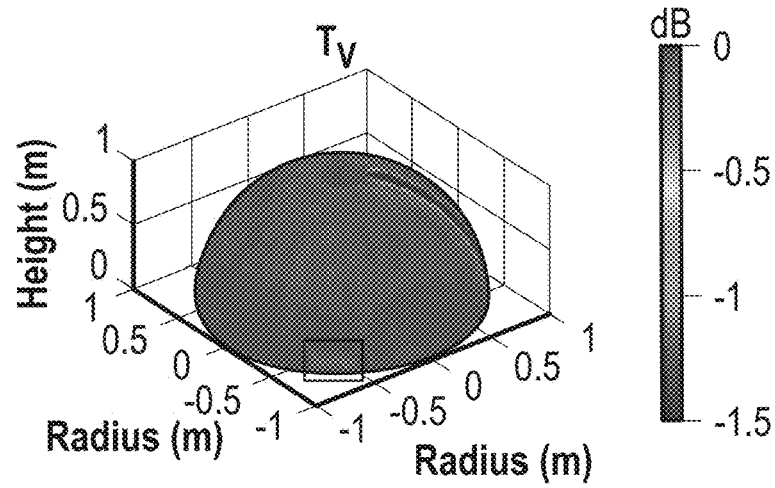
Figure 28C:
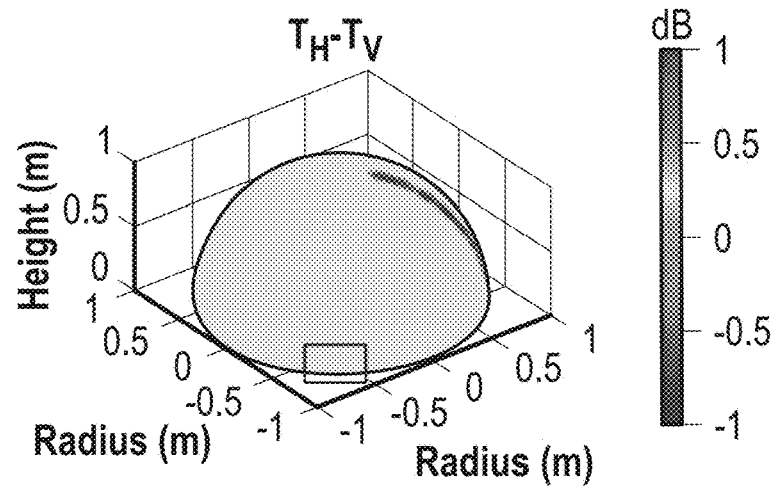
Figure 28D:
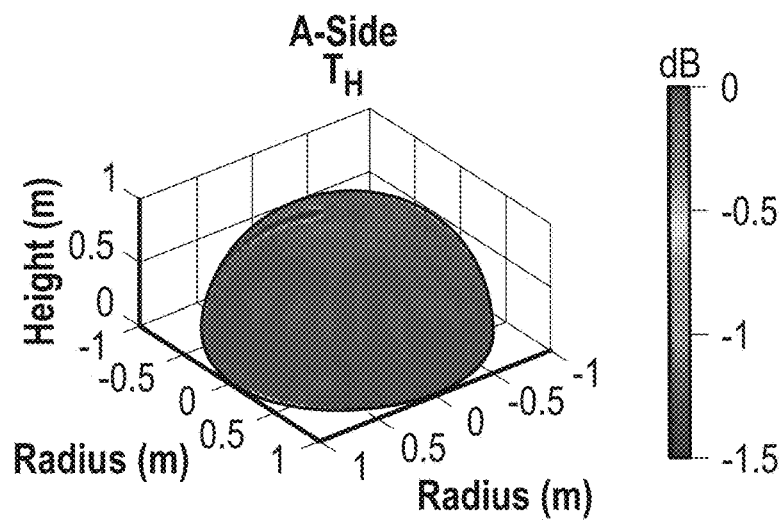
Figure 28E:
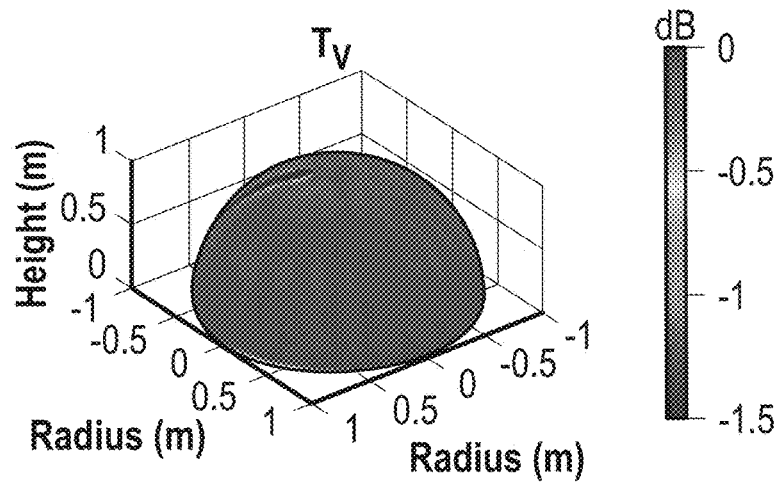
Figure 28F:
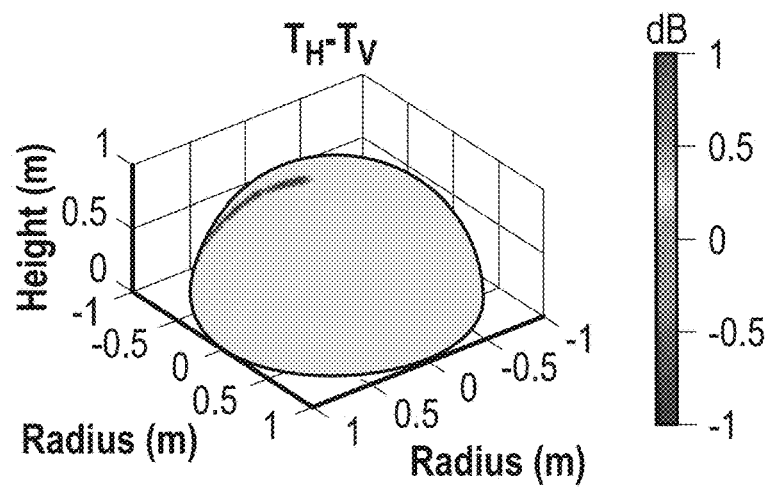

The results for the top of the bullet-shaped radome 150 (spherical part 160) are shown in FIGS. 27A-27F for the reflection coefficient. Just as with the cylindrical portion, the spherical part 160 of the radome 150 shows good agreement between both polarizations. Looking at FIGS. 27A and 27B for the reflectance R, another fabrication imperfection, not detectable by visual inspection, is noticed at the base of the sphere, but only present on one side of the radome 150. This is assumed to be an air gap formed during the assembling process of the radome. In FIG. 27F, at the bottom of the hemisphere, a spot with about a 9 dB-reflection is detected, which is again presumed to be a flaw introduced into the radome 150 via the assembling process. The level of higher reflection, due to manufacturing imprecision, is generated by diffraction that occurs at the border of the air gap. In FIGS. 28A-28F the transmission coefficient is shown. Similar comments can be deduced for T.

C. Case 3: Semi-Spherical Radome Under Artificial Rain

Figure 29:
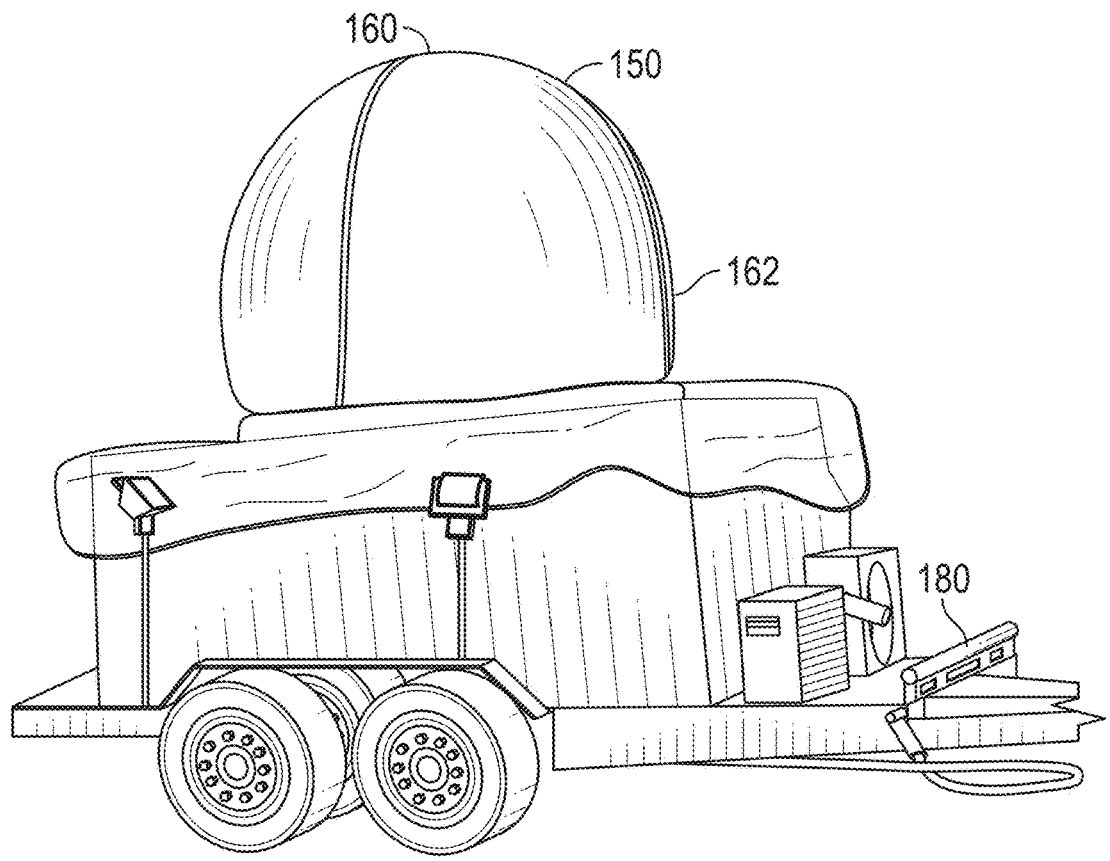
FIG. 29 shows a side perspective view of a radar system constructed in accordance with the present disclosure, being tested under artificial rain conditions, as well as a schematic representation of the radome subdivision.
Figure 30:
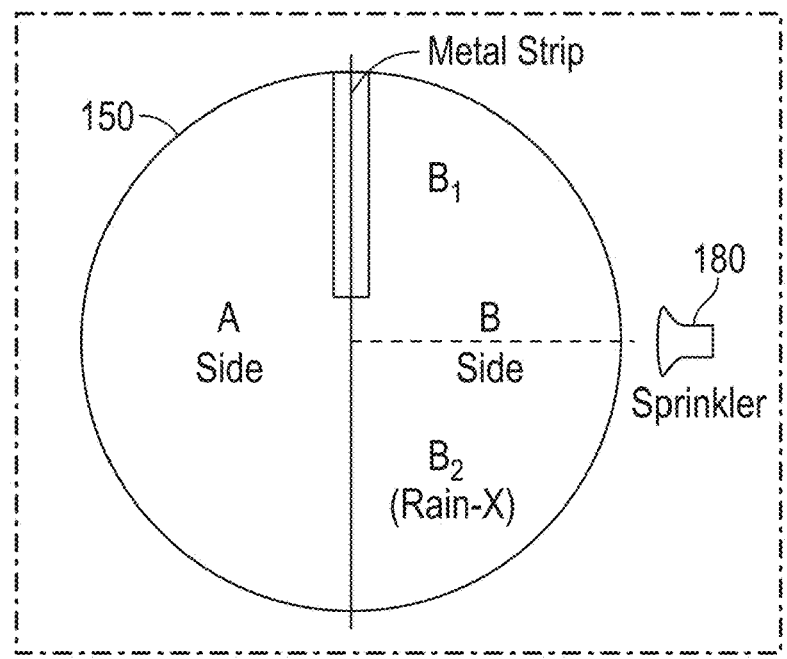
FIG. 30 is a schematic diagram showing a location of a sprinkler relative to a radome under artificial rain conditions in which Rain-X has been applied to at least a portion of the radome.

To produce artificial rain a common garden sprinkler was employed. No rain rate or drop size distribution (DSD) was taken into account when wetting the radome 150. As a result, the artificial rain was fairly uniform over time, except for the action of the wind. A purpose of this experiment was to evaluate the effect of an intense and continuous rain over the radome 150. FIG. 29 shows a perspective view of the rain setup used for this experiment. The setup was designed for a sprinkler 180 (FIG. to point at the top of the radome 150 so that the water stream could flow down naturally and equally on both sides. The schematic representation of FIG. 30 shows a top view of the radome 150 and the related sector subdivisions called A- and B-sides. B-side directly faces the sprinkler 180. Although the water flow was supposed to hit the radome 150 from the top, the wind action contributed to and caused uneven water distribution on the radome 150. As a consequence of the wind, it was predicted that the A-side would be less exposed to the rain than the B-side. B2-side, a subsection of B, is the sector where Rain-X was applied.

Figure 31A:
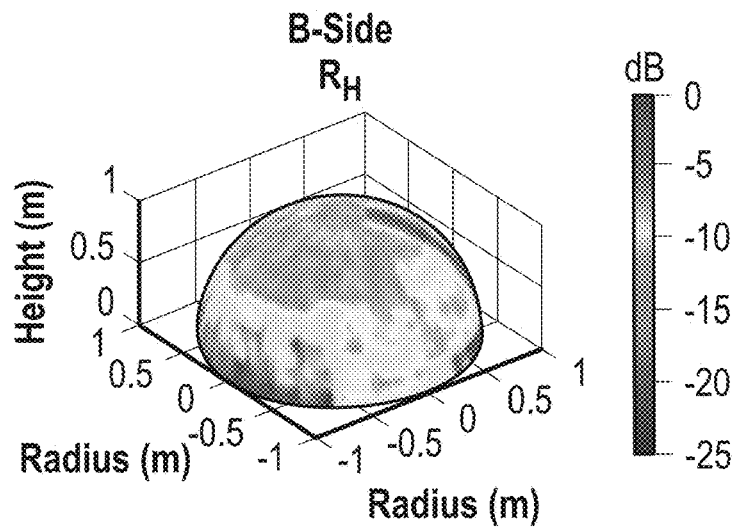
FIGS. 31A-31F show three-dimensional graphical plots depicting the reflection coefficient (R) measurement for the spherical portion of the radome under wet conditions during artificial rain. Rows show H-polarization, V-polarization, and the difference between the two polarizations. In addition.
Figure 31B:
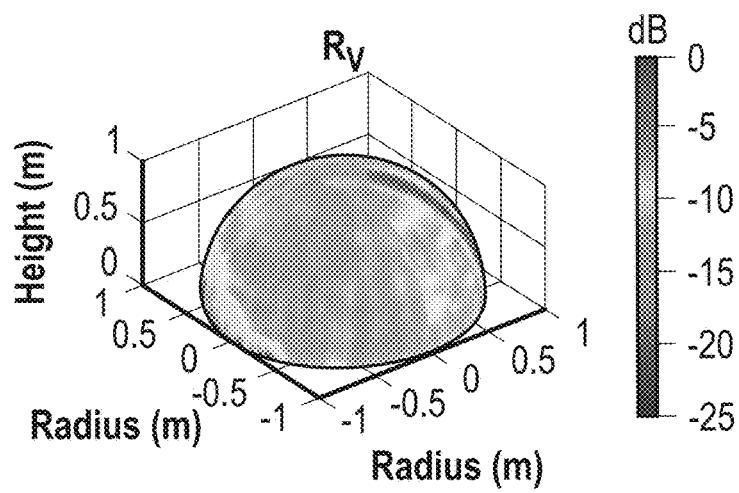
Figure 31C:
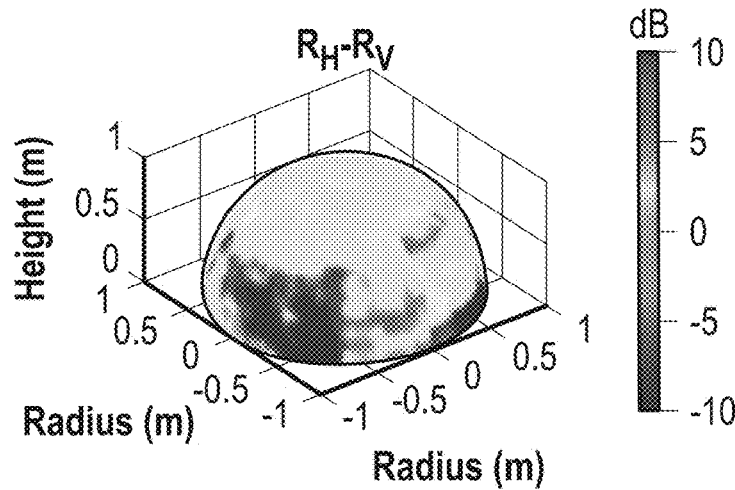
Figure 31D:
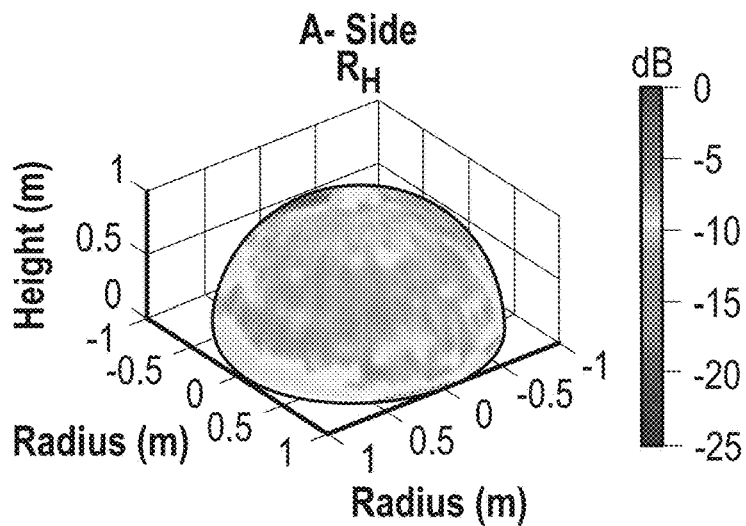
Figure 31E:
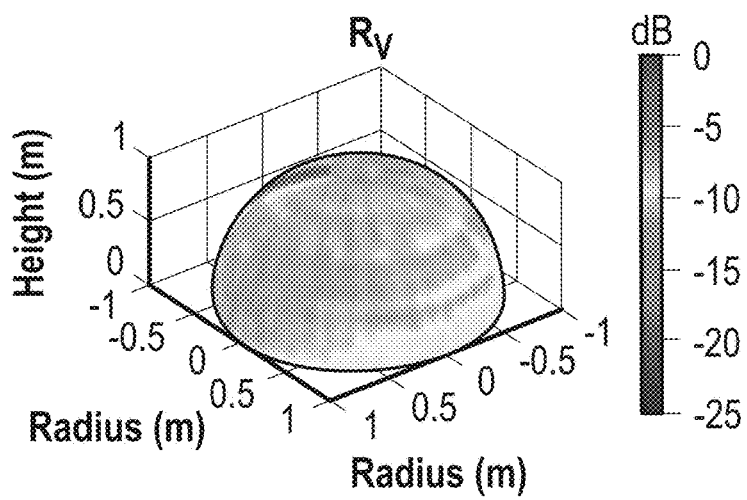
Figure 31F:
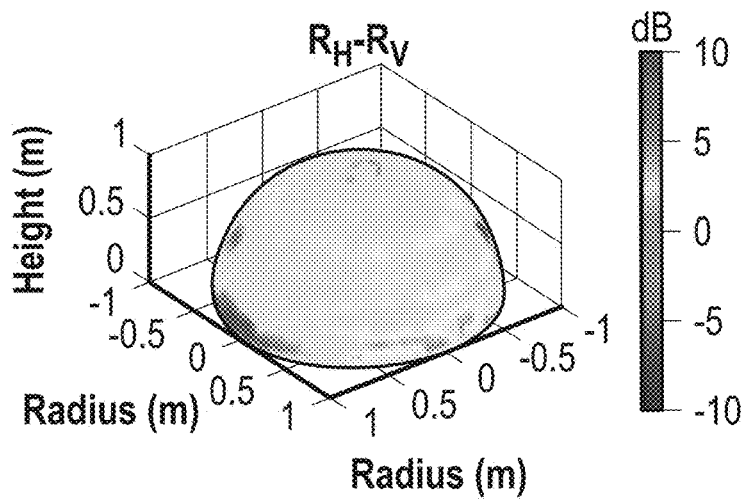

The measured reflection coefficient is shown in FIGS. 31A-31F. It is immediately noticeable that the level of reflection is risen from a heavy rain and how FIGS. 31D and 31E show for the non-hydrophobic region of the radome 150. For such an area, the level of reflection rose from about −20 dB in dry condition to about −6 dB for the rain case. FIG. 31A presents the reflections for the sector treated with the Rain-X (B-side). Reflections are high (about −6 dB circa) at the top part of the hemisphere, where Rain-X was less efficient, and lower (below about −10 dB) at the bottom of the hemisphere. The top of the B-side was the region where the sprinkler was directly wetting the radome 150 then exposed to a higher quantity of water (as shown in FIG. 29). There is a noticeable difference between RH and RV in the sector treated with the hydrophobic substance. Water stays as droplets or rivulets on the hydrophobic surfaces. In case it presents as rivulets, those have a vertical geometry which has larger vertical cross-section, while the horizontal cross-section is the same as a droplet. In this way, the rivulet reflects more of an electromagnetic wave polarized in the vertical plane than one polarized in the horizontal one. When water presents as a film (non-hydrophobic portion), there is no remarkable difference between H- and V-polarizations. This is confirmed by the comparison of FIGS. 31A and 31B, where it is shown that the reflectance is higher for RV than RH for the B-side (which is treated with hydrophobic substance). Given this large discrepancy between RH and RV in the hydrophobic section (B2-side), the related difference is higher than in the rest of the radome 150.

Figure 32A:
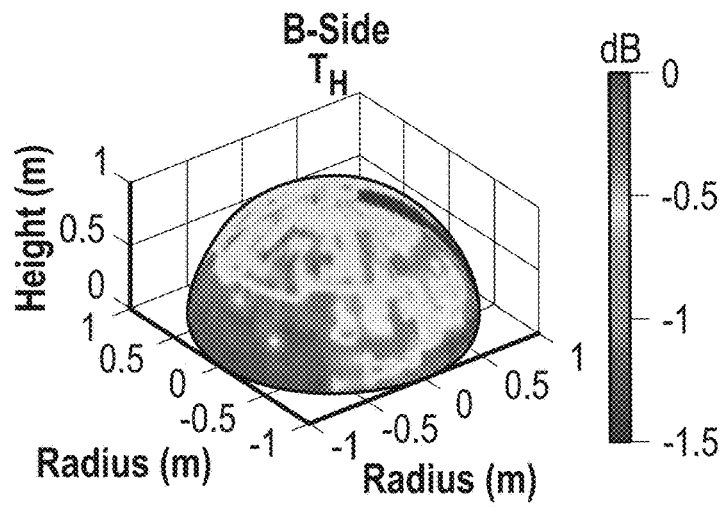
FIGS. 32A-32F show three-dimensional graphical plots depicting the transmission coefficient (T) measurement for the spherical portion of the radome under wet conditions during artificial rain. Rows show H-polarization, V-polarization, and the difference between the two polarizations. In addition.
Figure 32B:
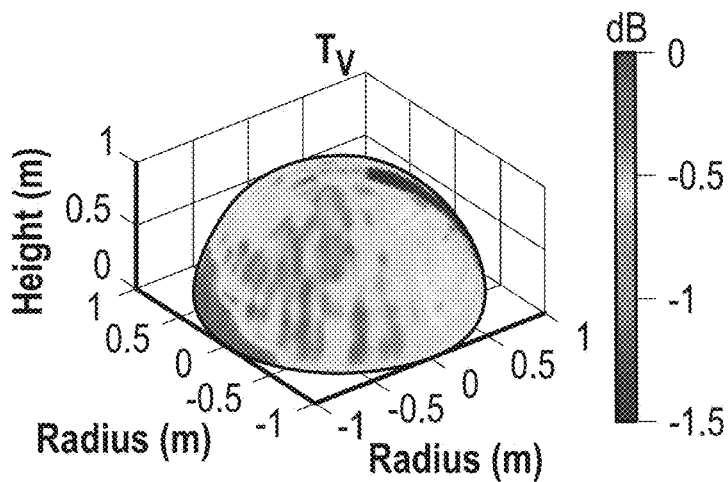
Figure 32C:
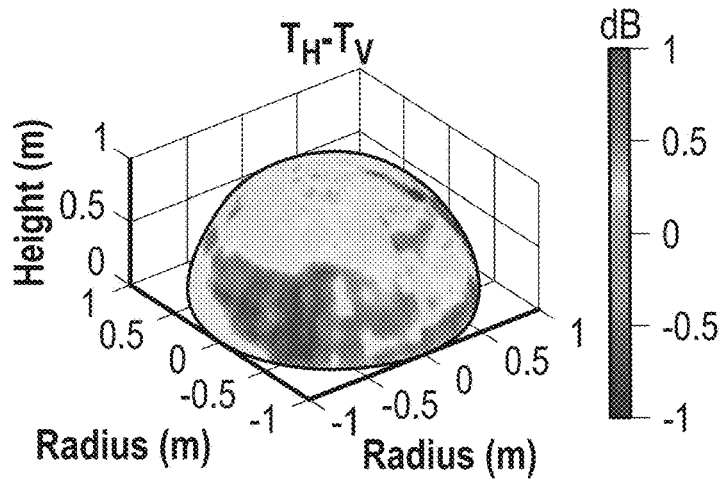
Figure 32D:
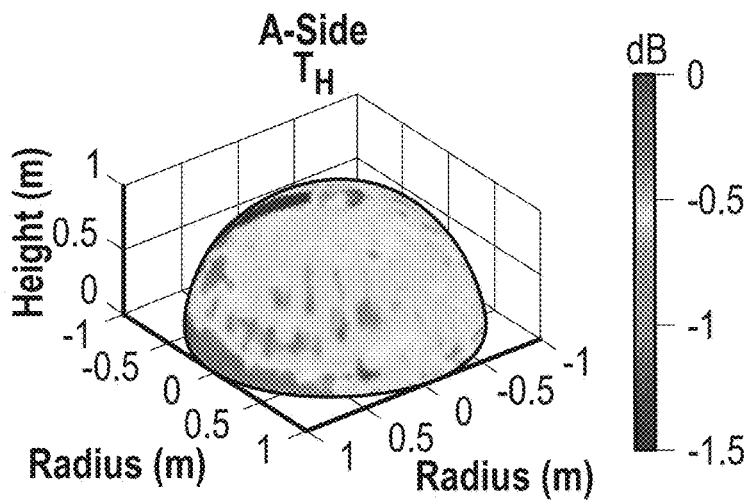
Figure 32E:
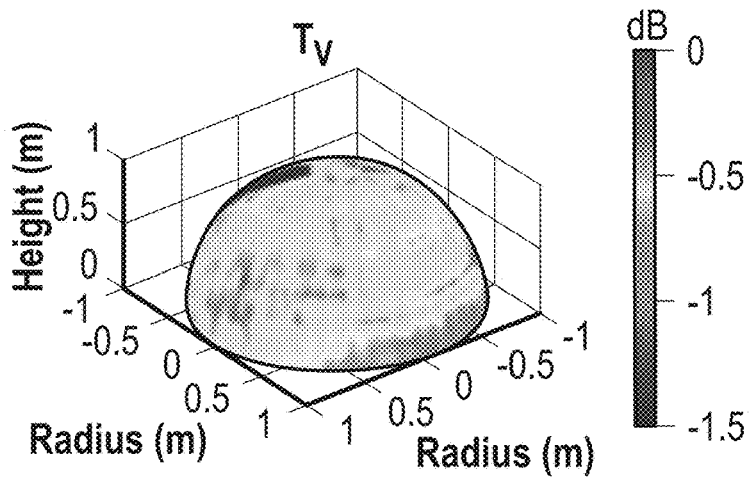
Figure 32F:
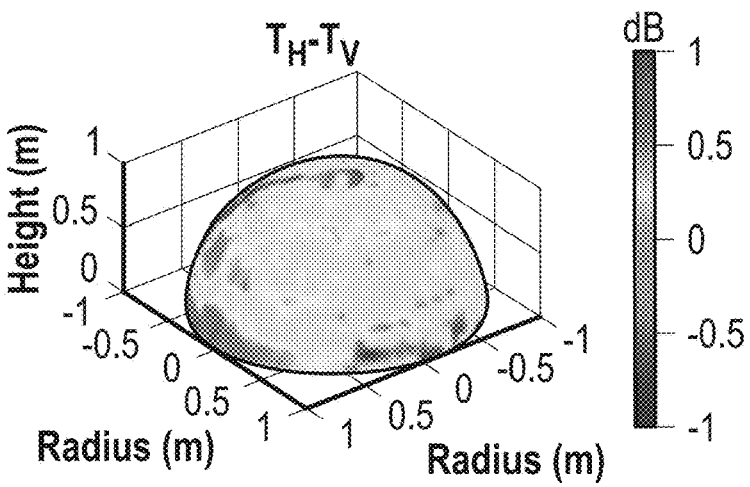

The measured transmission coefficient in the presence of artificial rain is shown in FIGS. 32A-32F. The two sides of the radome 150 present different levels of attenuation in the H-polarization, as shown in FIG. 32A for the B-side and in FIG. 32D for the A-side. The B-side shows a lower level of T compared to the A-side. The lower level of T in the B-side, although it was exposed directly to the sprinkler 180, is due to the remarkable effect of the Rain-X for this polarization. Results from the same area of the radome 150 are different for the V-polarization. As shown in FIG. 32B for the B-side and FIG. 32E for the A-side, it appears clear that the Rain-X had no effect in this case. This occurs because the sprinkler 180 was spraying more on the B-side (FIG. 32B), and a high number of rivulets were distributed on the surface. Various levels of attenuation (shown in FIGS. 32A-32F) for the two polarizations are noticeable, not only in the sector where Rain-X was applied, but also on the rest of the radome 150. As for the reflectance results, the area treated with the hydrophobic substance shows a high level of difference between the attenuations measured in the H- and V-polarizations. Also, the A-side presents relatively high differences in polarization at the base of the hemisphere. Although a water film was formed on this portion of the radome 150, it did not seem to be uniform from a polarization point of view.

D. Case 4: Semi-Spherical Radome Under Natural Rain

Figure 33:
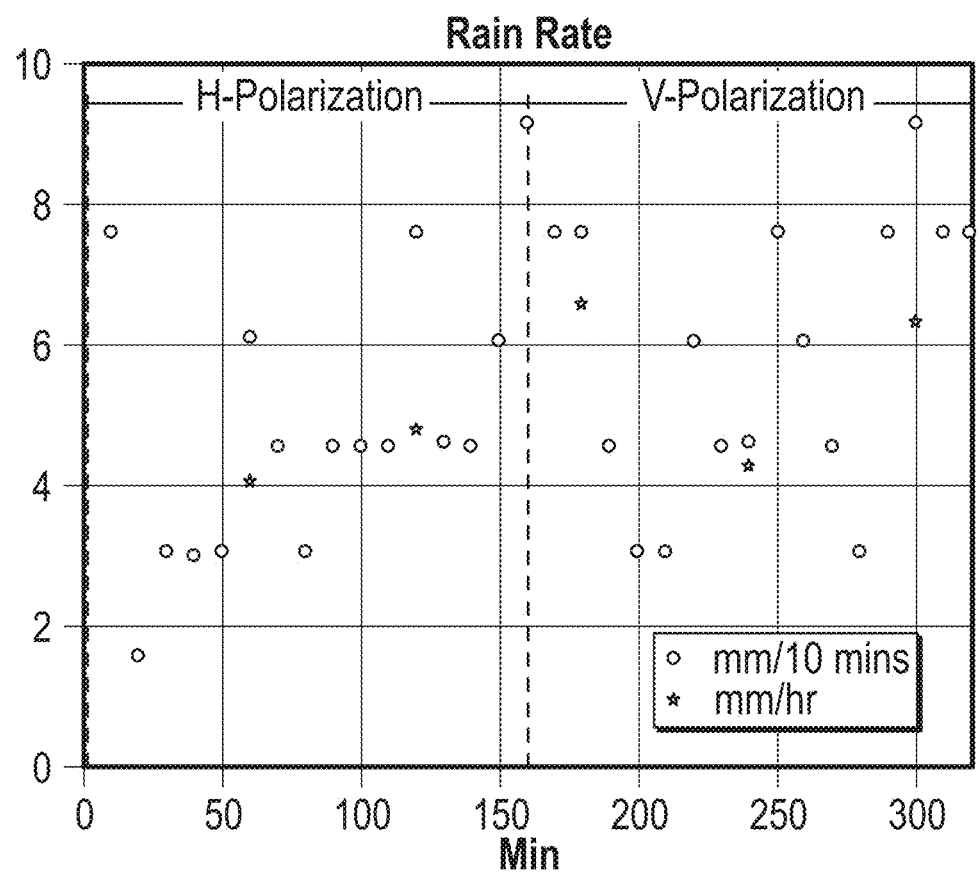
FIG. 33 shows a graphical plot showing the average rain rate as a function of time for the storm utilized for the natural rain conditions for radome characterization. The x-axis represents the relative time with respect to the beginning of the measurement. H-polarization was measured first starting at minute 0 while measurements of V-polarization were taken immediately after the end of the previous H-polarization measurement (minute 160). The average was performed every 10 and 60 minutes.
Figure 34A:
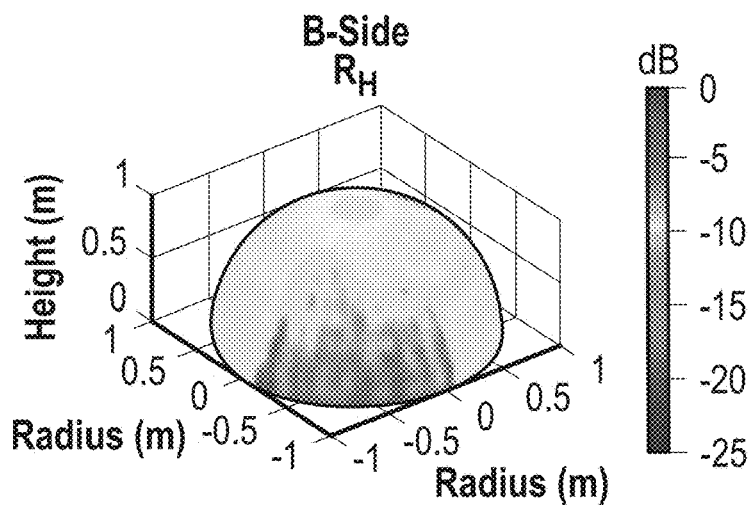
FIGS. 34A-34F show three-dimensional graphical plots depicting the reflection coefficient (R) measurement for the spherical portion of the radome under wet conditions during natural rain. Rows show H-polarization, V-polarization, and the difference between the two polarizations. In addition.
Figure 34B:
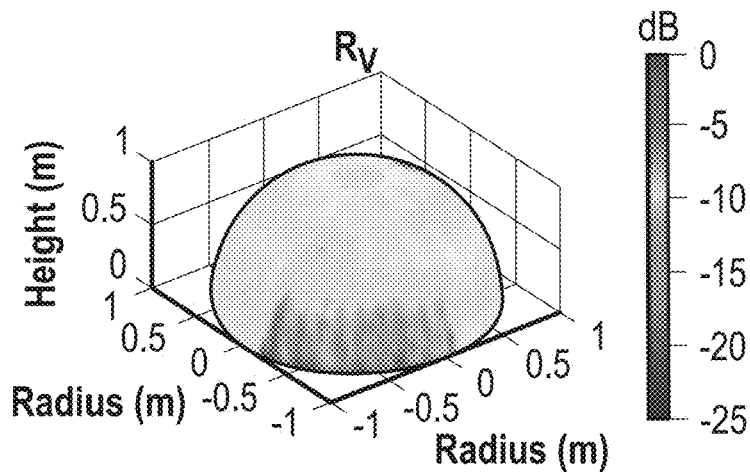
Figure 34C:
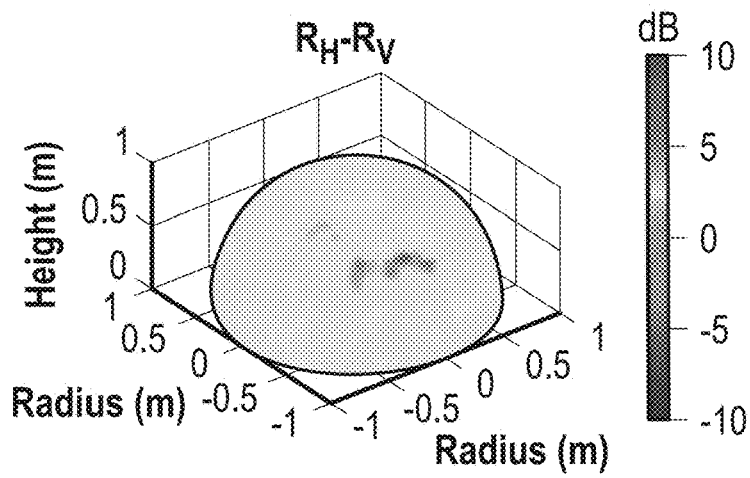
Figure 34D:
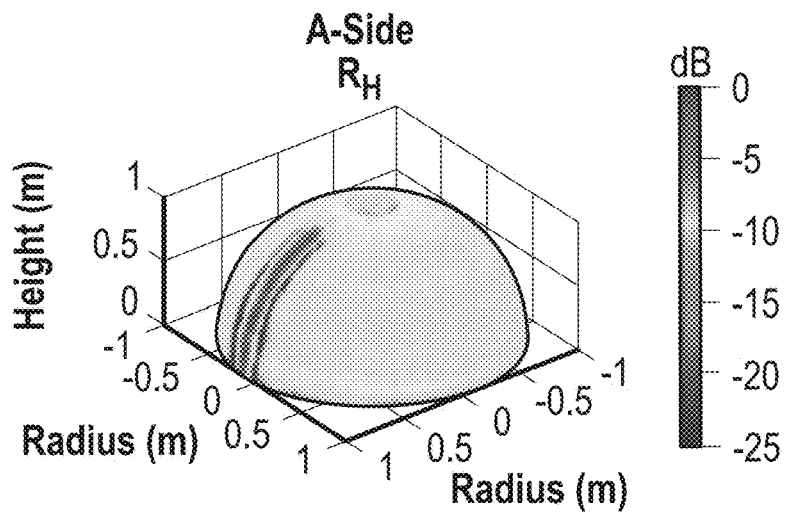
Figure 34E:
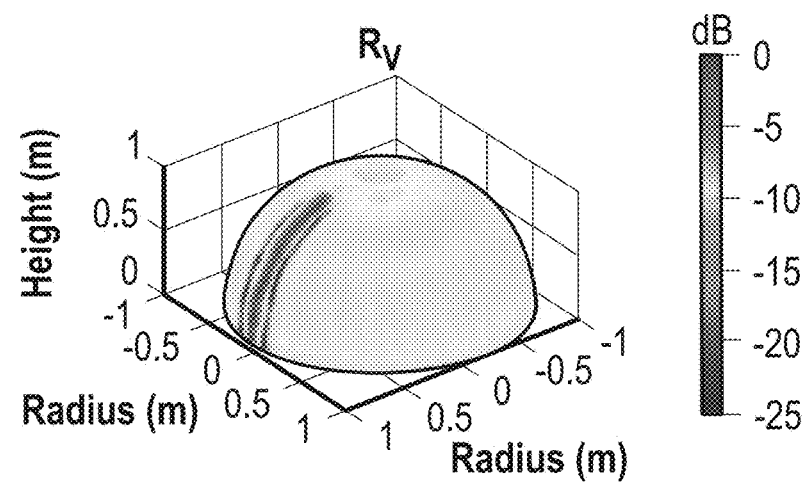
Figure 34F:
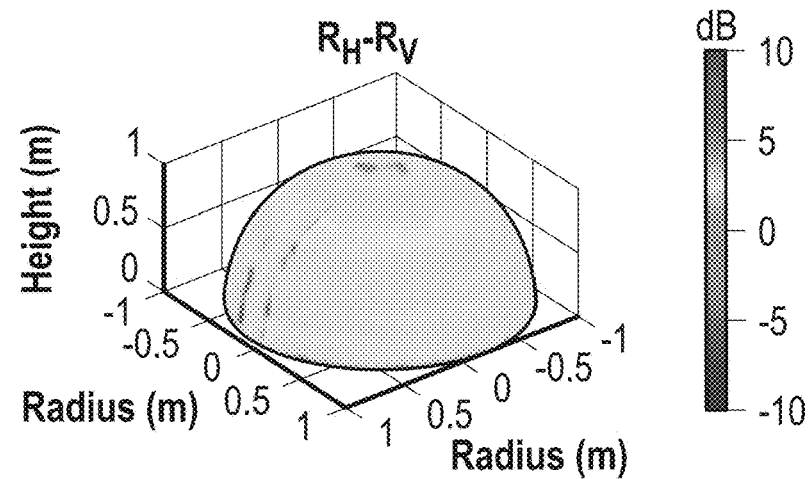
Figure 35A:
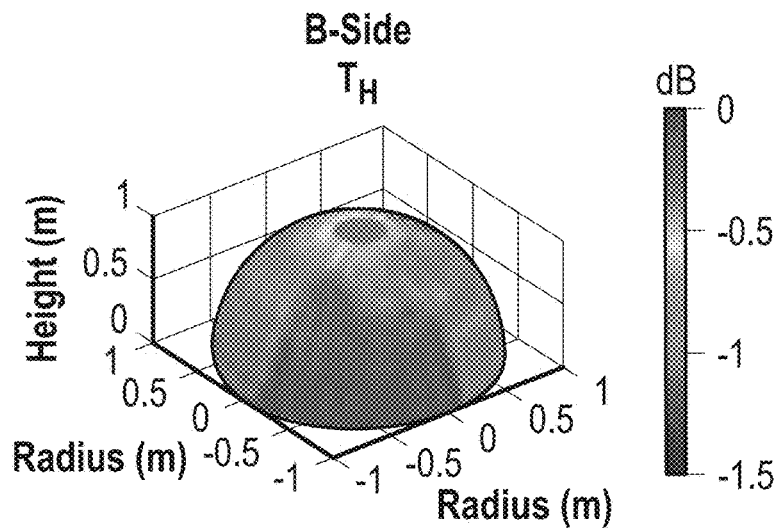
FIGS. 35A-35F show three-dimensional graphical plots depicting the transmission coefficient (T) measurement for the spherical portion of the radome under wet conditions during natural rain. Rows show H-polarization, V-polarization, and the difference between the two polarizations. In addition.
Figure 35B:
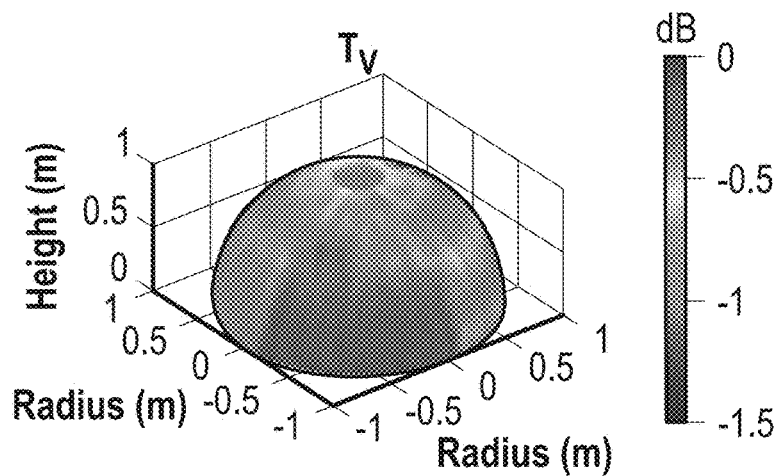
Figure 35C:
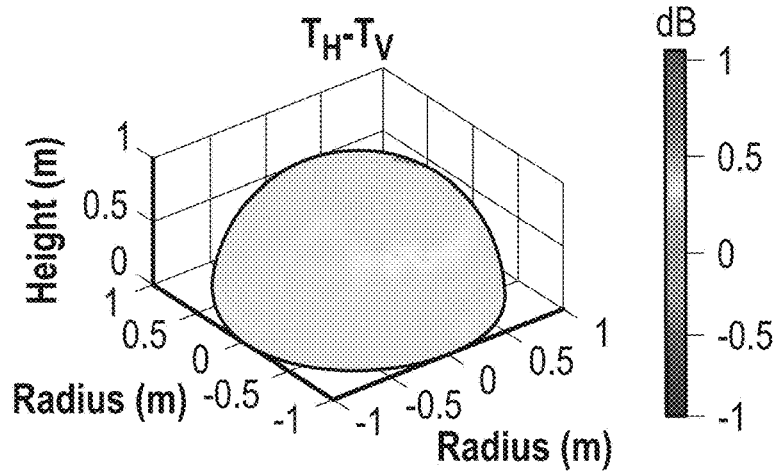
Figure 35D:
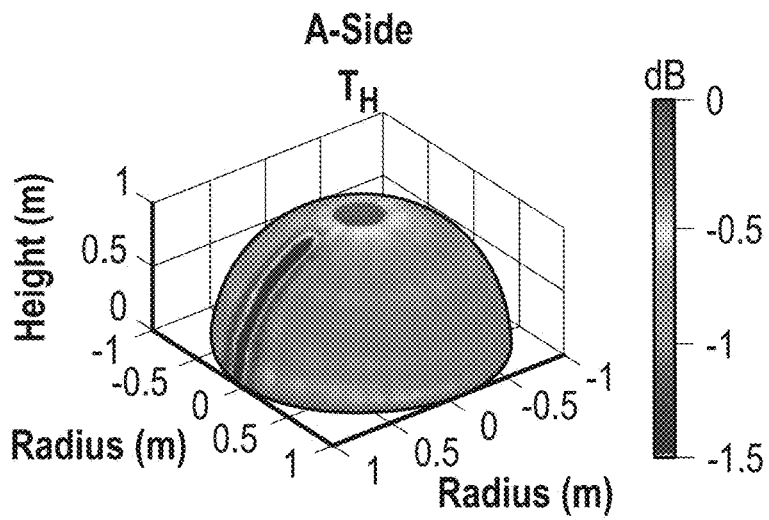
Figure 35E:
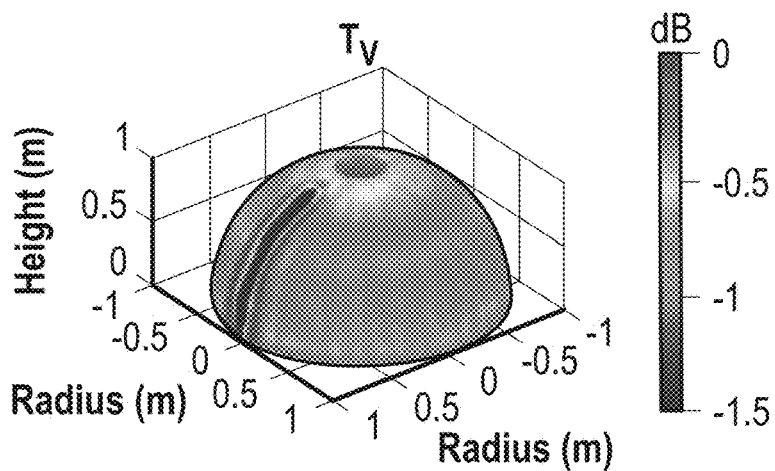
Figure 35F:
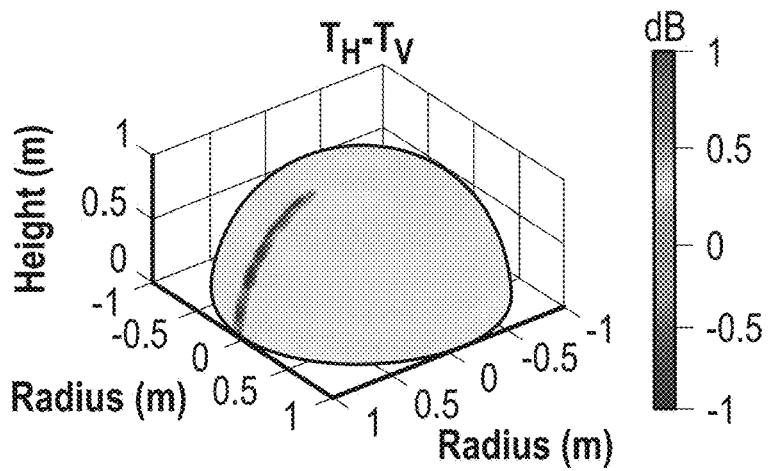

Under natural rain conditions, the rain was no longer a "controllable" variable as it was in the experiment where the sprinkler 180 was employed (i.e., artificial rain). The rain rate was not uniform across the time span when the measurements were executed. First, the full radome characterization was performed for one polarization, then the measurement for the other polarization was performed. During the time lapse, which lasted from the beginning of the test for the first polarization to the end of the second polarization experiment, different rain rates could have occurred. FIG. 33 shows the rain rate averaged every 10 minutes, the timing being due to each scan in azimuth lasting about 10 minutes. In this way, it is possible to know the rain rate at each scan. The minute 0 in FIG. 33 corresponds to the beginning of the experiment. Results of the natural rain test are presented in FIGS. 34A-34F and 35A-35F. Although the Rain-X was not reapplied for this experiment, its effects still lasted from the previous application, the effects being noticeable in FIGS. 34A and 34B. In this test and in contrast to results for the artificial rain, natural rain results were similar for both polarizations for the B2-side because the rain flow was more uniform, and the rain rate was lower than in the case of the artificial rain. The Rain-X effect is more highlighted in this scenario, as demonstrated in FIGS. 34A and 34B, but in contrast to the other side of the radome 150 shown in FIGS. 34D and 34E. Also, it is noteworthy that at the top of the hemispherical part of the radome ($\theta \sim =80°$), without any distinction among the different sectors, the level of reflection is higher. At such elevations, the component of gravity force is smaller than at lower elevations, causing the water to stay more agglomerated and in bigger drops. The differential reflection coefficient is shown in FIG. 34C for the B-side of the radome, while the A-side is presented in FIG. 34F. In the A-side, a pattern of parallel rings is noticeable and indicates a stronger difference between the two polarizations. Considering that the rain intensity could have changed during the experiment, the pattern of parallel rings seems to be consistent and constant in azimuth, therefore it should not be assumed that this is associated with rain rate changes. Similar considerations can be done for the transmittance shown in FIGS. 35A-35F.

E. Summary of Results

Figure 36A:
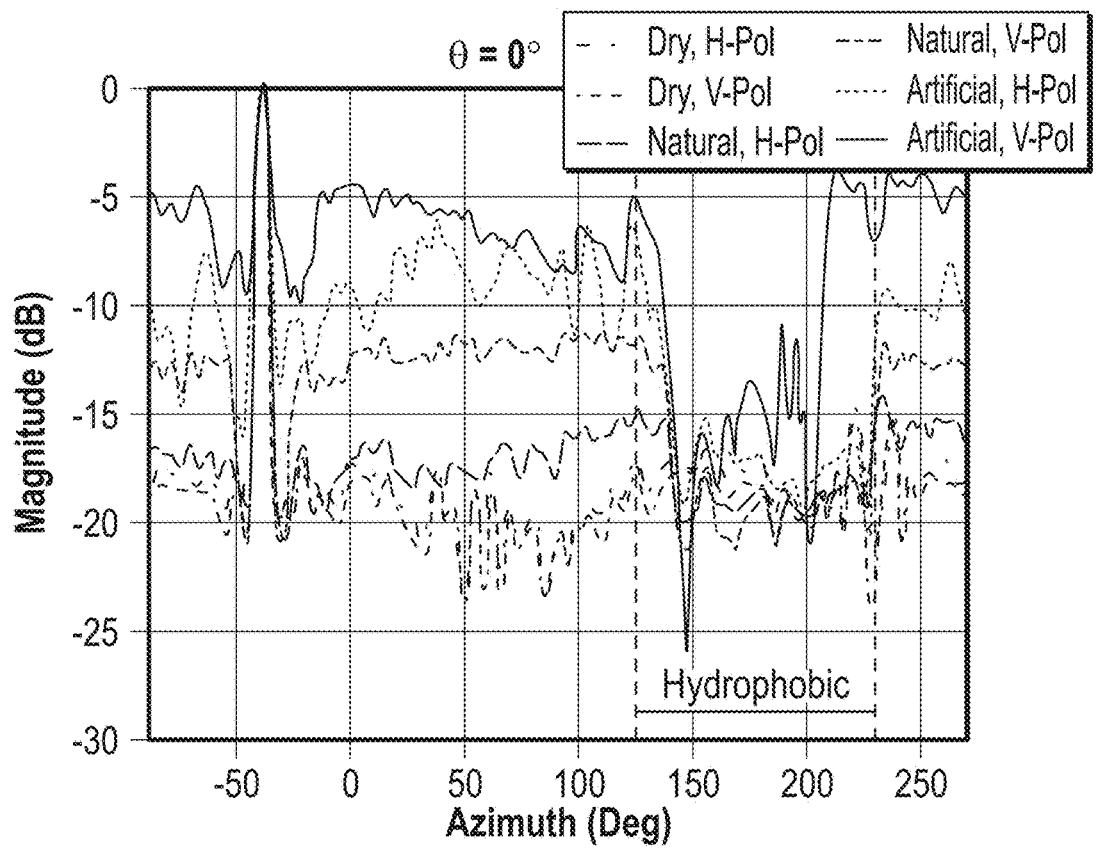
FIGS. 36A-36C show graphical plots of the reflection coefficient (R) of the radome for dry, natural rain, and artificial rain scenarios for both polarization at elevation cuts of 0° (FIG. 36A), 30° (FIG. 36B), and 60° (FIG. 36C).
Figure 36B:
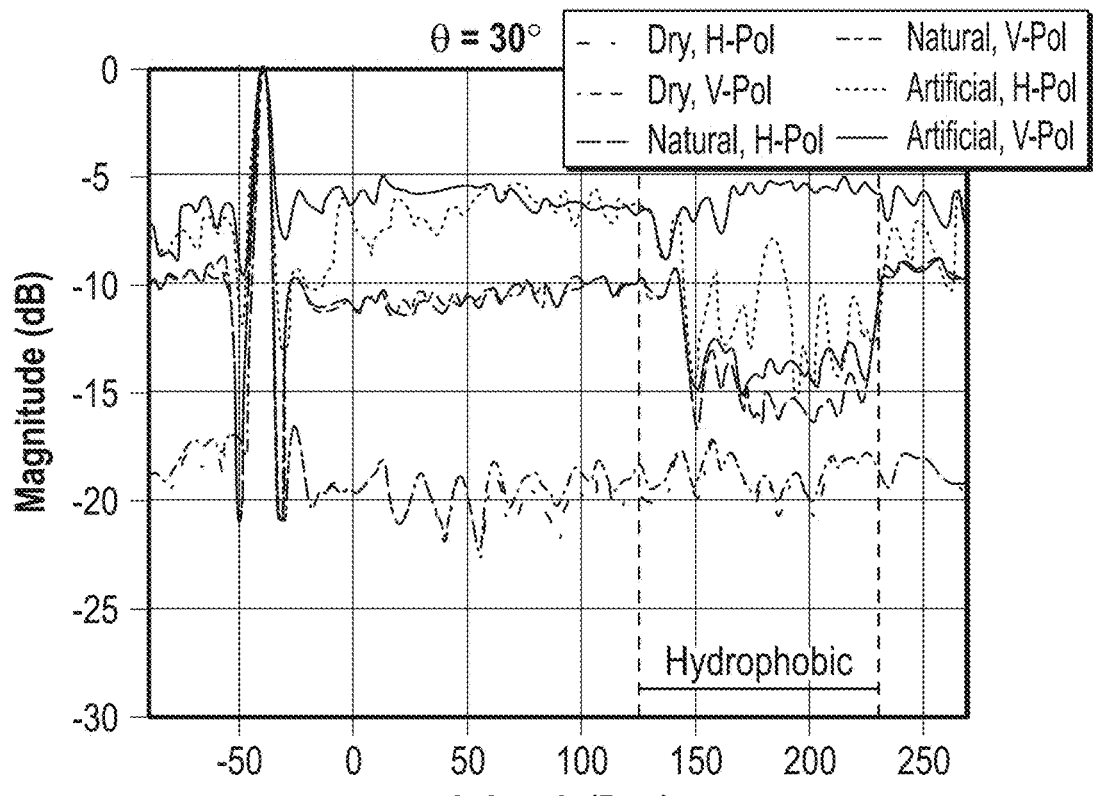
Figure 36C:
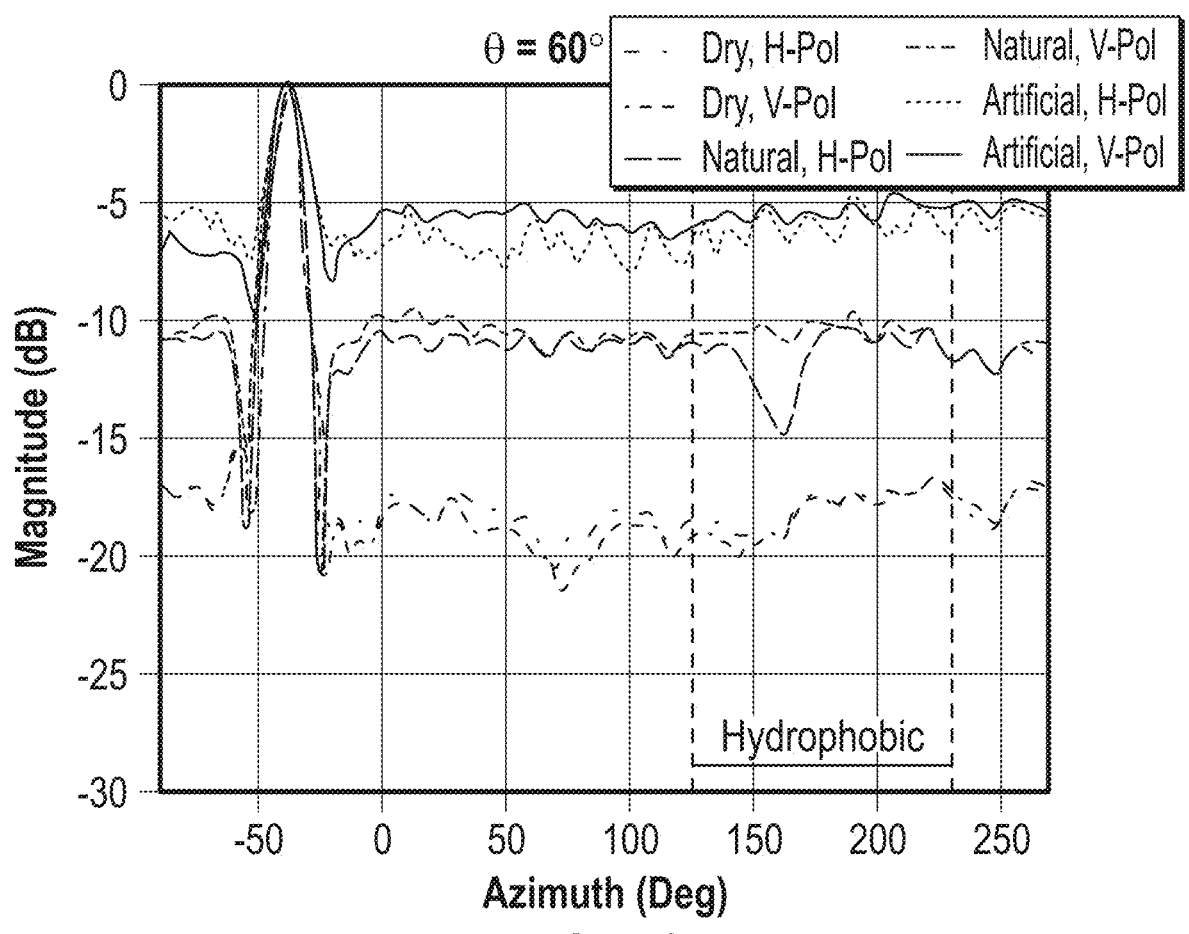

To summarize what was found in the various experiments performed, a comparison of the measurements obtained for the dry, natural rain, and artificial rain scenarios are presented. Results of the experiments have been overlapped for different elevation cuts (0°, 30°, and 60°) to better understand the effect of water in different forms over the radome 150. The rain rate of the artificial rain was higher than the natural rain. The comparison of rain rates for the artificial rain and the natural rain provides a timeseries of the radome conditions under different rain intensities. The artificial rain scenario represents the situation with heavy rain, while the natural rain measurement is about halfway between the artificial rain and dry scenarios since the rain was not particularly heavy the day in which the natural rain experiment was conducted. As shown in FIGS. 36A-36C, the curves of the measured reflection coefficient are overlapped for H- and V-polarizations for the dry, artificial rain, and natural rain scenarios. The peak present in all the curves is due to the metal strip. For the dry case, H- and V-polarizations show the same level of reflection at all elevations. However, the curve corresponding to the vertically polarized probe appears to be slightly lower. This is probably due to the radome composition and configuration as shown in FIG. 23. In FIG. 23, the hexagons distribution is different along x- and y-directions. When the probe 10 is horizontally polarized, the electric field is aligned parallel to the x-axis of FIG. 23, while when it is vertically polarized, the field is aligned in the y-axis. The different hexagon orientations produce distributions in the two directions which generate different reflection responses in the two cases. With respect to the rain scenarios, the plot at $\theta=0°$ (FIG. 36A) has the largest discrepancy between the two polarizations during rain. This is due to the rivulets formation that affects more V- than H-planes. In the hydrophobic sector, the reflection coefficient shows peaks of value lower than the dry case. This occurs because scattering from the droplets or rivulets are combined destructively which results in the probe perceiving a lower value of signal. At θ=30° (FIG. 36B), a remarkable difference between the two polarizations is discernible only in the region where Rain-X was applied. In all the rest of the radome, similar values between H and V is shown. At 60° (FIG. 36C) elevation, the hydrophobic substance seems not to be efficient anymore (for reasons already mentioned). In fact, there does not appear to be any transition of the curves in that range.

In some embodiments, a probe is described. The probe includes a probe antenna, a transmitter, a receiver and circuitry including hardware. The probe antenna is constructed of a dielectric material connected to a waveguide, the probe antenna has a far field region. The transmitter is coupled to the probe antenna. The receiver is coupled to the probe antenna. The hardware is configured to communicate with the transmitter to enable the transmitter to direct a pulse of electromagnetic energy to the probe antenna and to receive a reflection signal from the receiver, the hardware is configured to determine a material property of a material within the far-field region of the probe antenna by analyzing the reflection signal.

In one non-limiting embodiment, the present disclosure describes a method for characterizing a material having a first side and an opposed second side, comprising the steps of: transmitting an electromagnetic pulse of energy toward the material from a probe antenna facing the first side of the material such that the electromagnetic pulse interacts with the first side of the material and generates a reflection signal; receiving the reflection signal indicative of a reflection of the electromagnetic pulse from the first side of the material; and analyzing the reflection signal to determine at least one material property of the material.

In one non-limiting embodiment, a probe is described. The probe includes a probe antenna, a transmitter, a receiver, and circuitry. The probe antenna is constructed of a dielectric material connected to a waveguide, the probe antenna having a far field region. The transmitter is coupled to the probe antenna. The receiver is coupled to the probe antenna. The circuitry includes hardware configured to communicate with the transmitter to enable the transmitter to direct a pulse of electromagnetic energy to the probe antenna at first instants of time whereby the dielectric material of the probe antenna emits at least a portion of the pulse of electromagnetic energy in the far-field region of the probe antenna, and to communicate with the receiver to enable the receiver to receive a reflection signal from the probe antenna at second instants of time following the first instants of time using time domain gating in which the receiver is only enabled to receive the signal from the probe antenna during the second instants of time, the hardware configured to determine a material property of a material within the far-field region of the probe antenna by analyzing the reflection signal.

In some embodiments, an apparatus is described. The apparatus includes a radome, a probe, and a moving guide. The radome has an inner surface defining a space sized and adapted to receive a radar antenna. The probe is positioned within the space defined by the inner surface of the radome, the probe comprises a probe antenna, a transmitter, a receiver and circuitry. The probe antenna is constructed of a dielectric material connected to a waveguide, the probe antenna having a far field region. The transmitter is coupled to the probe antenna. The receiver is coupled to the probe antenna. The circuitry is configured to enable the transmitter to direct a pulse of electromagnetic energy to the probe antenna at first instants of time whereby the dielectric material of the probe antenna emits at least a portion of the pulse of electromagnetic energy in the far-field region of the probe antenna, and to enable the receiver to receive a reflection signal from the probe antenna at second instants of time following the first instants of time using time domain gating in which the receiver is only enabled to receive the signal from the probe antenna during the second instants of time, the circuitry configured to determine a material property of a radome within the far-field region of the probe antenna by analyzing the reflection signal. The moving guide is connected to the probe antenna and configured to guide the probe antenna through a path within the space defined by the radome such that the probe antenna is spaced a distance from the radome and the radome is within the far field region of the probe antenna as the moving guide guides the probe antenna through the path.

In one non-limiting embodiment, a method for characterizing a radome during operation of a radar system is described. In this method, a radar antenna encompassed by a radome having an interior surface is operated. During operation of the radar antenna, an electromagnetic pulse of energy is transmitted toward the radome from a probe antenna within the radome. A reflection signal indicative of a reflection of the electromagnetic pulse from the interior surface of the radome is received. The reflection signal is analyzed to determine at least one material property of the radome. And, the operation of the radar antenna is modified based upon the at least one material property of the radome determined from the reflection signal.

Features of any of the above embodiments may be combined with any of the other above embodiments to create a new embodiment.

It will be understood from the foregoing description that various modifications and changes may be made in the various embodiments of the present disclosure without departing from their true spirit. The description provided herein is intended for purposes of illustration only and is not intended to be construed in a limiting sense. Thus, while embodiments of the present disclosure have been described herein in connection with certain embodiments so that aspects thereof may be more fully understood and appreciated, it is not intended that the present disclosure be limited to these particular embodiments. On the contrary, it is intended that all alternatives, modifications and equivalents are included within the scope of the present disclosure as defined herein. Thus the examples described above, which include particular embodiments, will serve to illustrate the practice of the present disclosure, it being understood that the particulars shown are by way of example and for purposes of illustrative discussion of particular embodiments of the present disclosure only and are presented in the cause of providing what is believed to be a useful and readily understood description of procedures as well as of the principles and conceptual aspects thereof. Changes may be made in the formulation of the various components and compositions described herein, the methods described herein or in the steps or the sequence of steps of the methods described herein without departing from the spirit and scope of the embodiments of the present disclosure.

What is claimed is:

1. A probe, comprising:
 a first probe antenna constructed of a first dielectric material connected to a first waveguide, the probe antenna having a first far field region;

a second probe antenna constructed of a second dielectric material connected to a second waveguide, the second probe antenna having a second far field region;

a transmitter coupled to the first probe antenna;

a receiver coupled to the first probe antenna; and circuitry including hardware configured to communicate with the transmitter to enable the transmitter to direct a pulse of electromagnetic energy to the first probe antenna at first instants of time whereby the first dielectric material of the first probe antenna emits at least a portion of the pulse of electromagnetic energy in the first far-field region of the first probe antenna, and to communicate with the receiver to enable the receiver to receive a reflection signal from the first probe antenna at second instants of time following the first instants of time using time domain gating in which the receiver is only enabled to receive the signal from the first probe antenna during the second instants of time, the hardware configured to determine a material property of a material within the first far-field region of the first probe antenna by analyzing the reflection signal, and wherein the first probe antenna and the second probe antenna are oriented such that said electromagnetic energy is transmitted in substantially orthogonal directions in the first and second far-field regions.

2. The probe of claim 1, wherein the material is a radome, and the material property is transmittance of a radar signal through the radome.

3. The probe of claim 1, wherein the transmitter, the receiver and the hardware are components of a reflectometer.

4. An apparatus, comprising:

a radome having an inner surface defining a space sized and adapted to receive a radar antenna;

a probe positioned within the space defined by the inner surface of the radome, the probe comprising:

a first probe antenna constructed of a first dielectric material connected to a first waveguide, the probe antenna having a first far field region;

a second probe antenna constructed of a second dielectric material connected to a second waveguide, the second probe antenna having a second far field region;

a transmitter coupled to the first probe antenna;

a receiver coupled to the first probe antenna; and circuitry including hardware configured to communicate with the transmitter to enable the transmitter to direct a pulse of electromagnetic energy to the first probe antenna at first instants of time whereby the first dielectric material of the first probe antenna emits at least a portion of the pulse of electromagnetic energy in the first far-field region of the first probe antenna, and to communicate with the receiver to enable the receiver to receive a reflection signal from the first probe antenna at second instants of time following the first instants of time using time domain gating in which the receiver is only enabled to receive the signal from the first probe antenna during the second instants of time, the hardware configured to determine a material property of a material within the first far-field region of the first probe antenna by analyzing the reflection signal, and wherein the first probe antenna and the second probe antenna are oriented such that said electromagnetic energy is transmitted in substantially orthogonal directions in the first and second far-field regions; and a moving guide connected to the first probe antenna and configured to guide the first probe antenna through a path within the space defined by the radome such that the first probe antenna is spaced a distance from the radome and the radome is within the first far field region of the first probe antenna as the moving guide guides the first probe antenna through the path.

5. The apparatus of claim 4, wherein the moving guide further comprises a pedestal and a radar antenna movably supported by the pedestal, the radar antenna of the moving guide being connected to the first probe antenna.

6. The apparatus of claim 5, wherein the radar antenna further comprises an antenna feed, and wherein the antenna feed is connected to and supports the first probe antenna.

7. The apparatus of claim 6, wherein the antenna feed includes an electromagnetic shadow region, and wherein the first probe antenna is within the electromagnetic shadow region of the antenna feed.

8. The apparatus of claim 4, wherein the material property is transmittance of a radar signal through the radome.

9. The apparatus of claim 4, wherein the transmitter, the receiver and the circuitry are components of a reflectometer.

10. A method for characterizing a radome during operation of a radar system, comprising the steps of:

operating a radar antenna encompassed by a radome having an interior surface;

during operation of the radar antenna, transmitting an electromagnetic pulse of energy toward the radome from a probe antenna within the radome;

receiving a reflection signal indicative of a reflection of the electromagnetic pulse from the interior surface of the radome;

analyzing the reflection signal to determine at least one material property of the radome; and modifying the operation of the radar antenna based upon the at least one material property of the radome determined from the reflection signal, wherein the probe antenna is constructed of a dielectric material connected to a waveguide, the probe antenna having a far-field region, and wherein the step of transmitting the electromagnetic pulse of energy is defined further as transmitting the electromagnetic pulse of energy by enabling a transmitter coupled to the probe antenna to direct a pulse of electromagnetic energy to the probe antenna at first instants of time whereby the dielectric material of the probe antenna emits at least a portion of the pulse of electromagnetic energy in the far-field region of the probe antenna, and wherein the method further comprises the step of the transmitter communicating with the receiver to enable the receiver to receive the reflection signal from the probe antenna at second instants of time following the first instants of time using time domain gating in which the receiver is only enabled to receive the signal from the probe antenna during the second instants of time.

11. The method of claim 10, wherein the probe antenna comprises a first probe antenna having a first far field region, and a second probe antenna having a second far field region, wherein the first probe antenna and the second probe antenna are oriented such that electromagnetic energy is transmitted in substantially orthogonal directions in the first and second far field regions.

12. The method of claim 10, wherein the material property is transmittance of a radar signal through the radome.

13. The method of claim 10, wherein transmitting the electromagnetic pulse of energy is performed by a transmitter, and receiving the reflection signal is performed by a receiver, and wherein the transmitter and the receiver are components of a reflectometer.

14. A method for characterizing a radome during operation of a radar system, comprising the steps of:

operating a radar antenna encompassed by a radome having an interior surface;

during operation of the radar antenna,
- transmitting an electromagnetic pulse of energy toward the radome from a probe antenna within the radome;
- receiving a reflection signal indicative of a reflection of the electromagnetic pulse from the interior surface of the radome;
- analyzing the reflection signal to determine at least one material property of the radome; and
- modifying the operation of the radar antenna based upon the at least one material property of the radome determined from the reflection signal, wherein the probe antenna is a first probe antenna having a first far field region, and further comprising a second probe antenna having a second far field region, the first probe antenna and the second probe antenna being oriented such that electromagnetic energy is transmitted in substantially orthogonal directions in the first and second far field regions.

15. The method of claim 14, wherein the material property is transmittance of a radar signal through the radome.

16. The method of claim 14, wherein transmitting the electromagnetic pulse of energy is performed by a transmitter, and receiving the reflection signal is performed by a receiver, and wherein the transmitter and the receiver are components of a reflectometer.

* * * * *

UNITED STATES PATENT AND TRADEMARK OFFICE
CERTIFICATE OF CORRECTION

PATENT NO. : 11,796,580 B2
APPLICATION NO. : 16/606973
DATED : October 24, 2023
INVENTOR(S) : Jorge Luis Salazar Cerreno, Alessio Mancini and Boon Leng Cheong Page 1 of 1

It is certified that error appears in the above-identified patent and that said Letters Patent is hereby corrected as shown below:

In the Specification

Column 22, Line 23: Delete "2-32" and replace with -- 2-3 λ --

Column 24, Line 25: Delete "(θ ¤ = 800)" and replace with -- (θ ¤ = 80°) --

Column 24, Line 30: Delete "FIGS. 101" and replace with -- FIGS. 10I --

Column 29, Line 66: Delete "(8)" and replace with -- (θ) --

Signed and Sealed this
Twenty-sixth Day of December, 2023

Katherine Kelly Vidal
*Director of the United States Patent and Trademark Office*